(12) United States Patent
Chu et al.

(10) Patent No.: US 11,289,426 B2
(45) Date of Patent: Mar. 29, 2022

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Yung-Chi Chu, Kaohsiung (TW); Hung-Jui Kuo, Hsinchu (TW); Jhih-Yu Wang, New Taipei (TW); Yu-Hsiang Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 311 days.

(21) Appl. No.: 16/009,208

(22) Filed: Jun. 15, 2018

(65) Prior Publication Data
US 2019/0385951 A1  Dec. 19, 2019

(51) Int. Cl.
*H01L 23/538* (2006.01)
*H01L 23/58* (2006.01)
*H01L 23/00* (2006.01)
*H01L 21/683* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01); *H01L 21/4864* (2013.01); *H01L 21/565* (2013.01); *H01L 21/568* (2013.01); *H01L 21/6835* (2013.01); *H01L 23/3121* (2013.01); *H01L 23/5383* (2013.01); *H01L 23/5386* (2013.01); *H01L 23/562* (2013.01); *H01L 23/564* (2013.01); *H01L 23/585* (2013.01); *H01L 24/19* (2013.01); *H01L 24/20* (2013.01);
(Continued)

(58) Field of Classification Search
CPC ............. H01L 21/4853; H01L 21/4857; H01L 21/4864; H01L 21/565; H01L 21/568; H01L 21/6835; H01L 23/3121; H01L 23/5383; H01L 23/5386; H01L 23/5389; H01L 23/562; H01L 23/564; H01L 23/585; H01L 24/19; H01L 24/20
See application file for complete search history.

(56) References Cited

U.S. PATENT DOCUMENTS 8,456,018 B2 *  6/2013  Park .................. H01L 24/20
                                          257/774
9,000,584 B2    4/2015  Lin et al.
(Continued)

Primary Examiner — Alexander G Ghyka
(74) Attorney, Agent, or Firm — JCIPRNET

(57) ABSTRACT

A package includes a die and a redistribution structure. The die has an active surface and is wrapped around by an encapsulant. The redistribution structure disposed on the active surface of the die and located above the encapsulant, wherein the redistribution structure comprises a conductive via connected with the die, a routing pattern located above and connected with the conductive via, and a seal ring structure, the seal ring structure includes a first seal ring element and a second seal ring element located above and connected with the first seal ring element, wherein the second seal ring element includes a seed layer sandwiched between the first seal ring element and the second seal ring element, and a top surface of the first seal ring element is substantially coplanar with a top surface of the conductive via.

6 Claims, 34 Drawing Sheets

(51) Int. Cl.
    *H01L 21/56*    (2006.01)
    *H01L 23/31*    (2006.01)
(52) U.S. Cl.
    CPC ............... *H01L 2221/68372* (2013.01); *H01L 2224/214* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,283,461 B1 * | 5/2019 | Wang ................... H01L 21/4857 |
| 2010/0213608 A1 * | 8/2010 | Lau ......................... H01L 24/05 257/737 |
| 2016/0035663 A1 * | 2/2016 | Huang ................ H01L 23/3135 257/668 |
| 2018/0366410 A1 * | 12/2018 | Chen ..................... H01L 21/565 |
| 2019/0035728 A1 * | 1/2019 | Venegoni ................ H01L 24/05 |
| 2019/0148302 A1 | 5/2019 | Tseng et al. |
| 2019/0385951 A1 * | 12/2019 | Chu ..................... H01L 23/5383 |
| 2020/0343179 A1 * | 10/2020 | Kuo ..................... H01L 23/3128 |
| 2021/0111114 A1 * | 4/2021 | Lee ..................... H01L 23/5385 |

\* cited by examiner

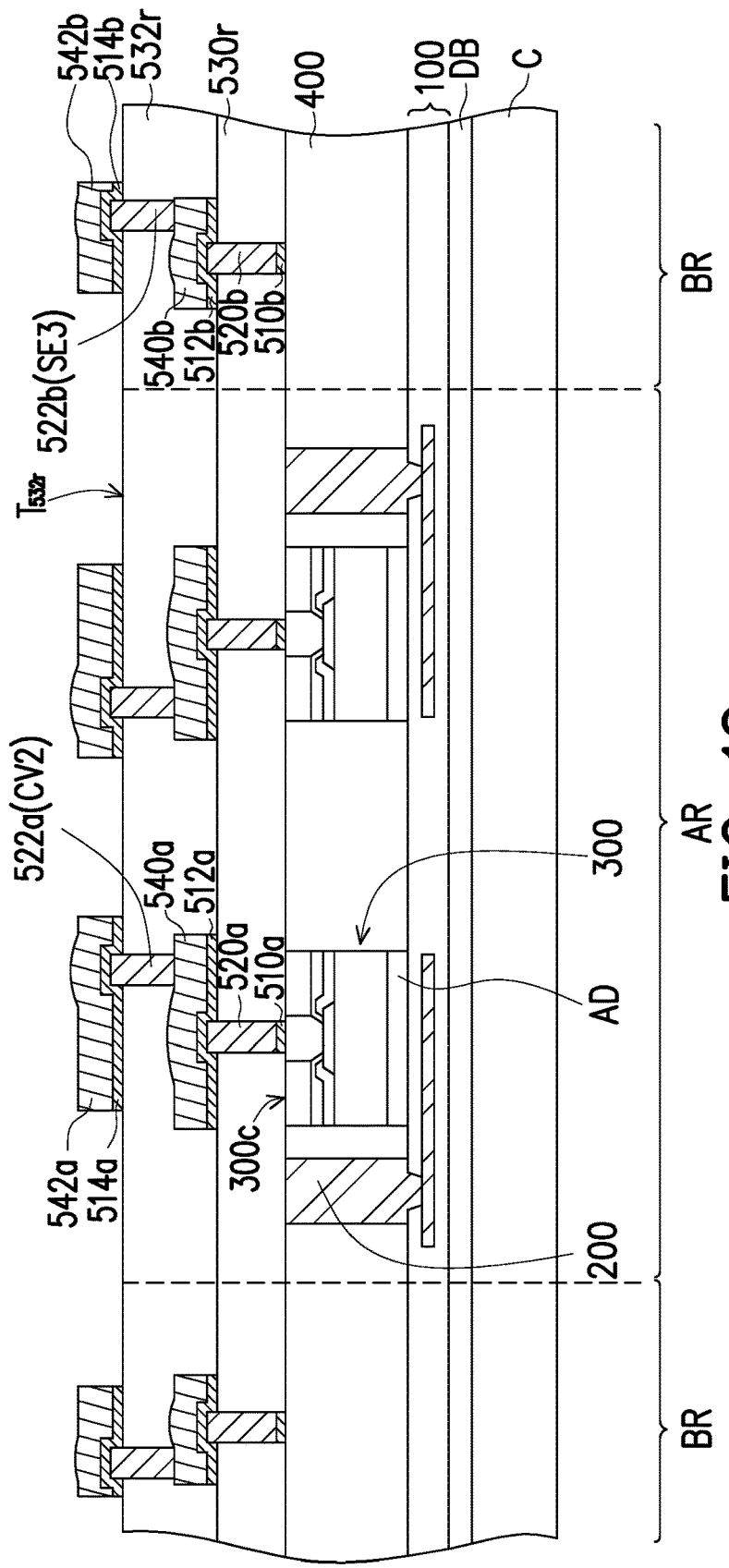
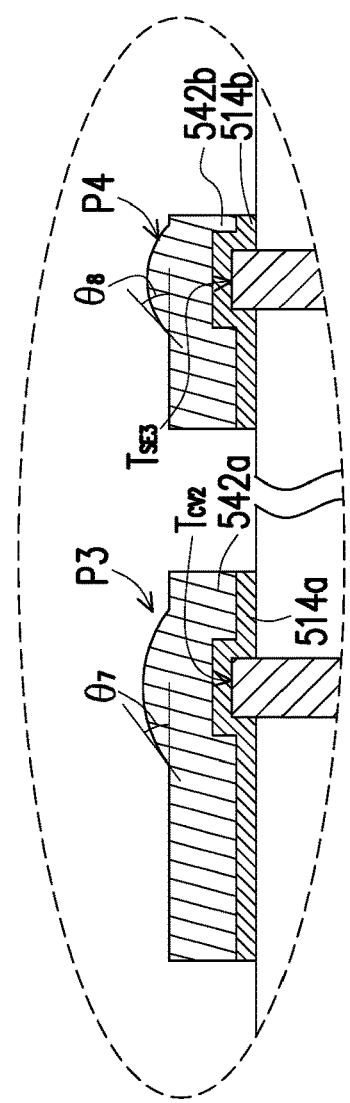
FIG. 1S

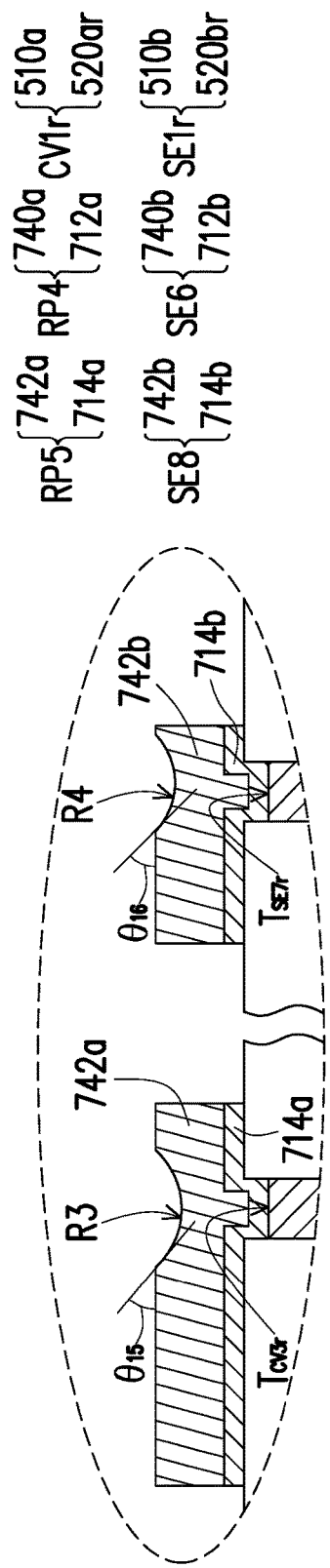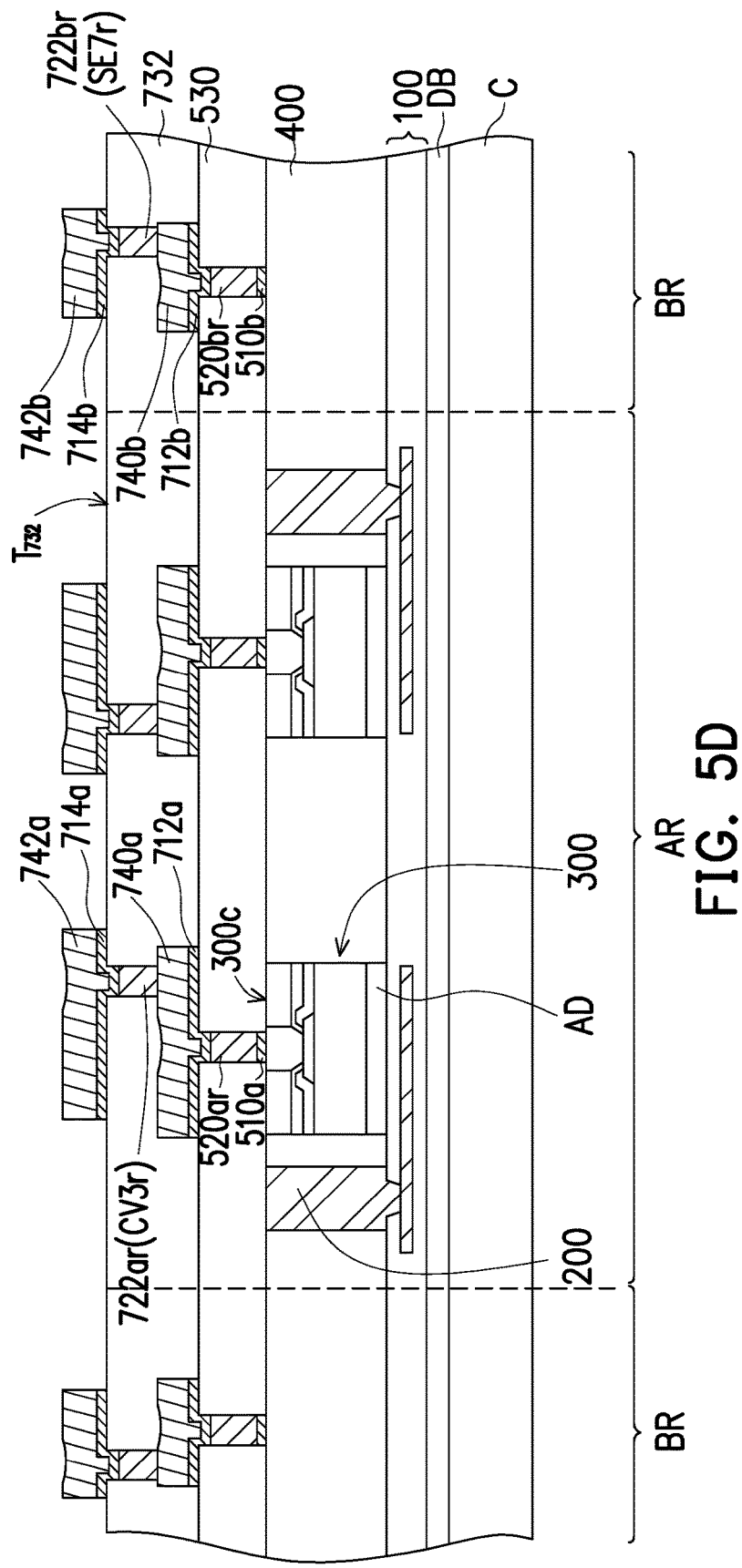
FIG. 5D

SEMICONDUCTOR PACKAGE AND MANUFACTURING METHOD THEREOF

BACKGROUND

The semiconductor industry experiences rapid growth due to continuous improvements in the integration density of various electronic components (e.g., transistors, diodes, resistors, capacitors, etc.). This improvement in integration density comes from repeated reductions in minimum feature size, which allows more of the smaller components to be integrated into a given area. For these smaller electronic components, compact and smaller packages are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A to FIG. 5F are schematic cross-sectional views illustrating various process steps for a manufacturing process of an InFO package in accordance with some alternative embodiments of the disclosure.

DETAILED DESCRIPTION

Figure 1A:
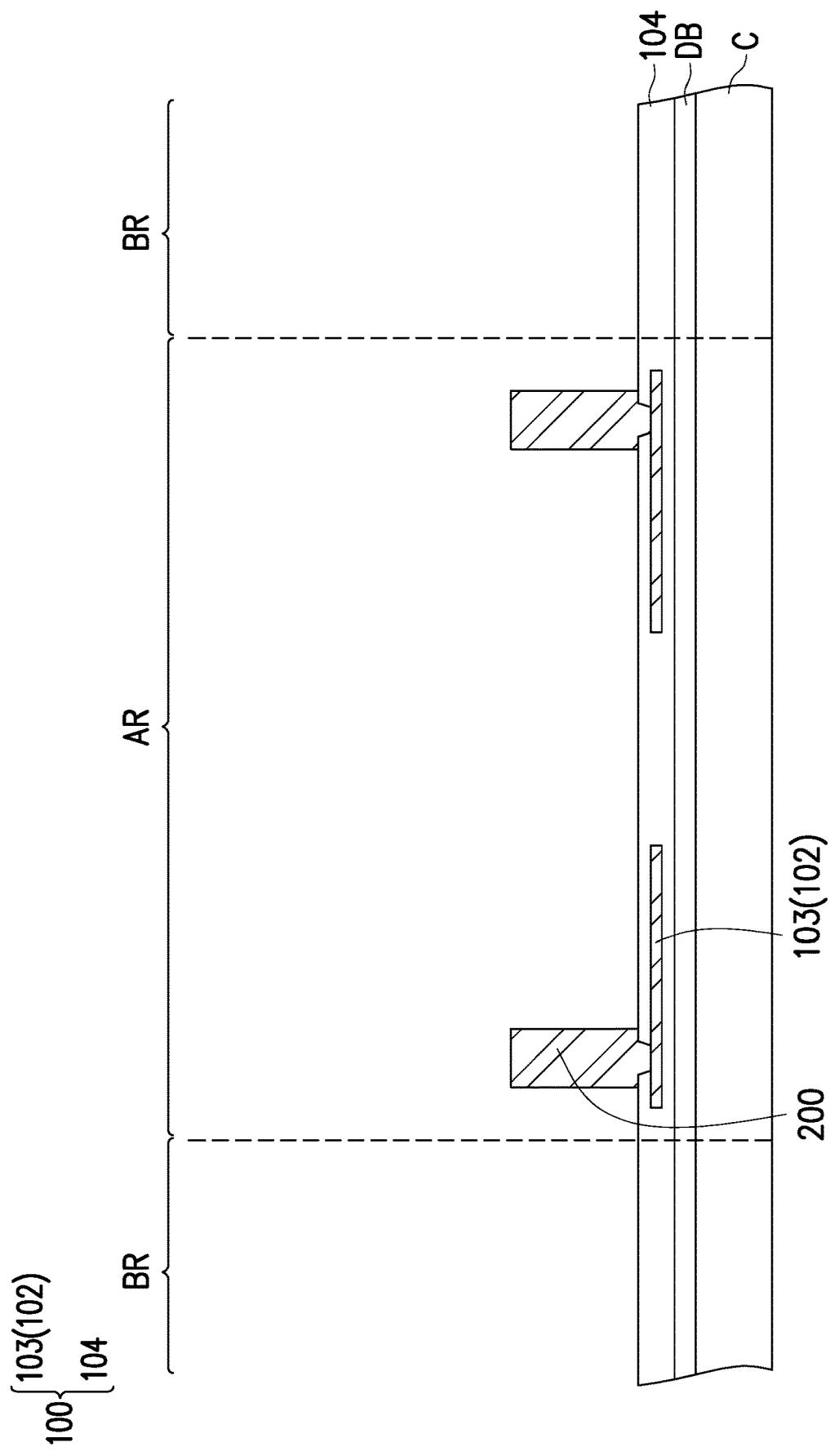
FIG. 1A to FIG. 1Y are schematic cross-sectional views illustrating various process steps for a manufacturing process of an integrated fan-out (InFO) package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
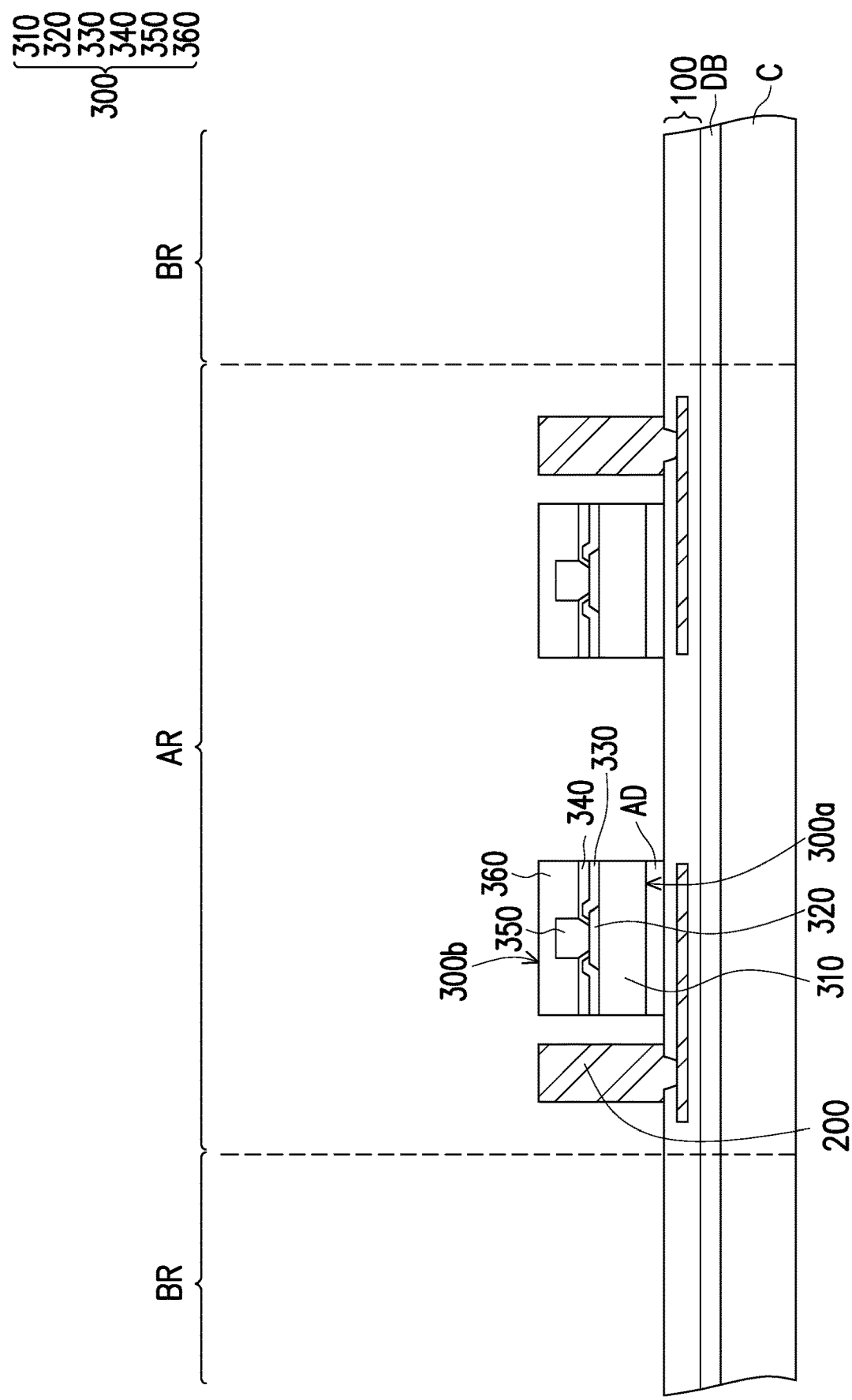
Figure 1C:
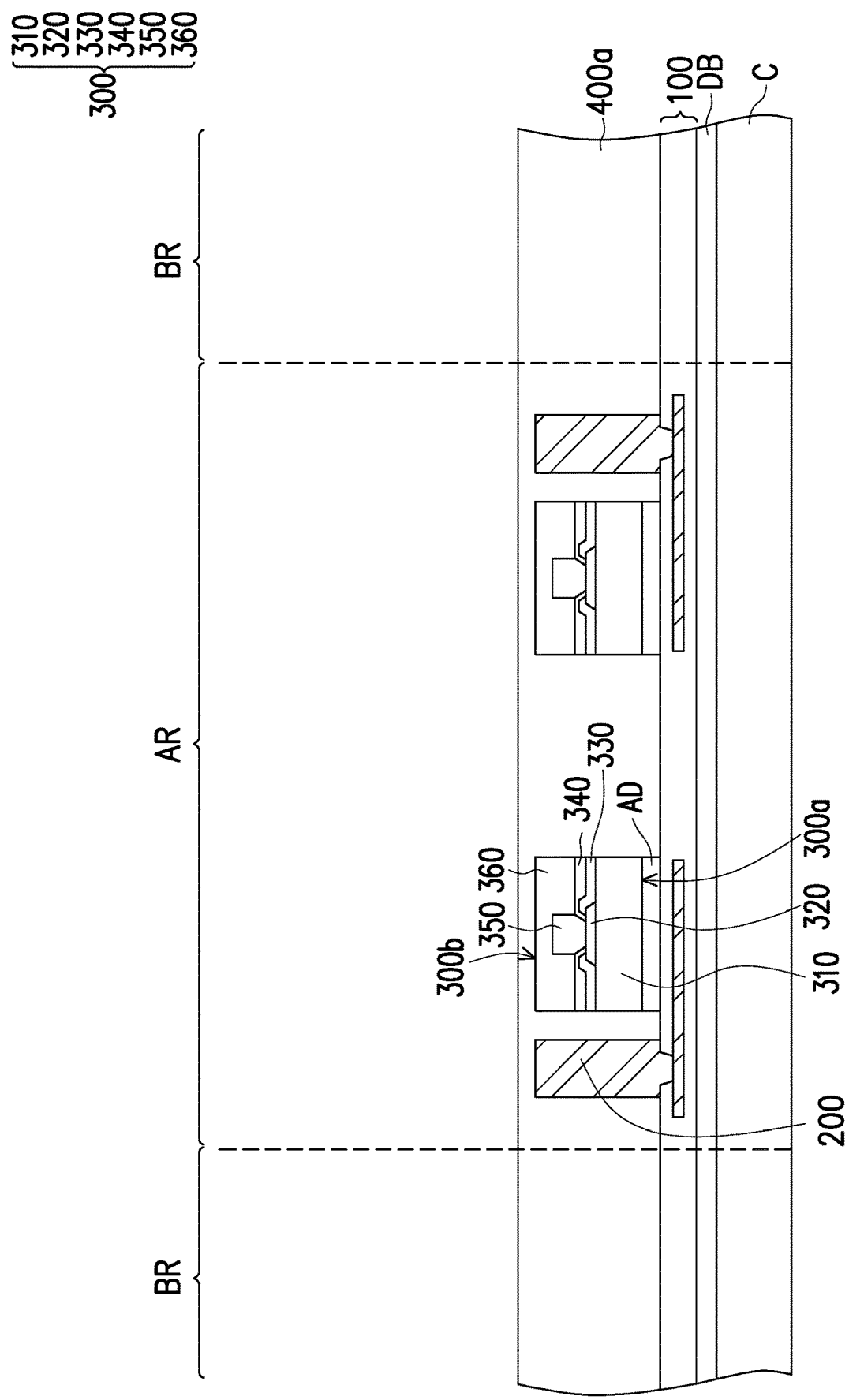
Figure 1D:
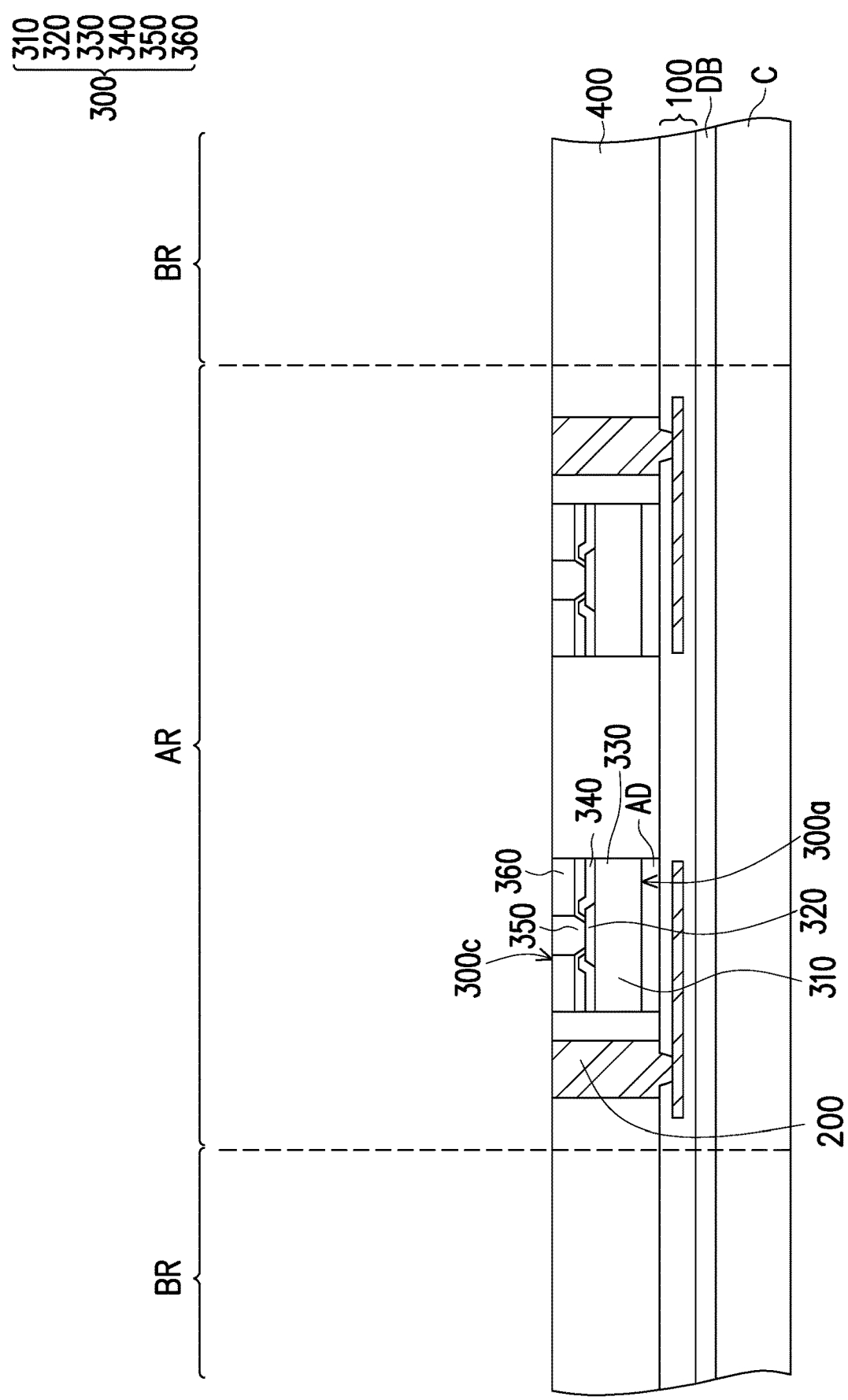
Figure 1E:
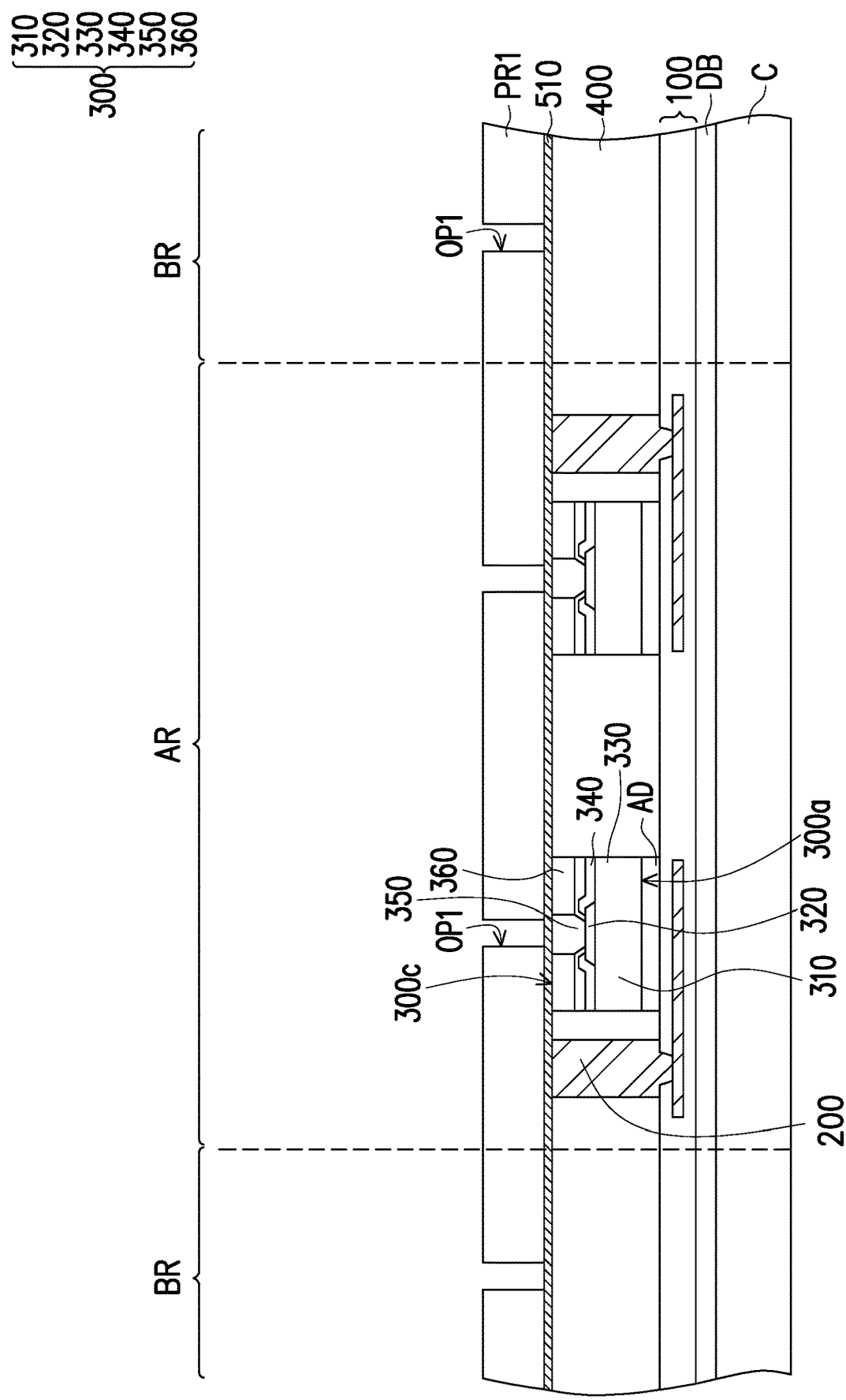
Figure 1F:
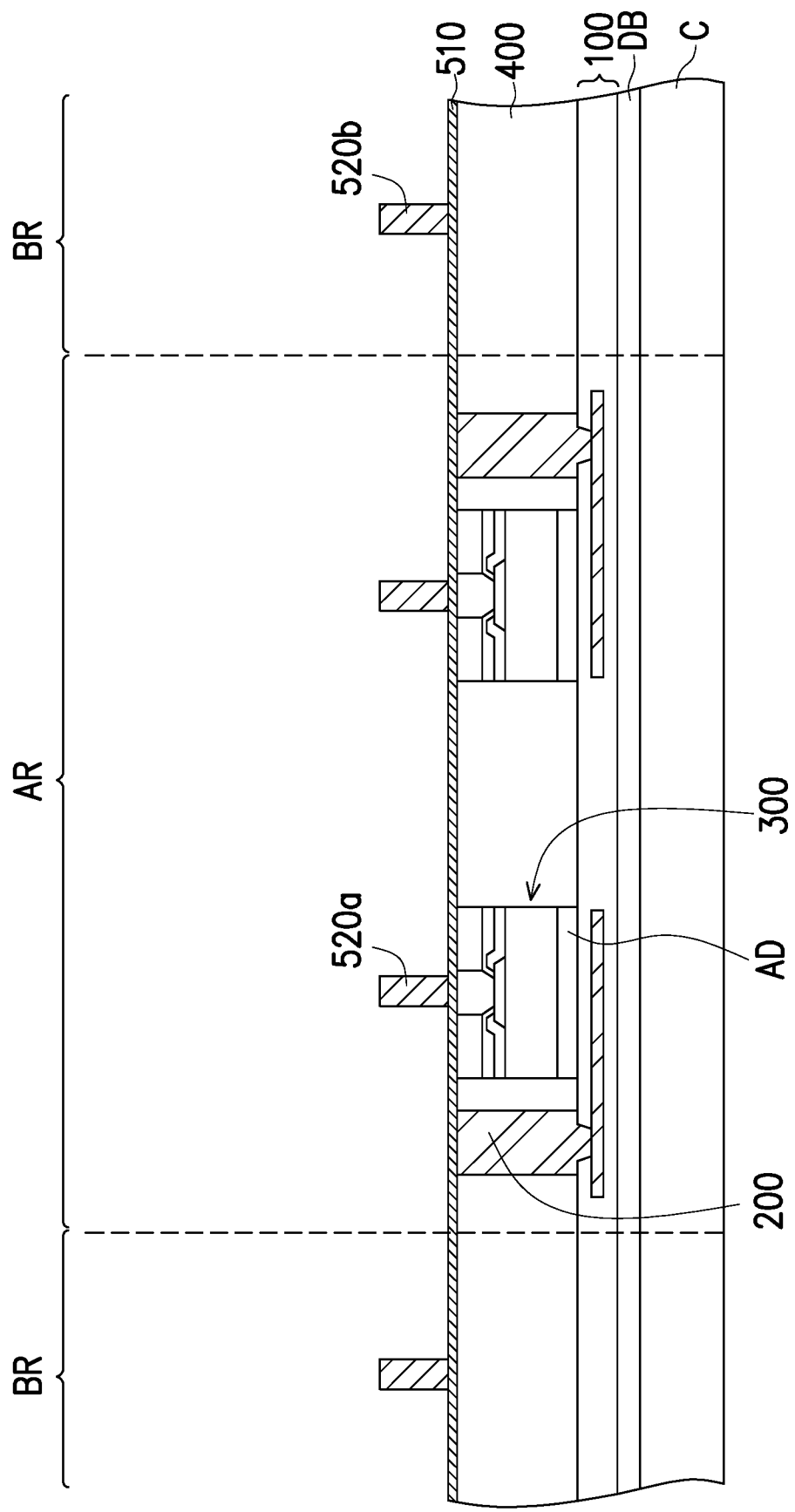
Figure 1G:
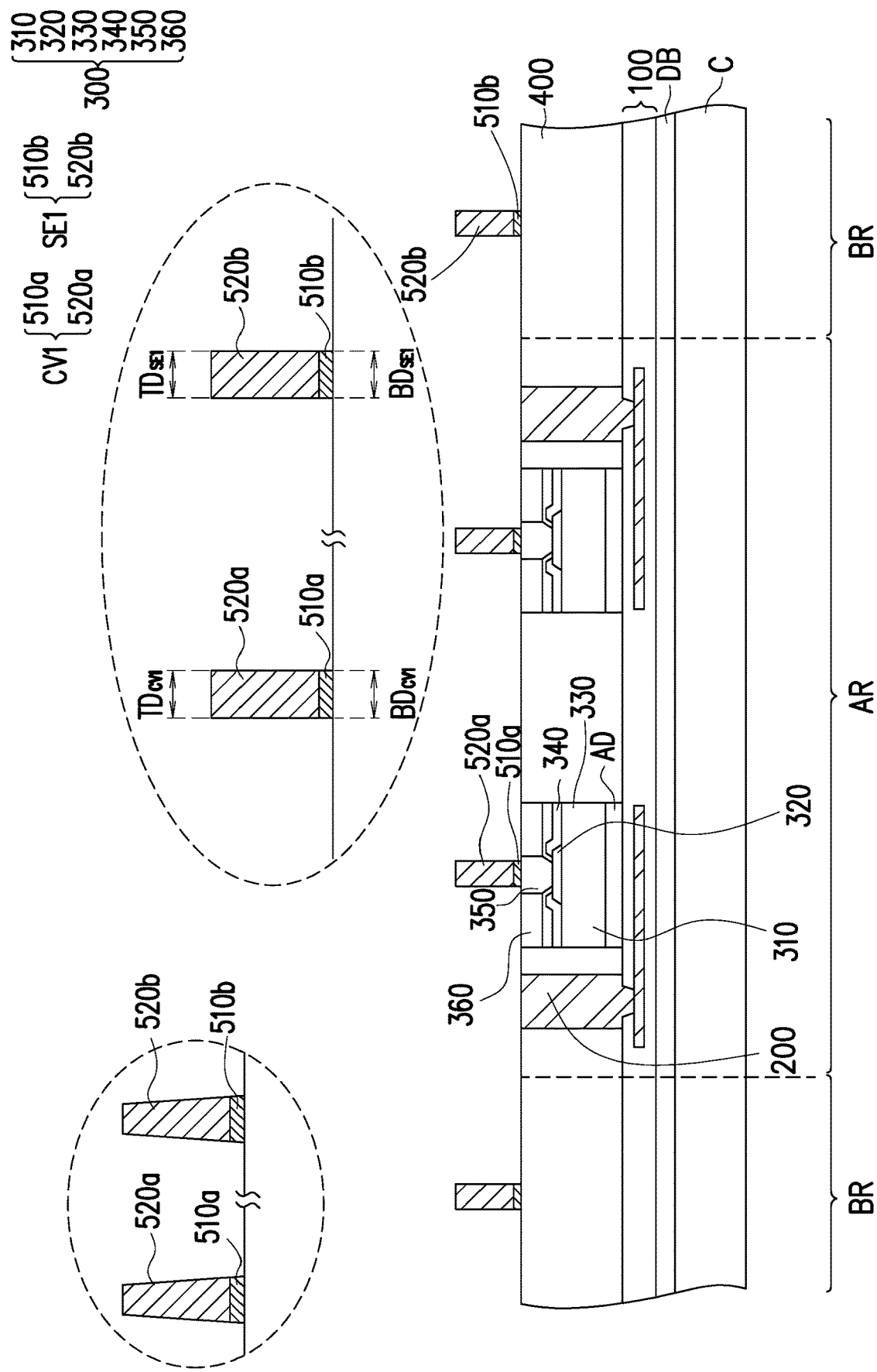
Figure 1H:
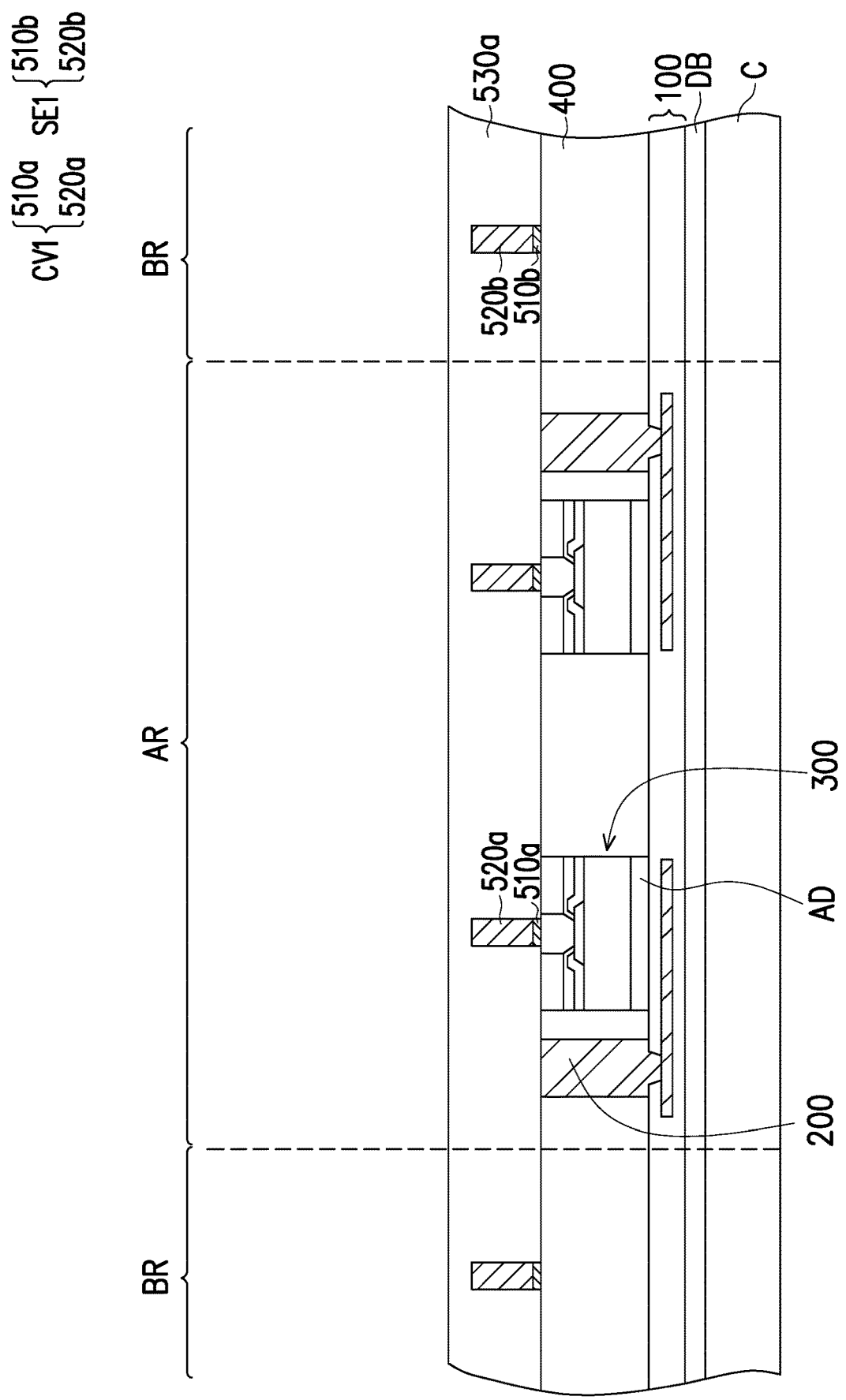
Figure 1I:
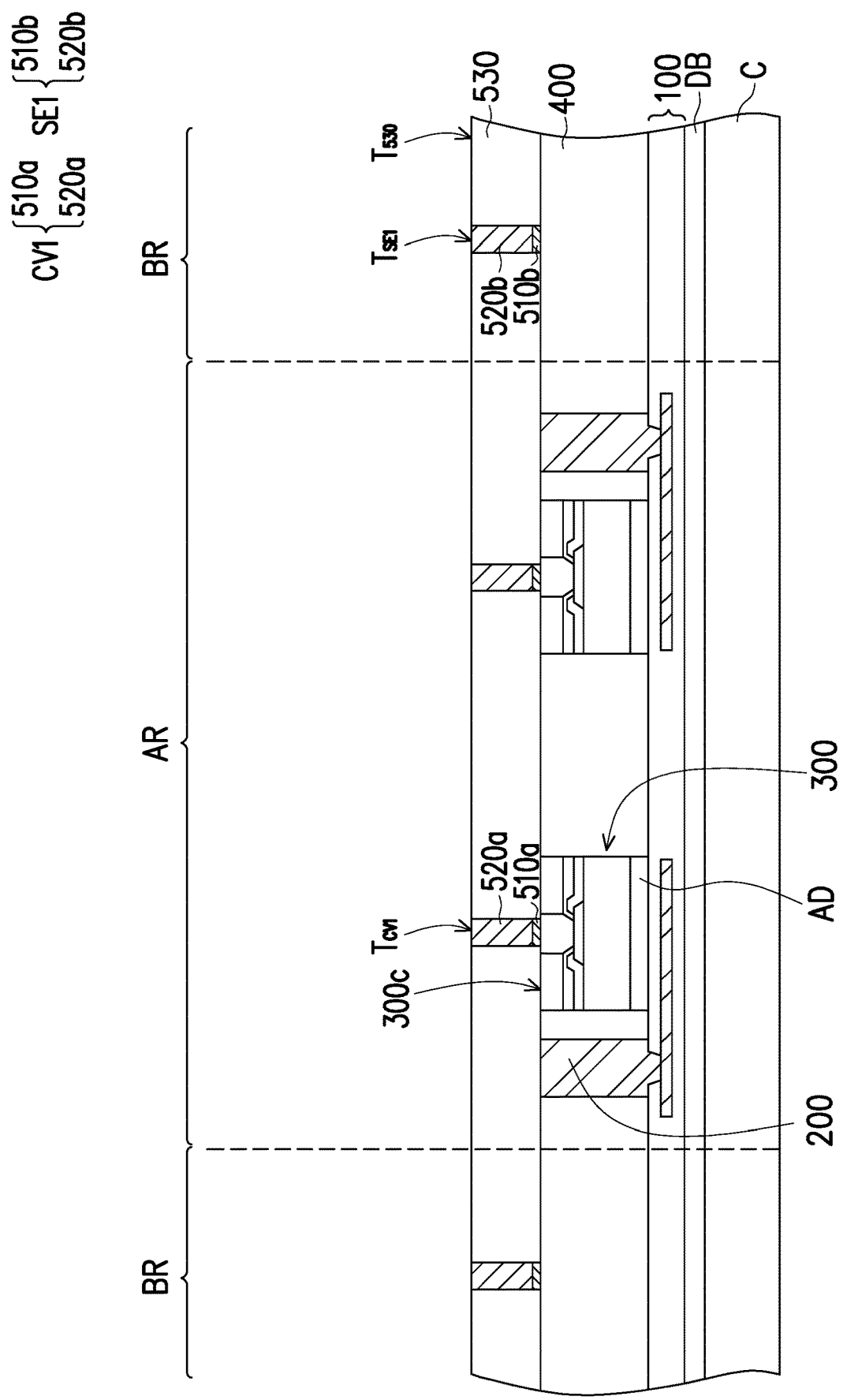
Figure 1J:
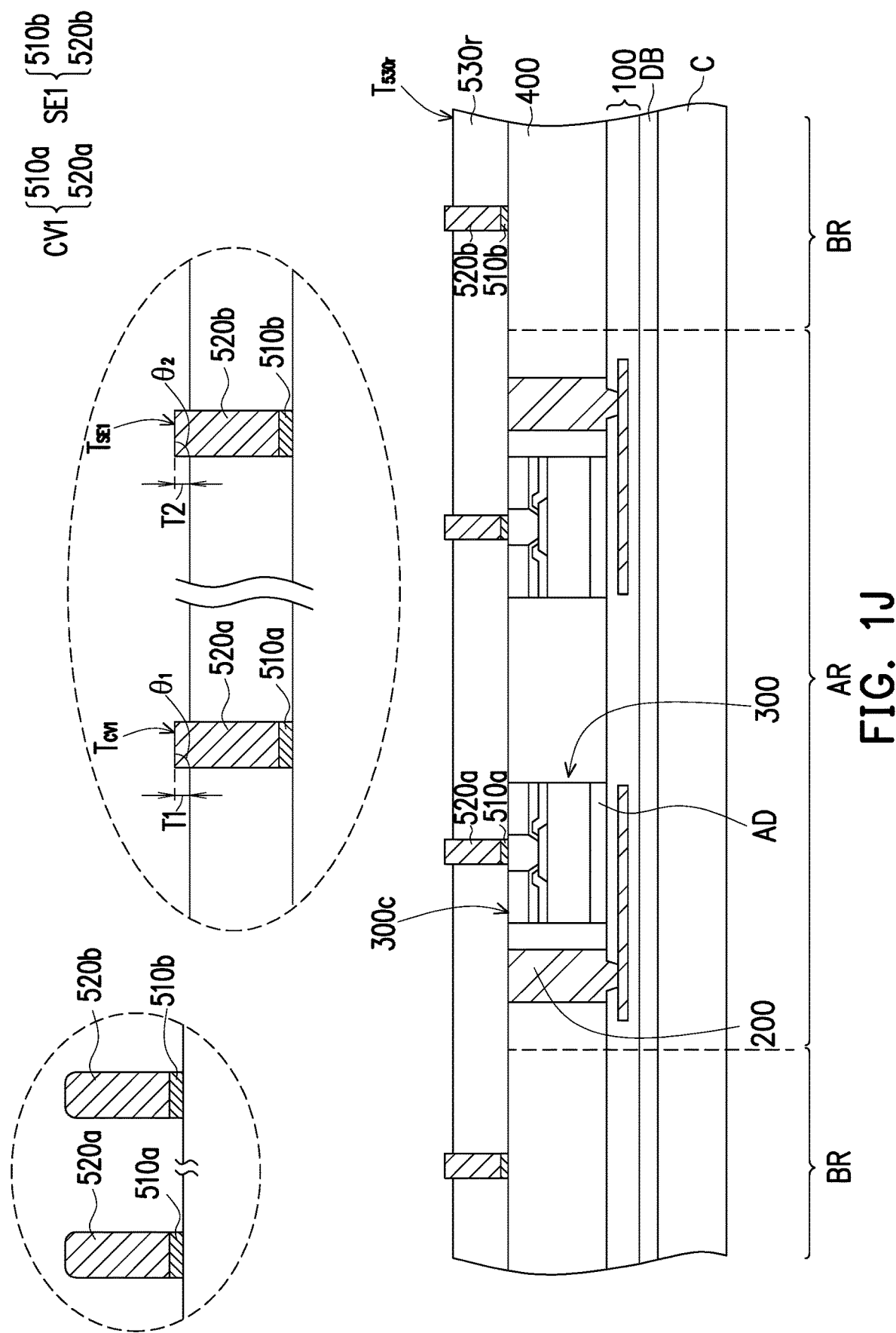
Figure 1K:
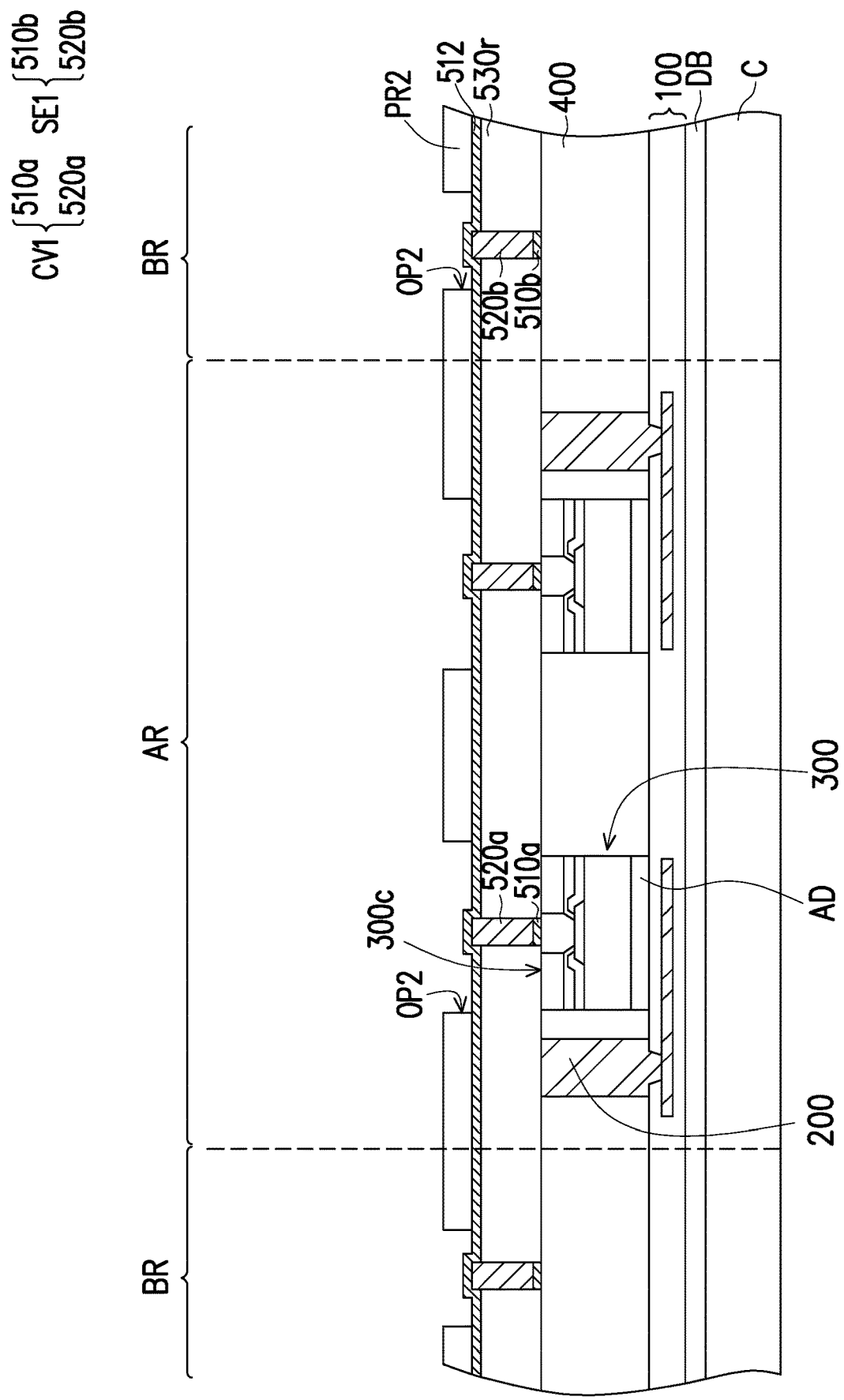
Figure 1L:
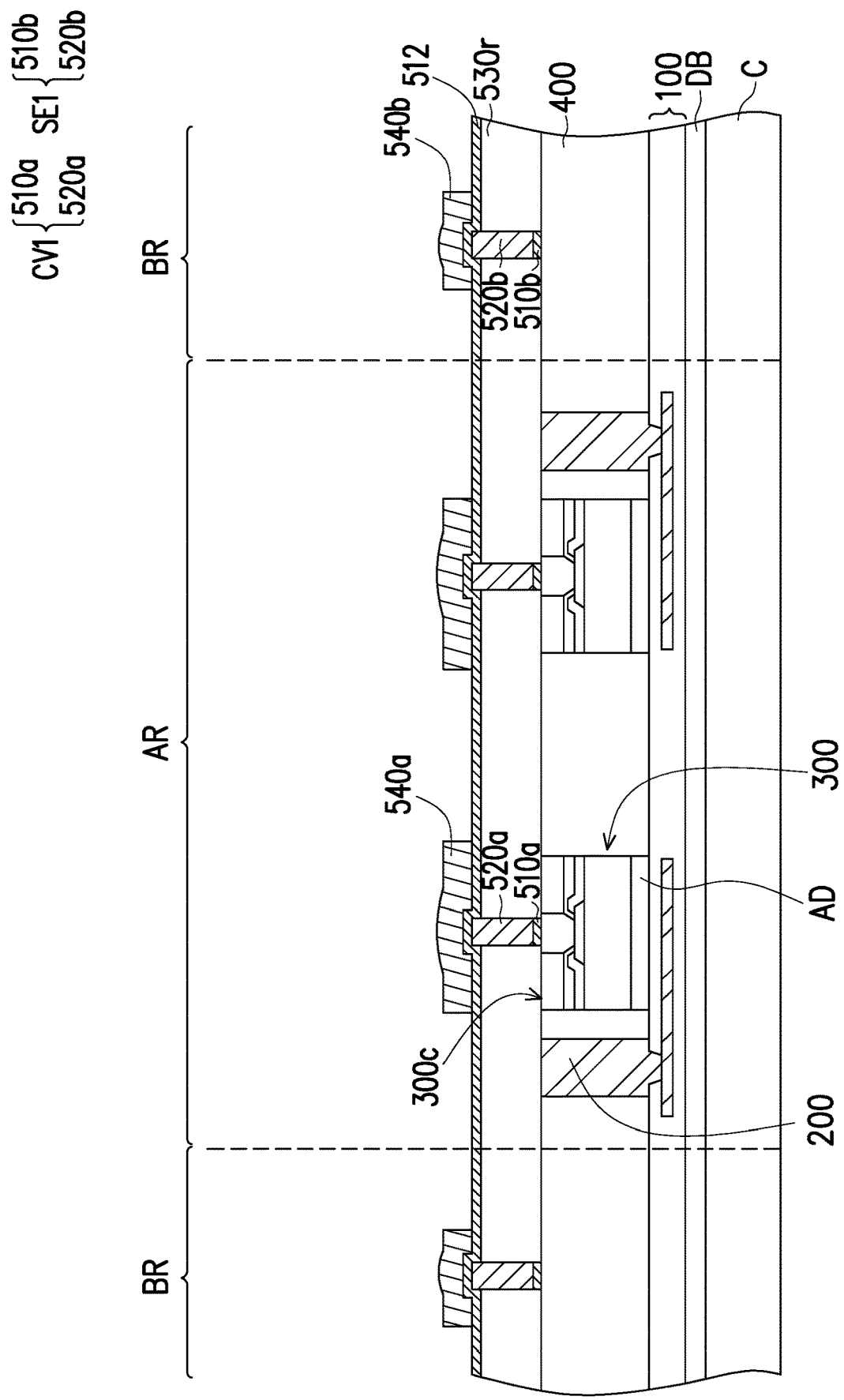
Figure 1M:
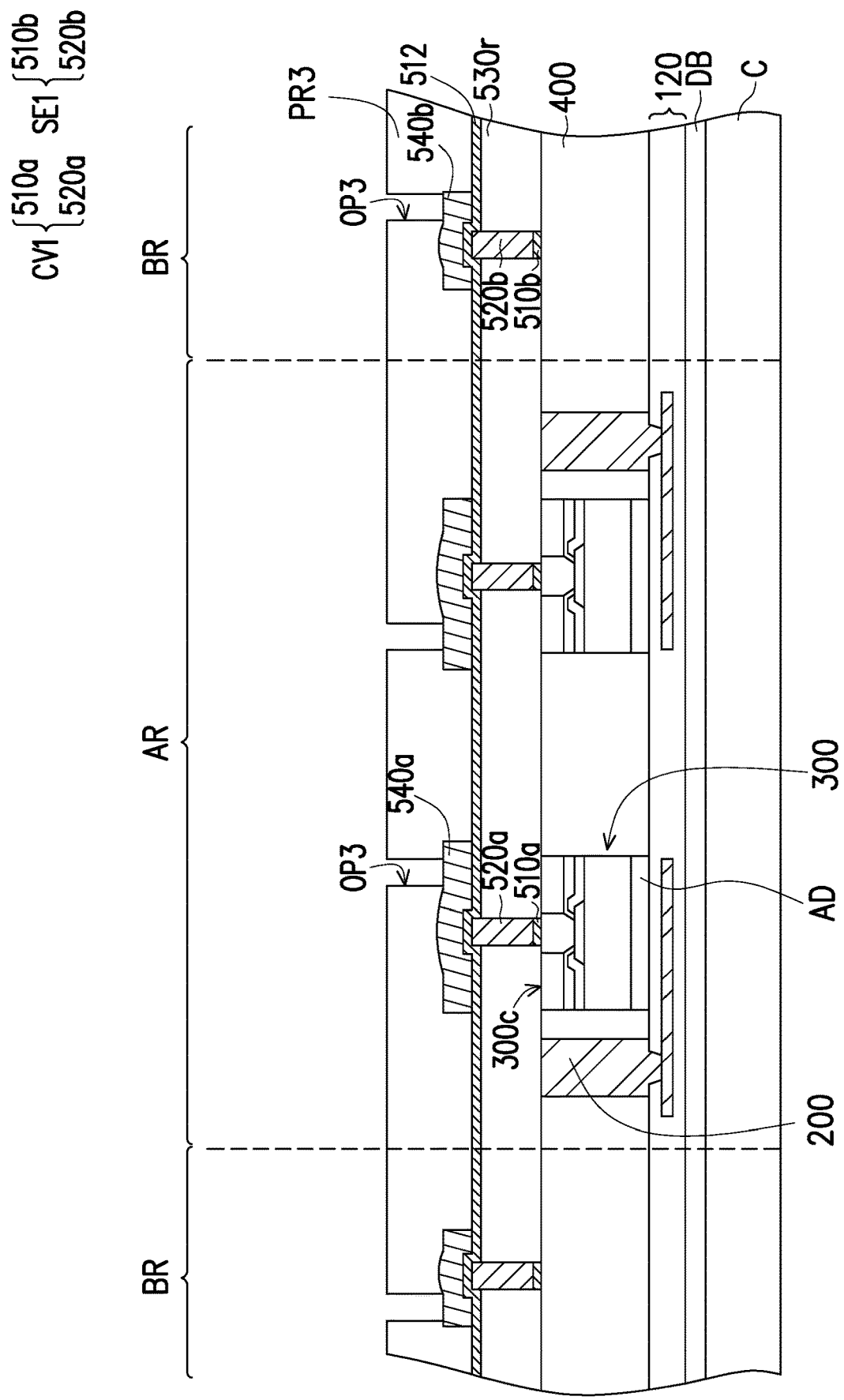
Figure 1N:
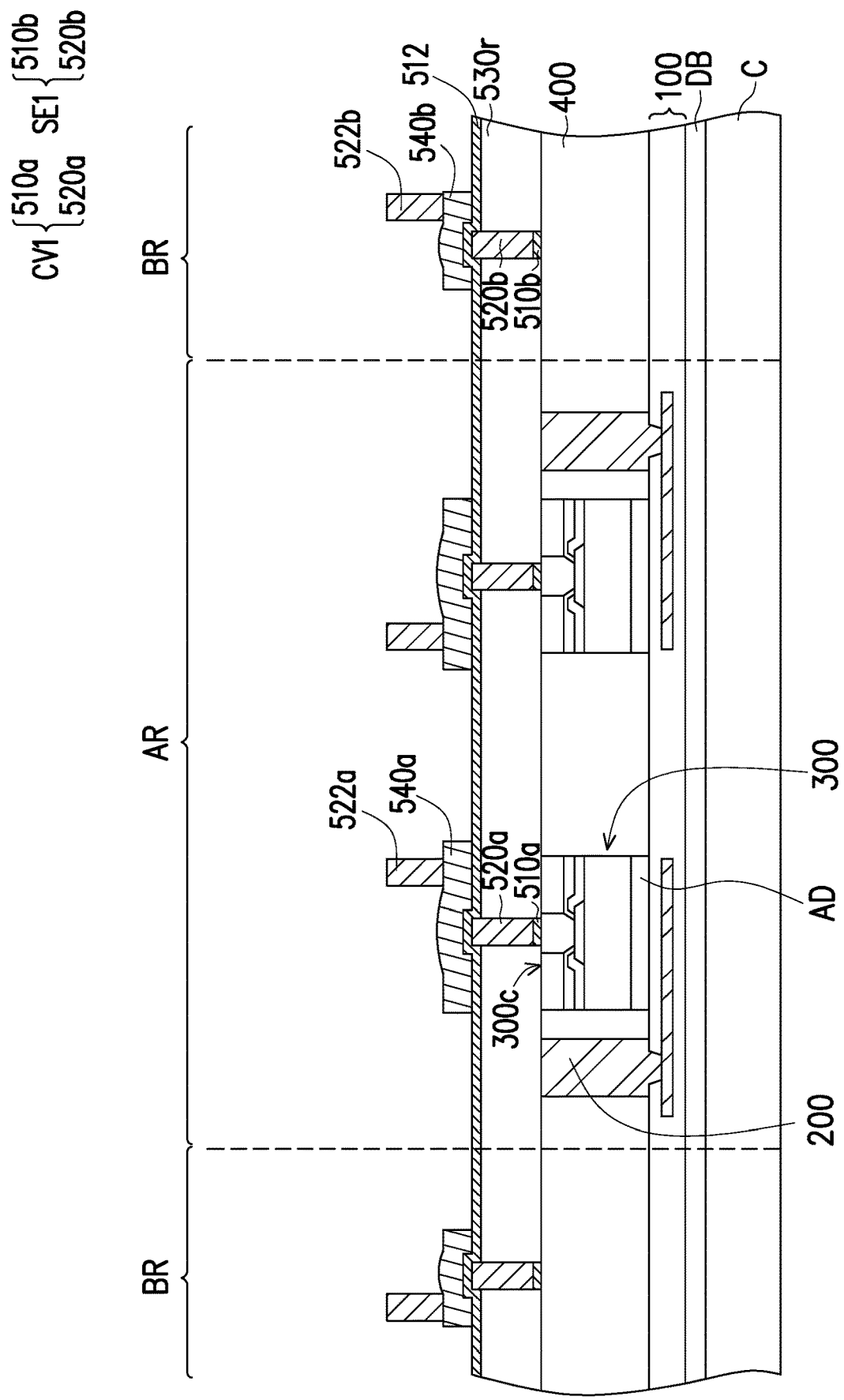
Figure 10:
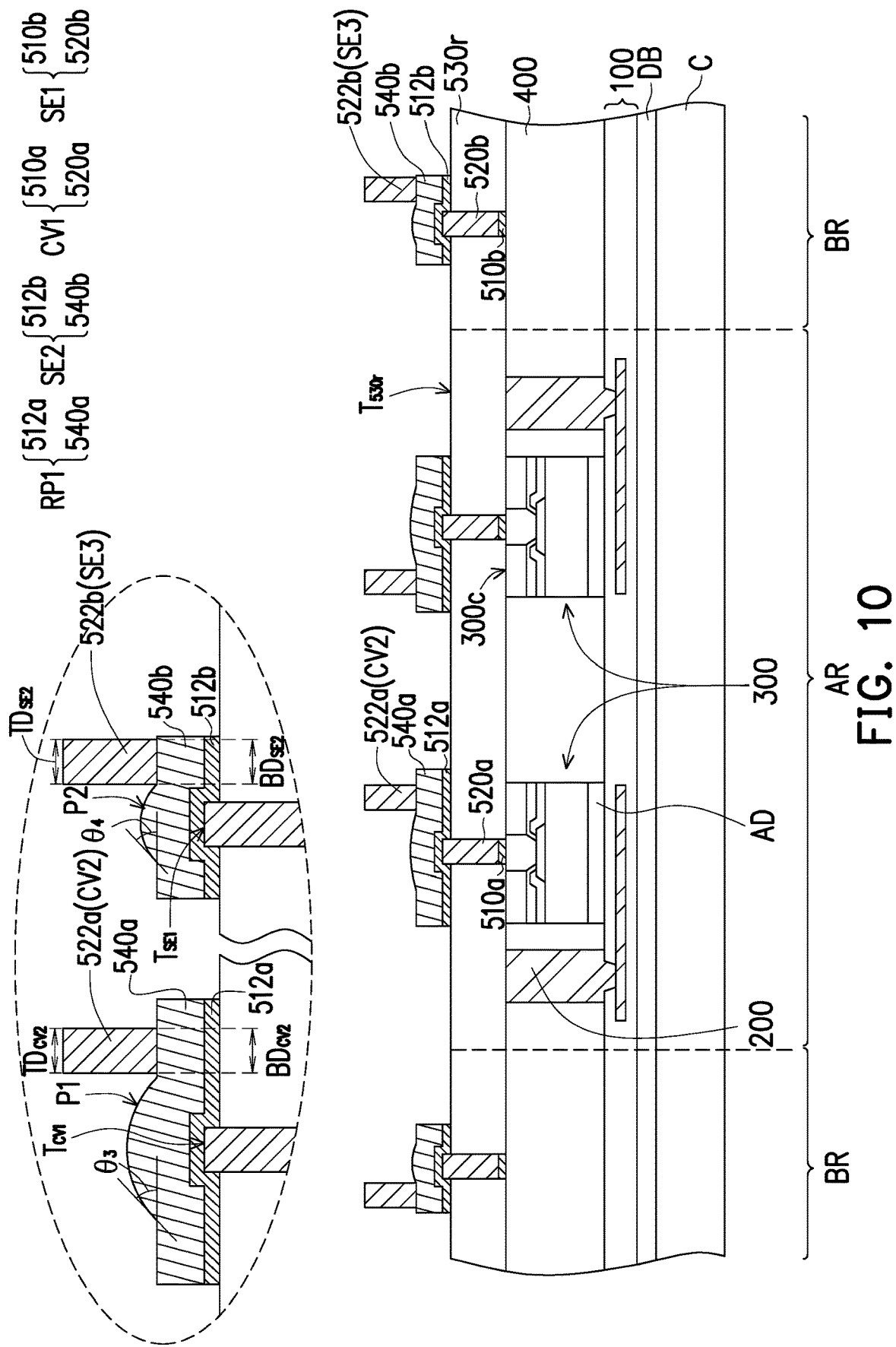
Figure 1P:
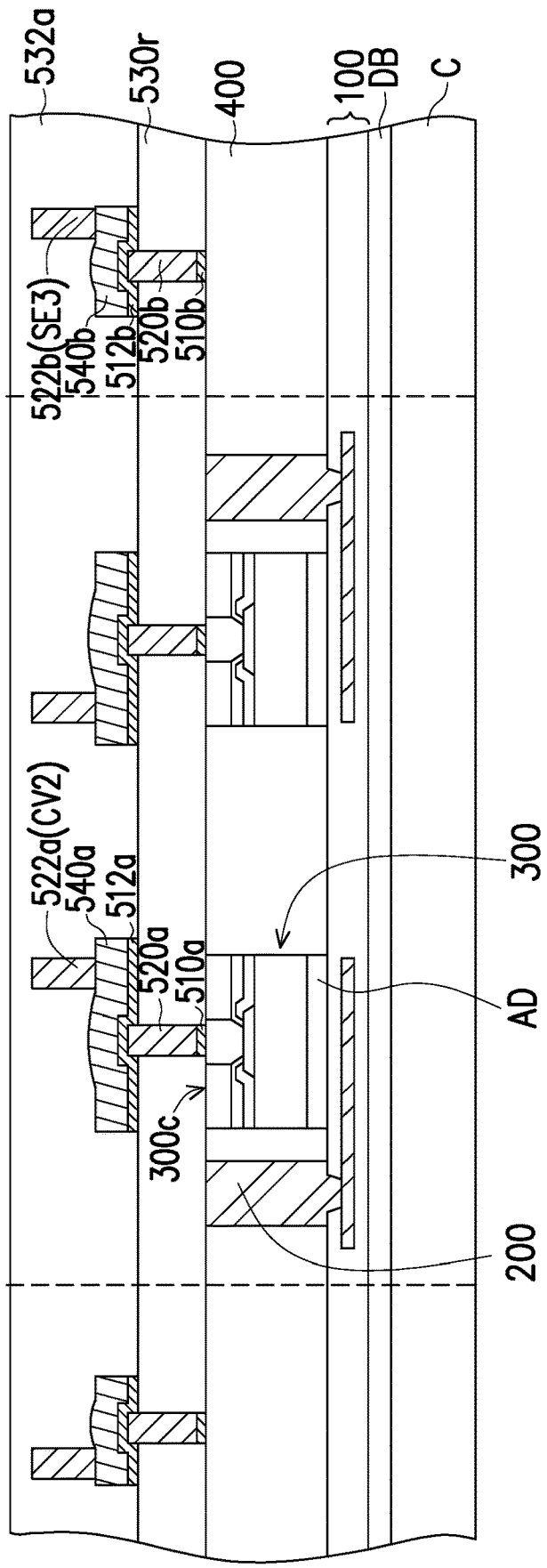
Figure 1Q:
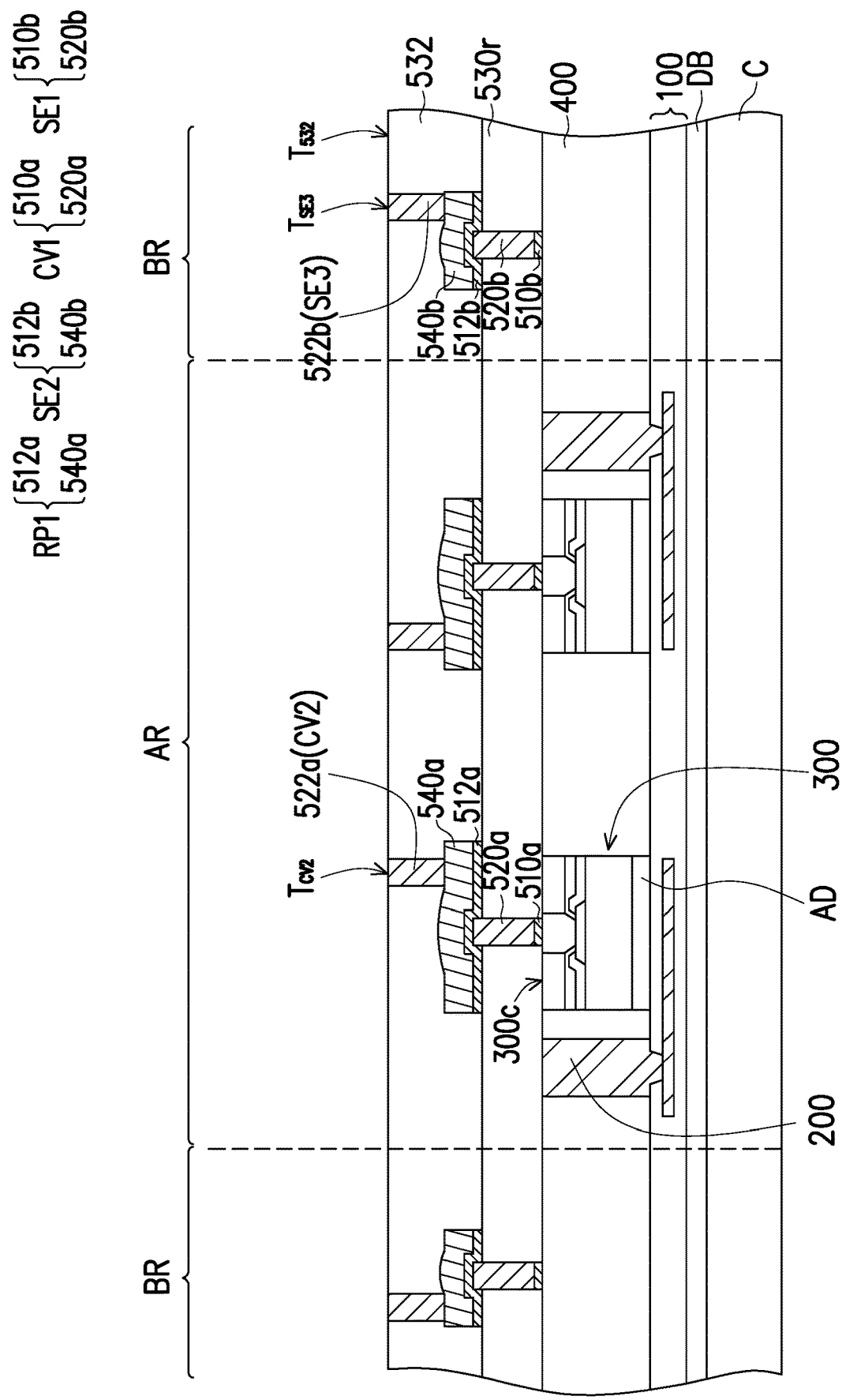
Figure 1R:
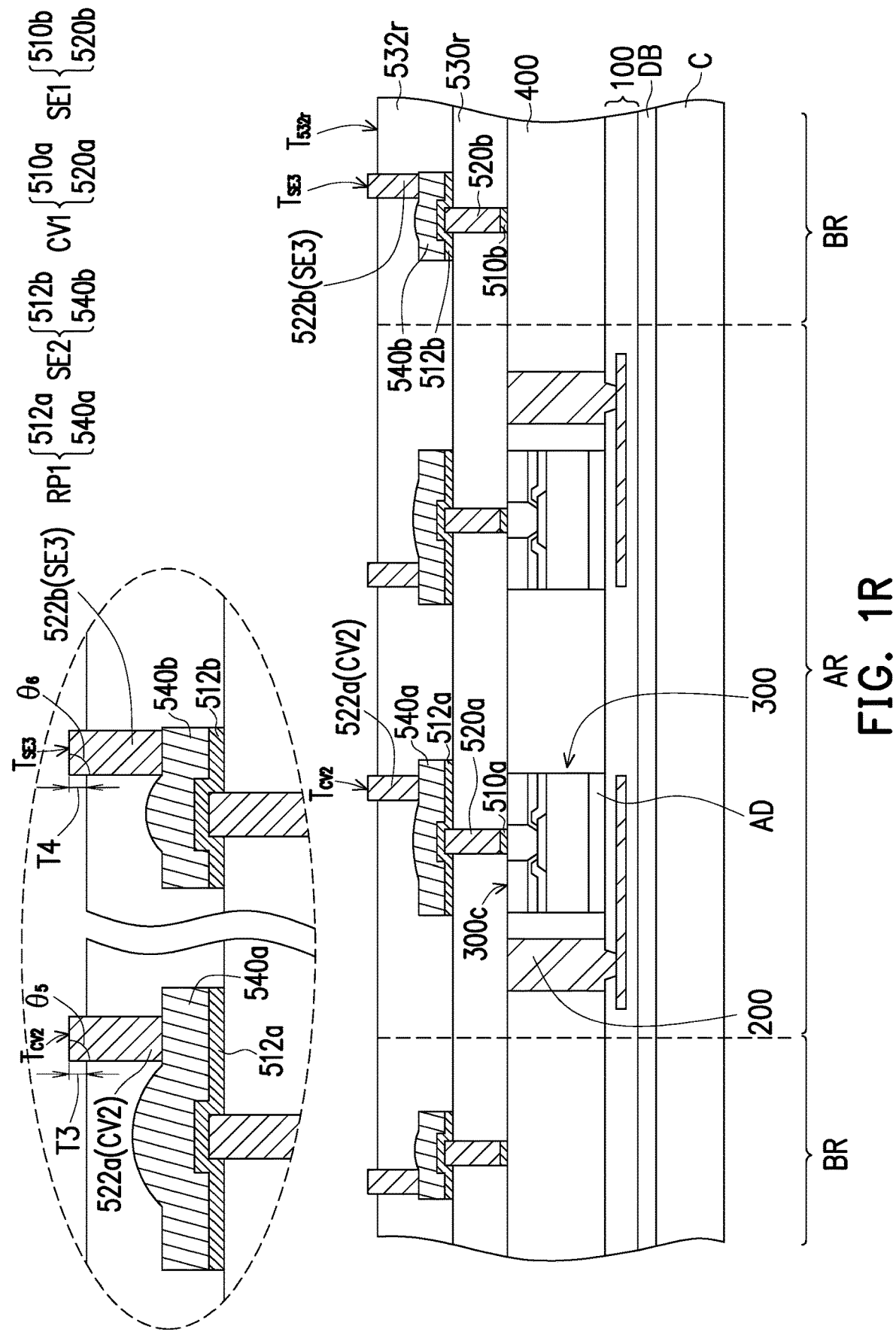
Figure 1T:
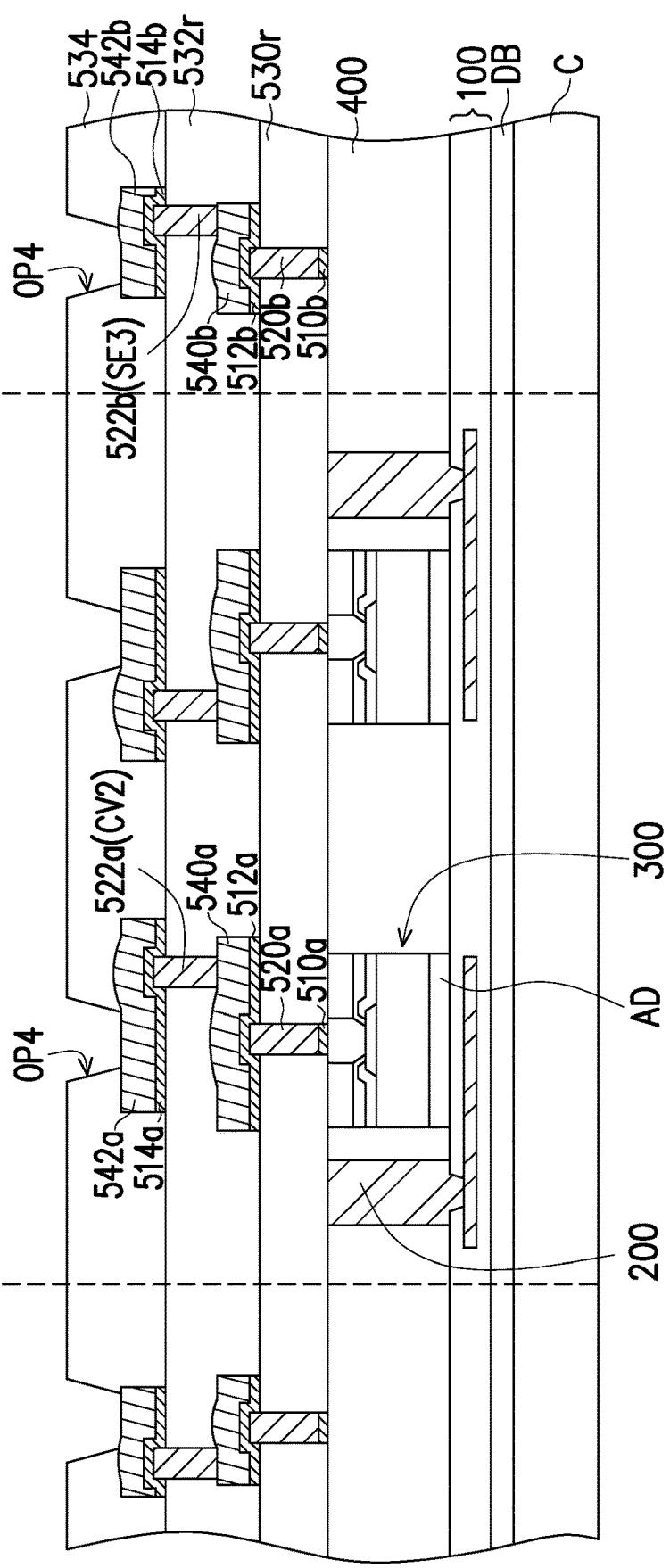
Figure 1U:
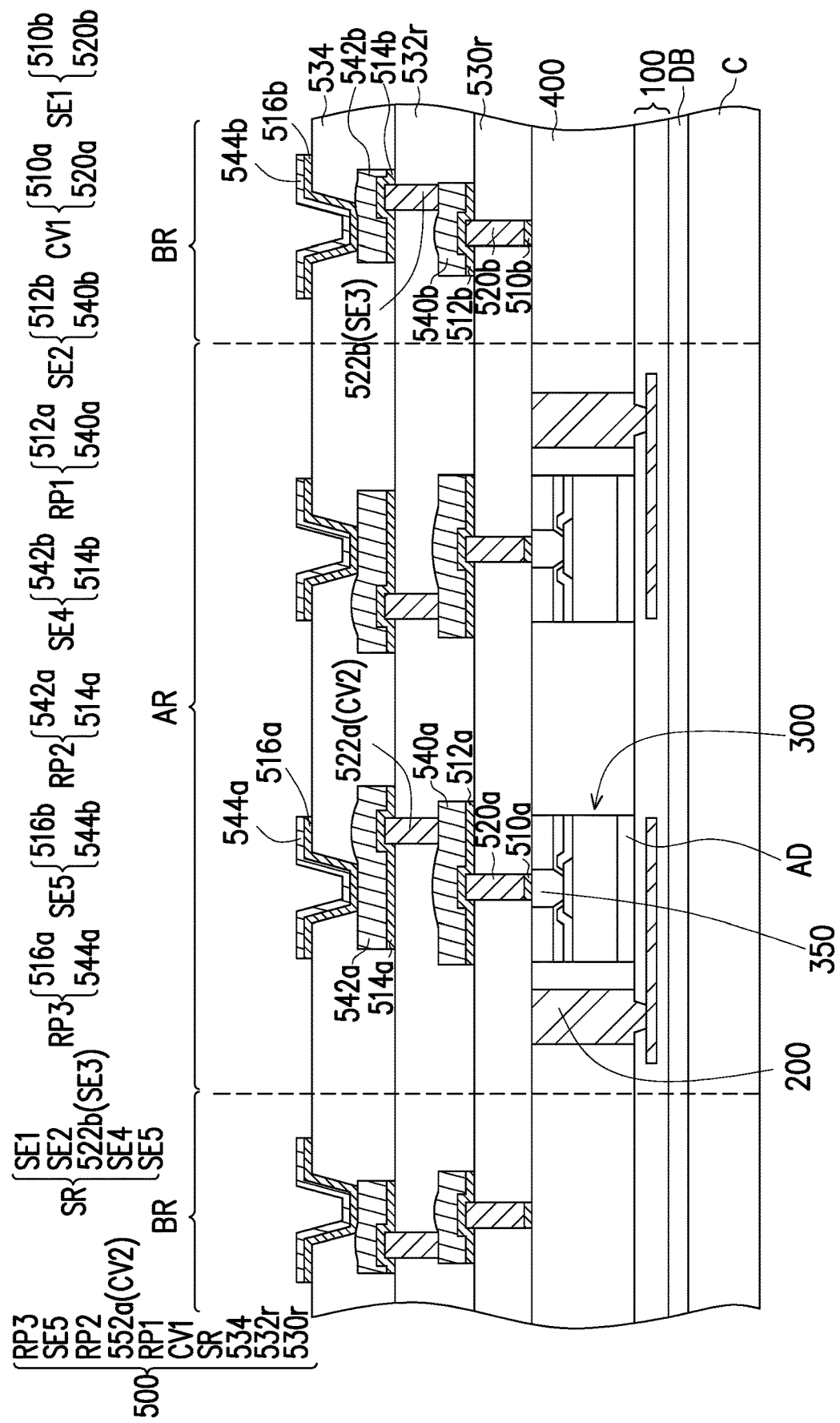
Figure 1V:
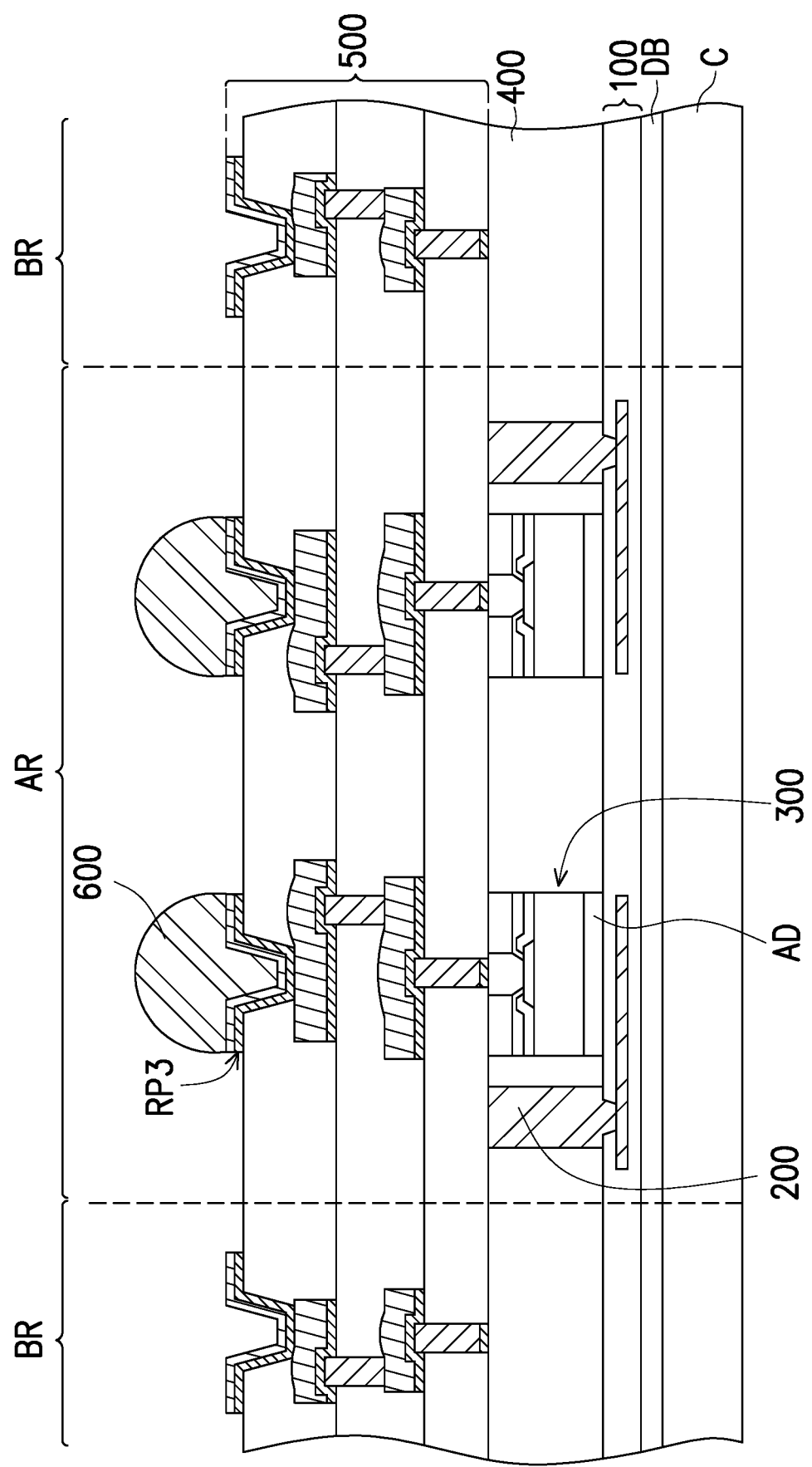
Figure 1W:
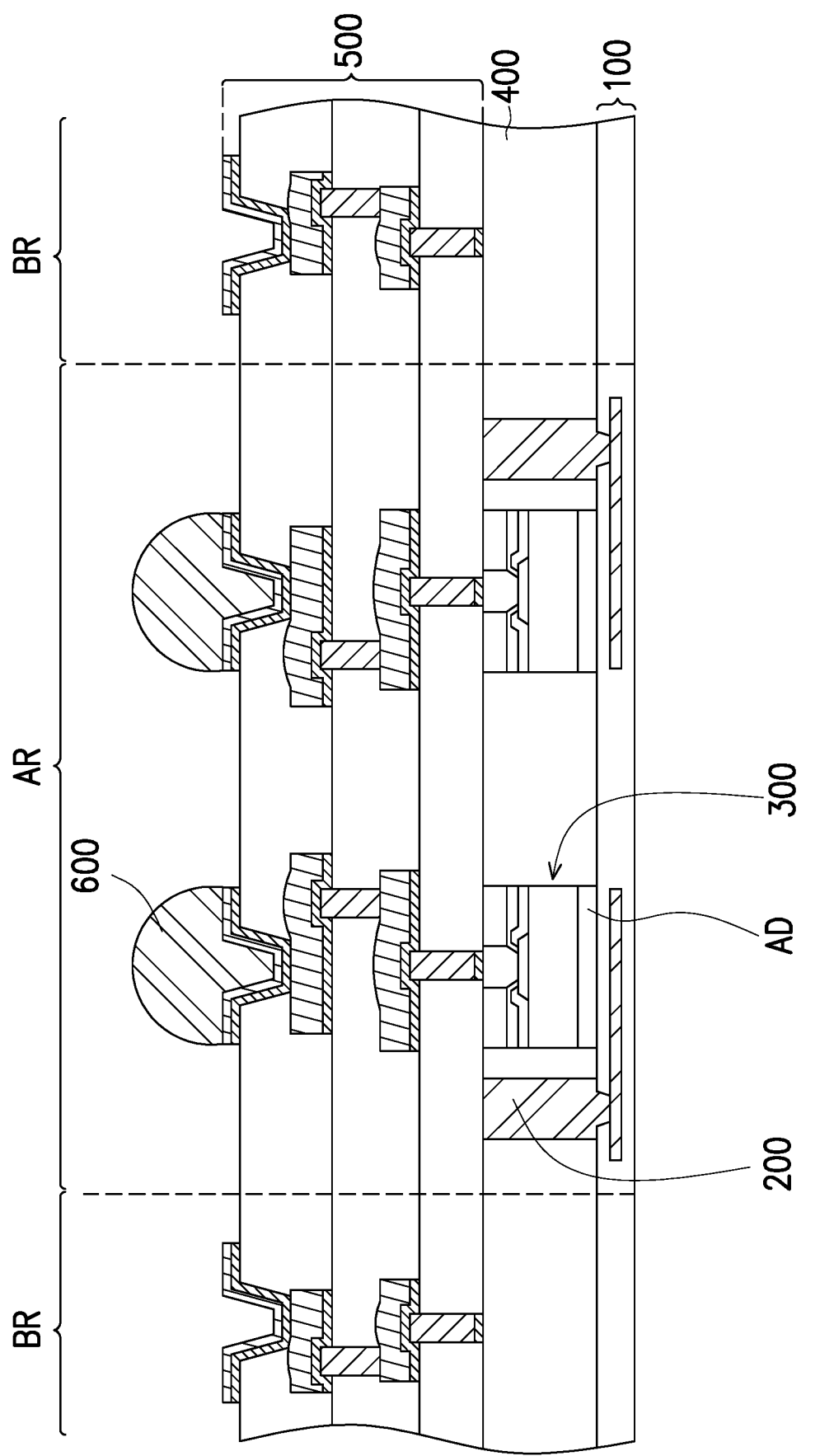
Figure 1X:
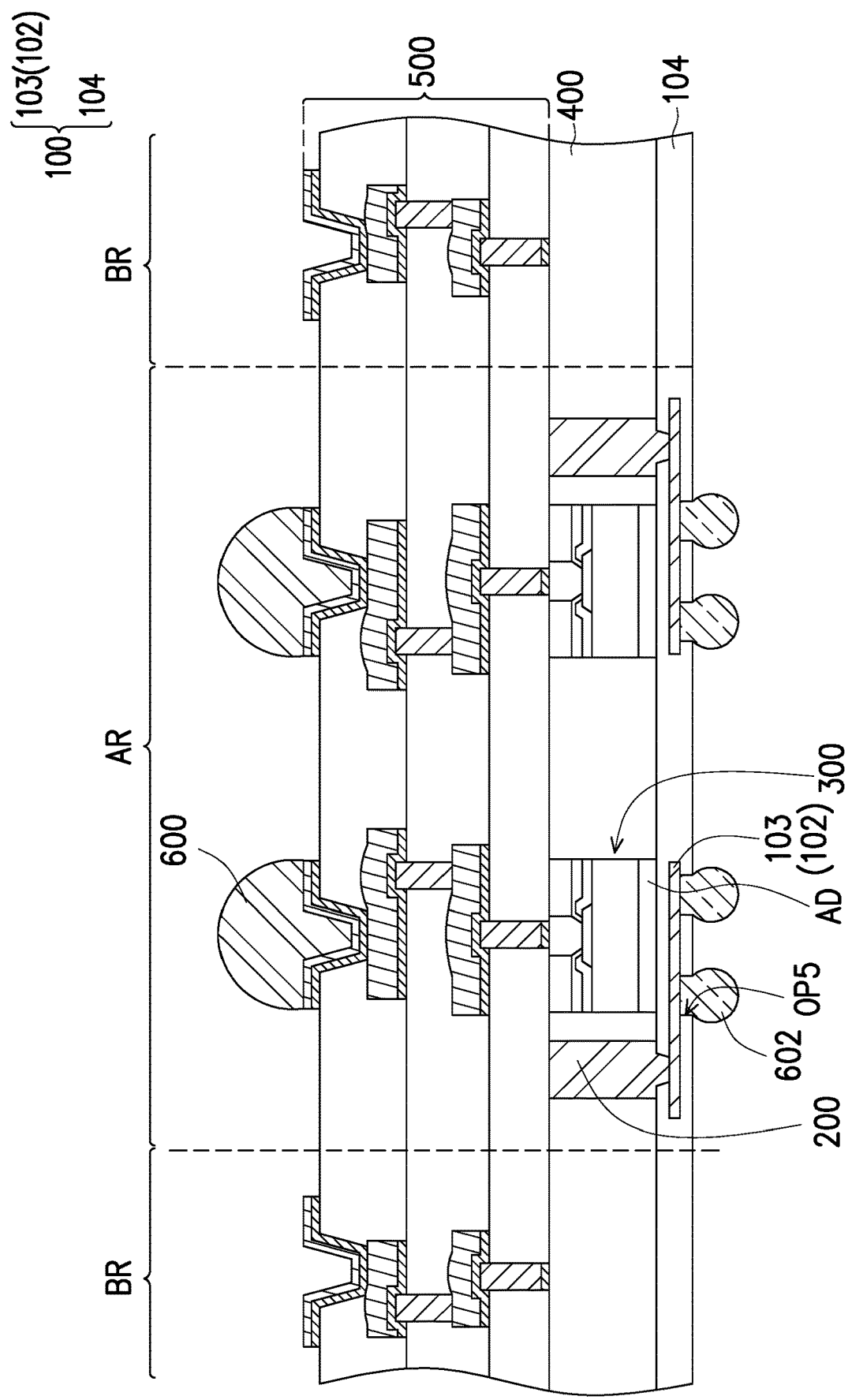
Figure 1Y:
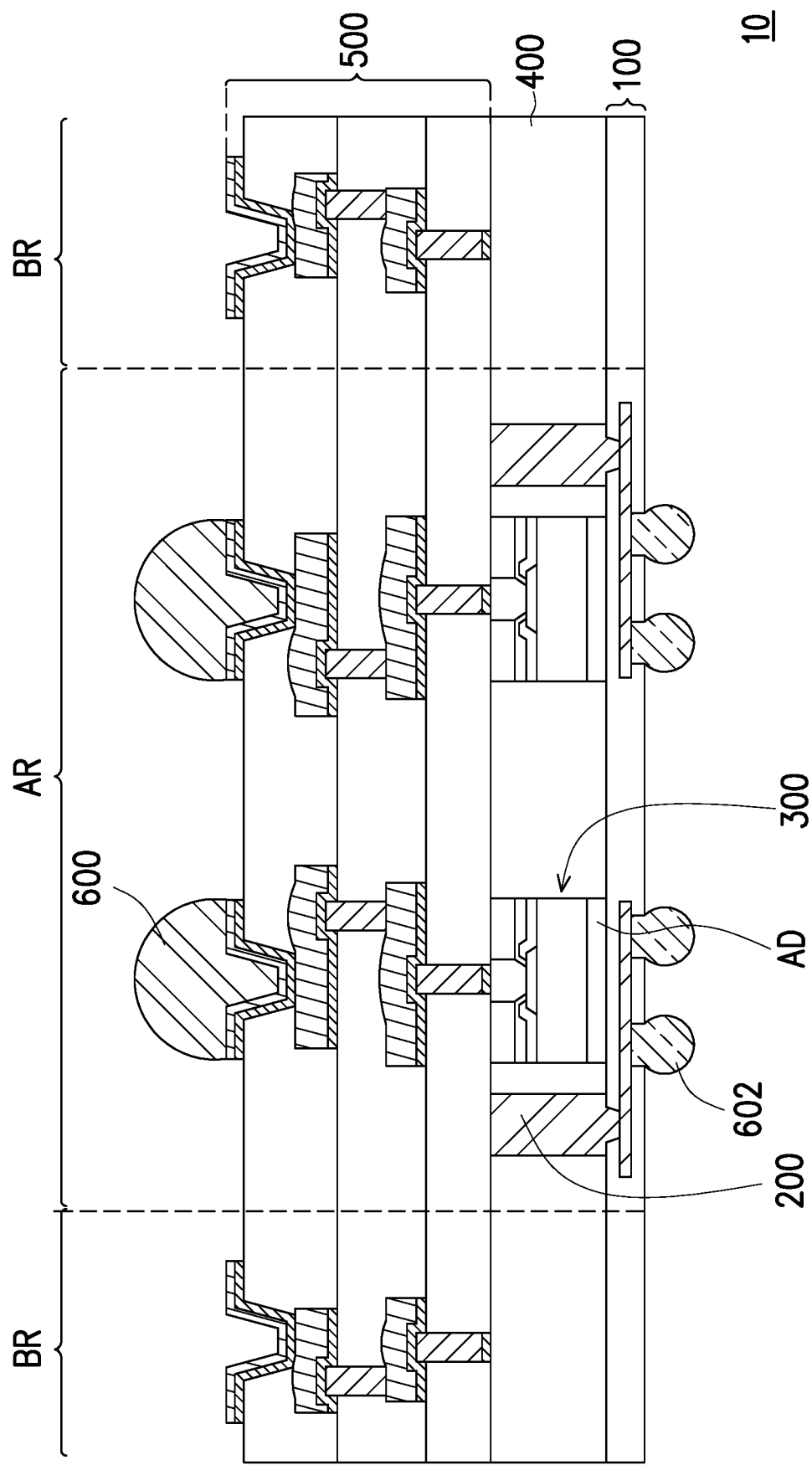

FIG. 1A to FIG. 1Y are schematic cross-sectional views illustrating various process steps for a manufacturing process of an integrated fan-out (InFO) package 10 in accordance with some embodiments of the disclosure. Referring to FIG. 1A, a carrier C having a de-bonding layer DB formed thereon is provided. In some embodiments, the carrier C is a glass substrate. However, other materials may be adapted as a material of the carrier C as long as the material is able to withstand the following manufacturing processes while supporting the elements formed thereon. In some embodiments, the de-bonding layer DB includes a light-to-heat conversion (LTHC) release layer. The de-bonding layer DB allows the structure subsequently formed on the carrier C in the following processes to be separated from the carrier C.

Referring to FIG. 1A, a redistribution structure 100 is formed over the carrier C. In some embodiments, the redistribution structure 100 is formed on and attached to the de-bonding layer DB. In some embodiments, the redistribution structure 100 includes at least a redistribution conductive layer 102 and a dielectric layer 104. In some embodiments, the redistribution conductive layer 102 may be constituted by a plurality of conductive redistribution patterns 103. In certain embodiments, the dielectric layer 104 is illustrated as one single dielectric layer and the redistribution conductive layer 102 is embedded within the dielectric layer 104 with portions of the conductive redistribution patterns 103 are exposed by openings of the dielectric layer 104 in FIG. 1A. Nevertheless, from the perspective of the manufacturing process, in some embodiments, the dielectric layer 104 may include two or more dielectric layers and the redistribution conductive layer 102 may include more than one conductive layers respectively sandwiched between the two most adjacent dielectric layers. In some embodiments, the material of the redistribution conductive layer 102 includes aluminum, titanium, copper, nickel, tungsten, and/or alloys thereof, respectively. The method of forming the redistribution conductive layer 102 may include, for example, electroplating process, deposition process, and/or photolithography and etching process. In some embodiments, the material of the dielectric layer 104 includes polyimide, epoxy resin, acrylic resin, phenol resin, benzocyclobutene (BCB), polybenzooxazole (PBO), or any other suitable polymer-based dielectric material. In some embodiments, the dielectric layer 104, for example, may be formed by suitable fabrication techniques such as spin-on coating, chemical vapor deposition (CVD), plasma-enhanced chemical vapor deposition (PECVD), or the like.

It should be noted that the number of the redistribution conductive layer 102 and the number of the dielectric layer 104 illustrated in FIG. 1A are merely for illustrative purposes, and the disclosure is not limited thereto. In some alternative embodiments, more layers of the redistribution conductive layer and more layers of the dielectric layer may be formed depending on the circuit design. When more layers of redistribution conductive layer and more layers of the dielectric layer are adapted, these redistribution conductive layers and these dielectric layers are stacked alternately, and the redistribution conductive layers may be interconnected with one another by redistribution conductive vias there-between. In some embodiments, the redistribution structure 100 is referred to as a back-side redistribution structure.

Referring to FIG. 1A, conductive structures 200 are formed on the redistribution structure 100. In some embodiments, the InFO package 10 has an active region AR and a border region BR surrounding the active region AR. The conductive structures 200 may be formed, for example, in the active region AR. In some embodiments, the conductive structures 200 are conductive pillars formed following a photolithography process, a plating process, a photoresist stripping processes, and/or any other suitable processes. In some embodiments, the conductive structures 200 are formed on the exposed conductive redistribution patterns 103 and are in contact with the conductive redistribution patterns 103 to render electrical connection with the redistribution structure 100. In some embodiments, the conductive structures 200 may be formed simultaneously on the redistribution structure 100. For example, after forming the openings in the dielectric layer 104 exposing the conductive redistribution patterns 103, a seed material layer (not shown) extending into the openings may be formed over the dielectric layer 104. After forming a mask pattern (not shown) on the seed material layer with via openings to define the locations of the conductive structures 200, the conductive structures 200 are formed by filling a conductive material into openings of the mask pattern and directly on the exposed conductive redistribution patterns 103 through a electroplating process or deposition process. Thereafter, the mask pattern and the seed layer underneath the mask pattern are removed. However, the disclosure is not limited thereto. Other suitable methods may be utilized to form the conductive structures 200.

In some embodiments, the material of the conductive structures 200 includes aluminum, titanium, copper, nickel, tungsten, and/or alloys thereof. It should be noted that the arrangement and the number of the conductive structure 200 shown in FIG. 1A merely serves as an exemplary illustration, and the arrangement and the number of the conductive structure 200 may be varied based on demand.

Referring to FIG. 1B, one or more dies 300 are provided on the redistribution structure 100. In some embodiments, the dies 300 are placed in the active region AR, beside and between the conductive structures 200. For example, the conductive structures 200 are arranged beside the dies 300 and surrounding the dies 300. In some embodiments, the dies 300 are picked and placed onto the redistribution structure 100. In some embodiments, one die 300, for example, includes a semiconductor substrate 310, a conductive pad 320, a passivation layer 330, a post passivation layer 340, an via 350, and a protection layer 360. In some embodiments, the conductive pad 320 is disposed over the semiconductor substrate 310. The passivation layer 330 is formed over the semiconductor substrate 310 and has a contact opening that partially expose the conductive pad 320. The semiconductor substrate 310 may be a silicon substrate including active components (e.g., transistors or the like) and passive components (e.g., resistors, capacitors, inductors, or the like) formed therein. The conductive pad 320 may be an aluminum pad, a copper pad, or other suitable metal pad. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a contact opening. The conductive pad 320 is partially exposed by the contact opening of the post passivation layer 340. The post-passivation layer 340 may be a polyimide (PI) layer, a PBO layer, or a dielectric layer formed by other suitable polymers. In some embodiments, the post-passivation layer 340 may be optional. In addition, the via 350 is formed on the conductive pad 320. In some embodiments, the via 350 is made of conductive materials and are plated on the conductive pad 320. The protection layer 360 is formed on the post-passivation layer 340 to cover the via 350.

As illustrated in FIG. 1B, each die 300 has a rear surface 300a and a front surface 300b opposite to the rear surface 300a. In some embodiments, the rear surfaces 300a of the dies 300 are attached (or adhered) to the redistribution structure 100 through an adhesive layer AD. In some embodiments, the adhesive layer AD may include a die attach film (DAF). On the other hand, the front surfaces 300b of the dies 300 face upward in FIG. 1B. As illustrated in FIG. 1B, top surfaces (front surface 300b) of the dies 300 are substantially coplanar with top surfaces of the conductive structures 200. However, the disclosure is not limited thereto. In some alternative embodiments, the top surfaces (front surface 300b) of the dies 300 may be located at a level height lower than or higher than the top surfaces of the conductive structures 200 along the direction perpendicular to the front surface 300b of the dies 300. Although two dies 300 are shown in FIG. 1B, the configuration merely serves as an exemplary illustration. In some alternative embodiments, more or less number of dies may be formed based on demand. It should be noted that the number of the conductive pad 320 and the number of the via 350 in each die 300 shown in FIG. 1B merely serves as an exemplary illustration, and the number of the conductive pad 320 and the number of the via 350 in each die 300 may be varied based on demand.

Referring to FIG. 1C, an encapsulation material 400a is formed over the redistribution structure 100 to encapsulate the conductive structures 200 and the dies 300. For example, the conductive structures 200 and the dies 300 are fully encapsulated by the encapsulation material 400a, without exposing the conductive structures 200 and the protection layers 360 of the dies 300. In some embodiments, the encapsulation material 400a is a molding compound, a molding underfill, a resin (such as epoxy), or the like. The encapsulation material 400a may be formed by a molding process. For example, the encapsulation material 400a may be formed by a compression molding process.

Referring to FIG. 1C and FIG. 1D, the encapsulation material 400a and the protection layers 360 of the dies 300 are grinded until top surfaces of the vias 350 of the dies 300 are exposed. After the encapsulation material 400a is grinded, an encapsulant 400 is formed over the redistribution structure 100 to encapsulate the conductive structures 200 and the dies 300. In some embodiments, the encapsulant material 400a is grinded by a mechanical grinding process and/or a chemical mechanical polishing (CMP) process. In some embodiments, during the grinding process of the encapsulant material 400a, the protection layers 360 are grinded to reveal the vias 350. In some embodiments, portions of the vias 350 and portions of the conductive structures 200 are slightly grinded as well. After grinding, each die 300 has an active surface 300c opposite to the rear surface 300a. The exposed portion of the vias 350 is located on the active surfaces 300c of the dies 300. It is noted that the top surfaces of the conductive structures 200, the top surfaces of the protection layers 360, and the top surfaces of the vias 350 are substantially coplanar with a top surface of the encapsulant 400.

Referring to FIG. 1E, a seed material layer 510 is formed on the encapsulant 400, the conductive structures 200, and the dies 300. In some embodiments, the seed material layer 510 is blankly formed over the encapsulant 400, the conductive structures 200, and the dies 300. For example, the seed material layer 510 is formed to locate in both of the active region AR and the border region BR. In some embodiments, the seed material layer 510 is formed to be in direct contact with the conductive structures 200, the encapsulant 400, the protection layers 360 of the dies 300, and the vias 350 of the dies 300. The seed material layer 510 may be formed through, for example, a sputtering process, a physical vapor deposition (PVD) process, or the like. In some embodiments, the seed material layer 510 may include, for example, copper, titanium-copper alloy, or other suitable choice of materials.

Referring to FIG. 1E again, a photoresist layer PR1 is formed over the seed material layer 510. In some embodiments, the photoresist layer PR1 may be formed through spin-coating or other suitable formation methods. As illustrated in FIG. 1E, the photoresist layer PR1 has a plurality of openings OP1 exposing at least a portion of the seed material layer 510 in the active region AR and the border region BR. In some embodiments, the size of the openings OP1 in the border region BR may be same as the size of the openings OP1 in the active region AR. However, the disclosure is not limited thereto. In some alternative embodiments, the size of the openings OP1 in the border region BR may be different from the size of the openings OP1 in the active region AR. For example, the size of the openings OP1 in the border region BR may be larger the size of the openings OP1 in the active region AR. In some embodiments, the openings OP1 in the active region AR correspond to the locations of the vias 350 of the dies 300. For example, a vertical projection of the openings OP1 in the active region AR along a direction perpendicular to the active surface 300c of the dies 300 overlaps with the vias 350 of the dies 300.

Referring to FIG. 1E and FIG. 1F, a plurality of conductive patterns 520a, a plurality of conductive patterns 520b are formed on the seed material layer 510. In some embodiments, the openings OP1 of the photoresist layer PR1 in the active region AR and the border region BR are filled up with a conductive material (not shown). Thereafter, the photoresist layer PR1 is removed to obtain the conductive patterns 520a, 520b. Upon removal of the photoresist layer PR1, portions of the seed material layer 510, which are not covered by the conductive patterns 520a, 520b, are exposed. In some embodiments, the conductive material may be formed by a plating process. The plating process is, for example, electro-plating process, electroless-plating process, immersion plating process, or the like. In some embodiments, the conductive material includes, for example, copper, copper alloys, or the like. The photoresist pattern layer PR1 may be removed/stripped through, for example, etching, ashing, or other suitable removal processes. In some embodiments, the conductive patterns 520a are located in the active region AR and the conductive patterns 520b are located in the border region BR.

Referring to FIG. 1F and FIG. 1G, portions of the seed material layer 510 that are not covered by the conductive patterns 520a, 520b are removed to render seed layers 510a, 510b. That is, the seed material layer 510 underneath the photoresist layer PR1 as shown in FIG. 1E is removed. The exposed portions of the seed material layer 510 may be removed through an etching process. In some embodiments, the material of the conductive patterns 520a, 520b may be different from the material of the seed material layer 510, so the exposed portion of the seed material layer 510 may be removed through selective etching. The seed layer 510a is located in the active region AR and the seed layer 510b is located in the border region BR. In some embodiments, the seed layer 510a is sandwiched between the vias 350 and the conductive patterns 520a. In some embodiments, the seed layer 510b is sandwiched between the encapsulant 400 and the conductive patterns 520b.

In some embodiments, the conductive patterns 520a and the seed layer 510a located in the active region AR are collectively referred to as first conductive vias CV1, and the conductive patterns 520b and the seed layer 510b located in the border region BR may be collectively referred to as a first seal ring element SE1. In some embodiments, the first conductive vias CV1 are located in the active region AR and is located in the border region BR. The first conductive vias CV1 are physically in contact with the dies 300. For example, the seed layer 510a of the first conductive vias CV1 may be directly in contact with the vias 350 of the dies 300. The first seal ring element SE1 is physically in contact with the encapsulant 400. For example, the seed layer 510b of the first seal ring element SE1 may be directly in contact with the encapsulant 400. The first conductive vias CV1 may electrically connect the vias 350 of the dies 300 with other subsequently formed elements. In some embodiments, the first seal ring element SE1 is electrically floating. For example, the first seal ring element SE1 is electrically insulated from the first conductive vias CV1, the conductive structures 200, the vias 350 of the dies 300, and the redistribution structure 100.

Figure 2:
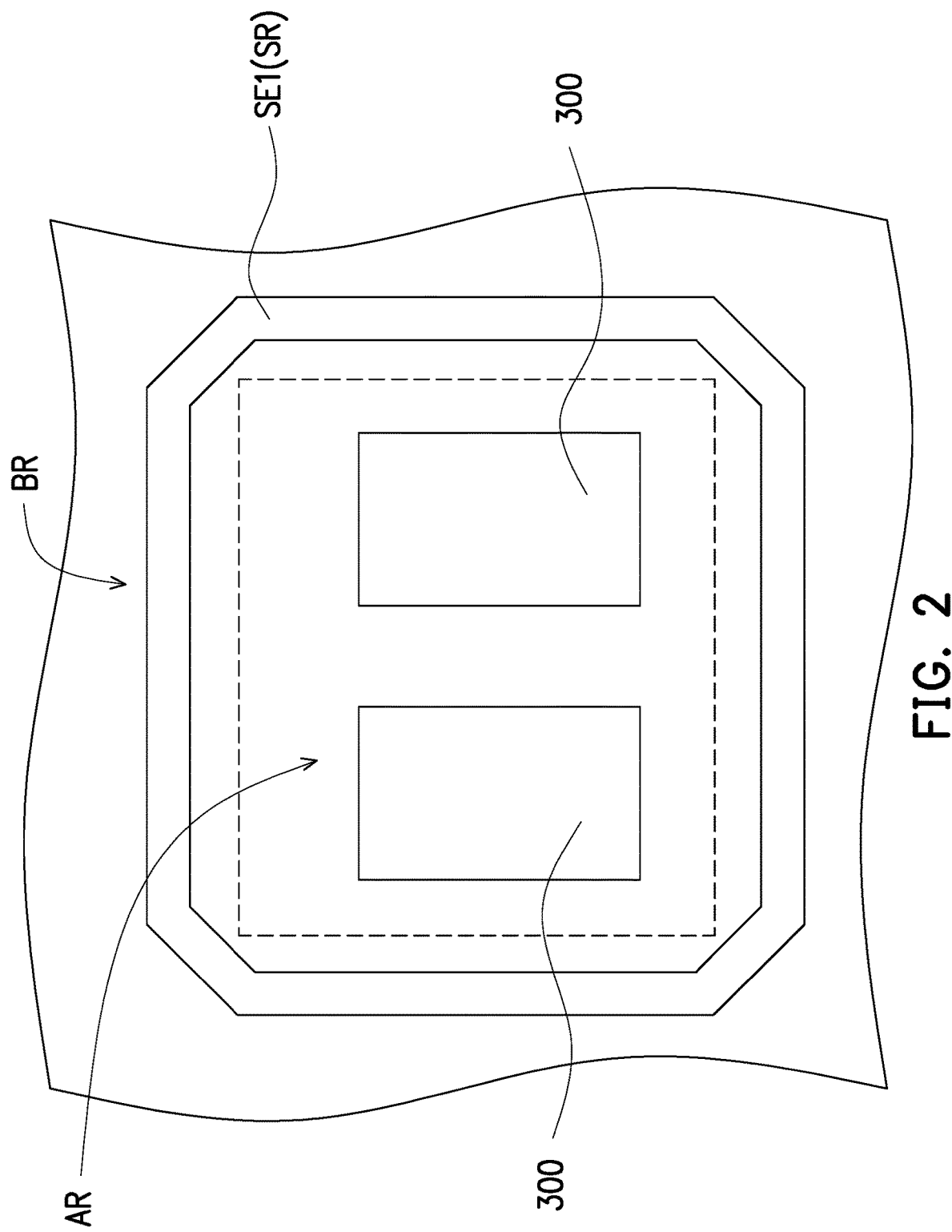
FIG. 2 is a top view illustrating the InFO package at the stage of FIG. 1G.

The first seal ring element SE1 shown in FIG. 1G is part of a subsequently formed seal ring structure SR (in FIG. 1U). In some embodiments, the contour of the first seal ring element SE1 (and the seal ring structure SR) may be in a loop pattern, referring to FIG. 2 which is a top view illustrating the InFO package 10 at the stage of FIG. 1G, and in which some elements are omitted for clearly illustrating the disposition relationship between the first seal ring element SE1 and the dies 300. From the top plan view, the shape of the first seal ring element SE1 may be an octagonal ring shape. However, the disclosure is not limited thereto. In some alternative embodiments, the shape of the first seal ring element SE1 may be a circle, any other suitable polygon, or any other suitable shape from a top plan view. In addition, in some alternative embodiments, the first seal ring element SE1 is not a closed loop, but may have openings therein. In some embodiments, the first seal ring element SE1 surrounds the active region AR. As mentioned above, since the first seal ring element SE1 is formed by filling the conductive material into the openings OP1 in the border region BR, the openings OP1 in the border region BR are parts of a loop opening which may have shape corresponding to the contour of the first seal ring element SE1.

In some embodiments, from the cross-sectional view, the top dimension $TD_{SE1}$ of the first seal ring element SE1 is substantially equal to the bottom dimension $BD_{SE1}$ of the first seal ring element SEE However, the disclosure is not limited thereto. In some alternative embodiments, from the cross-sectional view, the top dimension $TD_{SE1}$ of the first seal ring element SE1 is smaller than the bottom dimension $BD_{SE1}$ of the first seal ring element SE1, as shown in the schematic cross-sectional view on the left side of FIG. 1G. As mentioned above, since the first seal ring element SE1 is formed by filling the conductive material into the openings OP1 in the border region BR, an included angle may be formed between the sidewalls of the openings OP1 and a virtual line extending along the direction perpendicular to the front surface 300c of the dies 300.

In some embodiments, from the cross-sectional view, the top dimension $TD_{CV1}$ of each first conductive via CV1 is substantially equal to the bottom dimension $BD_{CV1}$ of each first conductive via CV1. However, the disclosure is not limited thereto. In some alternative embodiments, the top dimension $TD_{CV1}$ of each first conductive via CV1 is smaller than the bottom dimension $BD_{CV1}$ of each first conductive via CV1, as shown in the schematic cross-sectional view on the left side of FIG. 1G. In some embodiments, from the cross-sectional view, the top dimension $TD_{CV1}$ and the bottom dimension $BD_{CV1}$ of each first conductive via CV1 are in the range of approximately 0.8 μm to 5 μm, respectively. Besides, in some embodiments, the contour of each first conductive via CV1 may be cylinder. However, the disclosure is not limited thereto. In some alternative embodiments, the contour of each first conductive via CV1 may be polygonal cylinder, such as square cylinder, pentagonal cylinder, or hexagonal cylinder. In the case that the contour of each first conductive via CV1 is cylinder, then the top dimension $TD_{CV1}$ and the bottom dimension $BD_{CV1}$ may be the diameter. In the case that the contour of each first conductive via CV1 is polygonal cylinder, then the top dimension $TD_{CV1}$ and the bottom dimension $BD_{CV1}$ may be the maximum dimension. As mentioned above, since the first conductive vias CV1 are formed by filling the conductive material into the openings OP1 in the active region AR, each opening OP1 in the active region AR may have shape corresponding to the contour of each first conductive via CV1.

Referring to FIG. 1H, a first dielectric material layer 530a is formed over the encapsulant 400, the conductive structures 200, and the dies 300 to encapsulate the first conductive vias CV1 and the first seal ring element SE1. In other words, the first conductive vias CV1 and the first seal ring element SE1 are not revealed and are well protected by the first dielectric material layer 530a. In some embodiments, the material of the first dielectric material layer 530a includes polyimide, epoxy resin, acrylic resin, phenol resin, BCB, PBO, or any other suitable polymer-based dielectric material. The first dielectric material layer 530a may be formed by suitable fabrication techniques, such as spin-on coating, chemical vapor deposition (CVD), plasma-enhanced chemical vapor deposition (PECVD), or the like.

Referring to FIG. 1H and FIG. 1I, the first dielectric material layer 530a is partially removed by performing a planarization process to form a first dielectric layer 530 exposing the top surfaces $T_{CV1}$ of the first conductive vias CV1 and the top surface $T_{SE1}$ of the first seal ring element SE1. For example, the first dielectric material layer 530a may be planarized/grinded until the top surfaces $T_{CV1}$ of the first conductive vias CV1 and the top surface $T_{SE1}$ of the first seal ring element SE1 are exposed. In some embodiments, the first dielectric material layer 530a is planarized/grinded by a chemical mechanical polishing (CMP) process. In some embodiments, the degree of planarization (DOP) for the first dielectric layer 530 is in a range of approximately 90% to 100%. In some embodiments, the uniformity of the first dielectric layer 530 is in a range of approximately 10% to 25%.

In some embodiments, the first dielectric material layer 530a is planarized/grinded such that the top surface $T_{530}$ of the first dielectric layer 530 is substantially coplanar with the top surfaces $T_{CV1}$ of the first conductive vias CV1 and the top surface $T_{SE1}$ of the first seal ring element SE1. That is, the first dielectric layer 530 has a thickness substantially equivalent to those of the first conductive vias CV1 and the first seal ring element SE1. For example, in some embodiments, the first dielectric layer 530, the first conductive vias CV1, and the first seal ring element SE1 may have substantially the same thickness of 2 μm to 10 μm. In some alternative embodiments, due to grinding selectivity between different materials, a thickness difference in the thickness direction parallel to the direction perpendicular to the active surface 300c of the dies 300 may be seen between the first dielectric layer 530 and the the first conductive vias CV1 and between the first dielectric layer 530 and the first seal ring element SE1. However, since the first dielectric layer 530 is formed by the planarization process, the thickness difference is negligible.

In some embodiments, the first dielectric layer 530 wraps around the first conductive vias CV1 and the first seal ring element SE1. In detail, in some embodiments, the first conductive vias CV1 and the first seal ring element SE1 are embedded in the first dielectric layer 530.

Referring to FIG. 1J, the first dielectric layer 530 is recessed by performing a plasma process to form the recessed first dielectric layer 530r. As described above, the first dielectric layer 530, the first conductive vias CV1, and the first seal ring element SE1 may have substantially the same thickness, therefore after the first dielectric layer 530 is recessed by the plasma process, the first conductive vias CV1 and the first seal ring element SE1 protrude from the top surface $T_{530r}$ of the recessed first dielectric layer 530r along the direction perpendicular to the active surface 300c of the dies 300. In other words, the thickness of the recessed first dielectric layer 530r is smaller than the thickness of the first conductive vias CV1 and the thickness of the first seal ring element SE1. In some embodiments, the plasma process is, for example, an oxide plasma process.

In some embodiments, the recessed first dielectric layer 530r wraps around the first conductive vias CV1 and the first seal ring element SE1. In detail, in some embodiments, the first conductive vias CV1 and the first seal ring element SE1 are partially embedded in the recessed first dielectric layer 530r, and the recessed first dielectric layer 530r partially wraps around sidewalls of the first conductive vias CV1 and the first seal ring element SE1.

In some embodiments, the thickness of the first dielectric layer 530 removed by the plasma process is accounted for approximately 5% to 20% thickness of the first dielectric layer 530. In other words, in some embodiments, a thickness difference T1 in the thickness direction between the thickness of the recessed first dielectric layer 530r and the thickness of each first conductive via CV1 is accounted for approximately 5% to 20% thickness of the first dielectric layer 530, and a thickness difference T2 between the thickness of the recessed first dielectric layer 530r and the thickness of the first seal ring element SE1 is accounted for approximately 5% to 20% thickness of the first dielectric layer 530. For example, the thickness difference T1 is between 0.1 μm and 0.3 μm. Similarly, the thickness difference T2 is between 0.1 μm and 0.3 μm, for example.

In some embodiments, since a distance along the direction perpendicular to the active surface 300c of the dies 300 (the thickness difference T1) is between the top surface $T_{530r}$ of the recessed first dielectric layer 530r and the top surface $T_{CV1}$ of each first conductive via CV1, the top surface $T_{530r}$ of the recessed first dielectric layer 530r is lower than the top surfaces $T_{CV1}$ of the first conductive vias CV1. Similarly, in some embodiments, since a distance along the direction perpendicular to the active surface 300c of the dies 300 (the thickness difference T2) is between the top surface $T_{530r}$ of the recessed first dielectric layer 530r and the top surface $T_{SE1}$ of the first seal ring element SE1, the top surface $T_{530r}$ of the recessed first dielectric layer 530r is lower than the top surface T$_{SE1}$ of the first seal ring element SE1.

In some embodiments, the first conductive vias CV1, the first seal ring element SE1, and the recessed first dielectric layer 530r may constitute a first sub-layer of a subsequently formed redistribution structure 500 (shown in FIG. 1U). As illustrated in FIG. 1J, the first sub-layer is formed over the encapsulant 400, the dies 300, and the conductive structures 200.

In some embodiments, the DOP for the recessed first dielectric layer 530r is in a range of approximately 90% to 100%. In some embodiments, the uniformity of the recessed first dielectric layer 530r is in a range of approximately 10% to 25%. As such, good topography of the first sub-layer constituted by the first conductive vias CV1, the first seal ring element SE1, and the recessed first dielectric layer 530r may be provided, thereby the subsequently formed elements may be accurately formed on the designated location and may be formed with the designated dimension, thereby enhancing the reliability of the InFO package 10.

In some embodiments, from the cross-sectional view, the angle $\Theta_1$ of each top corner of each first conductive via CV1 is approximately 90 degrees. However, the disclosure is not limited thereto. In some alternative embodiments, from the cross-sectional view, each top corner of each first conductive via CV1 is rounded due to the plasma process in the range of approximately 0.5 to 0.7 Π rad (larger than 90 degrees to 120 degrees), as shown in the schematic cross-sectional view on the left side of FIG. 1J. In some embodiments, from the cross-sectional view, the angle $\Theta_2$ of each top corner of the first seal ring element SE1 is approximately 90 degrees. However, the disclosure is not limited thereto. In some alternative embodiments, from the cross-sectional view, each top corner of the first seal ring element SE1 is rounded due to the plasma process in the range of approximately 0.5 to 0.7 Π rad (larger than 90 degrees to 120 degrees), as shown in the schematic cross-sectional view on the left side of FIG. 1J.

Referring to FIG. 1K, a seed material layer 512 is formed over the first sub-layer. The seed material layer 512 may be similar to the seed material layer 510, so the detailed descriptions thereof are omitted herein. In some embodiments, the seed material layer 512 is blanketly formed to be in direct contact with the recessed first dielectric layer 530r, the first conductive vias CV1, and the first seal ring element SE1. The seed material layer 512 is formed to locate in both of the active region AR and the border region BR.

A photoresist layer PR2 is formed over the seed material layer 512. In some embodiments, the photoresist layer PR2 may be formed through spin-coating or other suitable formation methods. As illustrated in FIG. 1K, the photoresist layer PR2 has a plurality of openings OP2 exposing at least a portion of the seed material layer 512 in the active region AR and the border region BR. In some embodiments, the openings OP2 in the active region AR correspond to the locations of the first conductive vias CV1. For example, a vertical projection of the openings OP2 in the active region AR along the direction perpendicular to the active surface 300c of the dies 300 overlaps with the first conductive vias CV1. On the other hand, the openings OP2 in the border region BR correspond to the location of the first seal ring element SEE For example, a vertical projection of the openings OP2 in the border region BR along the direction perpendicular to the active surface 300c of the dies 300 overlaps with the first seal ring element SE1.

Referring to FIG. 1K and FIG. 1L, a plurality of conductive patterns 540a, a plurality of conductive patterns 540b are formed on the seed material layer 512. In some embodiments, the openings OP2 of the photoresist layer PR2 in the active region AR and the border region BR are filled up with a conductive material (not shown). Thereafter, the photoresist layer PR2 is removed to obtain the conductive patterns 540a, 540b. Upon removal of the photoresist layer PR2, portions of the seed material layer 512, which are not covered by the conductive patterns 540a, 540b, are exposed. In some embodiments, the conductive material may be formed by a plating process. The plating process is, for example, electro-plating process, electroless-plating process, immersion plating process, or the like. In some embodiments, the conductive material includes, for example, copper, copper alloys, or the like. The photoresist pattern layer PR2 may be removed/stripped through, for example, etching, aching, or other suitable removal processes. In some embodiments, the conductive patterns 540a are located in the active region AR and the conductive patterns 540b are located in the border region BR.

Referring to FIG. 1M, a photoresist layer PR3 is formed over the seed material layer 512 and the conductive patterns 540a, 540b. In some embodiments, the photoresist layer PR3 may be formed through spin-coating or other suitable formation methods. As illustrated in FIG. 1M, the photoresist layer PR3 has a plurality of openings OP3 exposing at least a portion of the conductive patterns 540a, 540b. In some embodiments, the size of the openings OP3 in the border region BR may be same as the size of the openings OP3 in the active region AR. However, the disclosure is not limited thereto. In some alternative embodiments, the size of the openings OP3 in the border region BR may be different from the size of the openings OP3 in the active region AR. For example, the size of the openings OP3 in the border region BR may be larger the size of the openings OP3 in the active region AR.

In some embodiments, the openings OP3 in the active region AR correspond to the locations of the conductive patterns 540a. For example, a vertical projection of the openings OP3 in the active region AR along the direction perpendicular to the active surface 300c of the dies 300 overlaps with the conductive patterns 540a. On the other hand, the openings OP3 in the active region AR do not correspond to the locations of the first conductive vias CV1. For example, a vertical projection of the openings OP3 in the active region AR along the direction perpendicular to the active surface 300c of the dies 300 does not overlap with the first conductive vias CV1. However, the disclosure is not limited thereto. In some alternative embodiments, the openings OP3 in the active region AR correspond to the locations of the first conductive vias CV1. For example, a vertical projection of the openings OP3 in the active region AR along the direction perpendicular to the active surface 300c of the dies 300 overlaps with the first conductive vias CV1.

In some embodiments, the openings OP3 in the border region BR correspond to the locations of the conductive patterns 540b. For example, a vertical projection of the openings OP3 in the border region BR along the direction perpendicular to the active surface 300c of the dies 300 overlaps with the conductive patterns 540b. On the other hand, the openings OP3 in the border region BR do not correspond to the location of the first seal ring element SE1. For example, a vertical projection of the openings OP3 in the border region BR along the direction perpendicular to the active surface 300c of the dies 300 does not overlap with the first seal ring element SE1. However, the disclosure is not limited thereto. In some alternative embodiments, the openings OP3 in the border region BR correspond to the location of the first seal ring element SE1. For example, a vertical projection of the openings OP3 in the border region BR along the direction perpendicular to the active surface 300c of the dies 300 overlaps with the first seal ring element SE1.

Referring to FIG. 1M and FIG. 1N, a plurality of conductive patterns 522a and a plurality of conductive patterns 522b are respectively formed on the conductive patterns 540a and the conductive patterns 540b. In some embodiments, the openings OP3 of the photoresist layer PR3 in the active region AR and the border region BR are filled up with a conductive material (not shown). Thereafter, the photoresist layer PR3 is removed to obtain the conductive patterns 522a, 522b. In some embodiments, the conductive material may be formed by a plating process. The plating process is, for example, electro-plating process, electroless-plating process, immersion plating process, or the like. In some embodiments, the conductive material includes, for example, copper, copper alloys, or the like. In some embodiments, the plating process of the conductive patterns 522a, 522b shares the same seed material layer 512 with the plating process of the conductive patterns 540a, 540b. That is, the seed material layer 512 may be utilized for plating for both of the conductive patterns 540a, 540b and the conductive patterns 522a, 522b. As a result, the conductive patterns 522a are physically in contact with the conductive patterns 540a, and the conductive patterns 522b are physically in contact with the conductive patterns 540b. In detail, the conductive patterns 522a are directly in contact with the conductive patterns 540a, and the conductive patterns 522b are directly in contact with the conductive patterns 540b. The photoresist pattern layer PR3 may be removed/stripped through, for example, etching, ashing, or other suitable removal processes. In some embodiments, the conductive patterns 522a are located in the active region AR and the conductive patterns 522b are located in the border region BR.

Referring to FIG. 1N and FIG. 1O, portions of the seed material layer 512 that are not covered by the conductive patterns 540a, 540b are removed to render seed layers 512a, 512b. The seed layer 512a is located in the active region AR and the seed layer 512b is located in the border region BR. In some embodiments, the seed layer 512a is sandwiched between the first conductive vias CV1 and the conductive patterns 540a. On the other hand, the seed layer 512b is sandwiched between the first seal ring element SE1 and the conductive patterns 540b. Moreover, the conductive patterns 540a is sandwiched between the conductive patterns 522a and the seed layer 512a, and the conductive patterns 540b is sandwiched between the conductive patterns 522b and the seed layer 512b. The exposed portions of the seed material layer 512 may be removed through an etching process. In some embodiments, the material of the conductive patterns 522a, 522b, 540a, 540b may be different from the material of the seed material layer 512, so the exposed portion of the seed material layer 512 may be removed through selective etching.

In some embodiments, the conductive patterns 540a and the seed layer 512a located in the active region AR are collectively referred to as first routing patterns RP1. In some embodiments, the conductive patterns 522a located in the active region AR may be referred to as a second conductive vias CV2. That is, in some embodiments, the second conductive vias CV2 are free of seed layer, and no seed layer exists between the conductive patterns 522a and the conductive patterns 540a. In some embodiments, the conductive patterns 540b and the seed layer 512b located in the border region BR are collectively referred to as a second seal ring element SE2. In some embodiments, the conductive patterns 522b located in the border region BR may be referred to as a third seal ring element SE3. That is, in some embodiments, the third seal ring element SE3 is free of seed layer, and no seed layer exists between the conductive patterns 522b and the conductive patterns 540b. In some embodiments, the second conductive vias CV2 are disposed on the first routing patterns RP1. In some embodiments, the first routing patterns RP1 are sandwiched between the first conductive vias CV1 and the second conductive vias CV2. In some embodiments, the third seal ring element SE3 is disposed on second seal ring element SE2. In some embodiments, the second seal ring element SE2 connects with the first seal ring element SE1. In some embodiments, the second seal ring element SE2 is sandwiched between the first seal ring element SE1 and the third seal ring element SE3.

The first routing patterns RP1 may include routing traces for signal transmission along the horizontal plane. The second conductive vias CV2 may electrically connect the first routing patterns RP1 with other subsequently formed elements. In some embodiments, the second seal ring element SE2 and the third seal ring element SE3 are electrically floating. For example, the second seal ring element SE2 and the third seal ring element SE3 are electrically insulated from the first routing patterns RP1, the second conductive vias CV2, the first conductive vias CV1, the conductive structures 200, the vias 350 of the dies 300, and the redistribution structure 100.

In some embodiments, the first routing patterns RP1 are in physical contact with the first conductive vias CV1 and the recessed first dielectric layer 530r. For example, the seed layer 512a of the first routing patterns RP1 may be directly in contact with the first conductive vias CV1 and the recessed first dielectric layer 530r. In some embodiments, the second seal ring element SE2 is in physical contact with the first seal ring element SE1 and the recessed first dielectric layer 530r. For example, the seed layer 512b of the second seal ring element SE2 may be directly in contact with the first seal ring element SE1 and the recessed first dielectric layer 530r.

As mentioned above, since the second conductive vias CV2 are formed by filling the conductive material into the openings OP3 in the active region AR, the locations of the second conductive vias CV2 correspond to the locations of the opening OP3 in the active region AR. For example, in some embodiments, a vertical projection of the second conductive vias CV2 along the direction perpendicular to the active surface 300c of the dies 300 does not overlap with the first conductive vias CV1. For another example, in some embodiments, a vertical projection of the second conductive vias CV2 along the direction perpendicular to the active surface 300c of the dies 300 overlaps with the first conductive vias CV1. Similarly, as mentioned above, since the third seal ring element SE3 is formed by filling the conductive material into the openings OP3 in the border region BR, the location of the third seal ring element SE3 correspond to the locations of the opening OP3 in the border region BR. For example, in some embodiments, a vertical projection of the third seal ring element SE3 along the direction perpendicular to the active surface 300c of the dies 300 does not overlap with the first seal ring element SE1. For another example, in some embodiments, a vertical projection of the third seal ring element SE3 along the direction perpendicular to the active surface 300c of the dies 300 overlaps with the first seal ring element SE1.

In some embodiments, each of the first routing patterns RP1 has a protrusion P1 due to the underlying first conductive vias CV1. As mentioned above, the first conductive vias CV1 protrude out of the recessed first dielectric layer 530r along the direction perpendicular to the active surface 300c of the dies 300, therefore a portion of the seed layer 512a located directly on the top surfaces $T_{CV1}$ of the first conductive vias CV1 protrudes form the rest of the seed layer 512a located directly the top surface $T_{530r}$ of the recessed first dielectric layer 530r. That is, in some embodiments, a portion of the seed layer 512a located directly on the top surfaces $T_{CV1}$ of the first conductive vias CV1 is higher than the rest of the seed layer 512a located directly on the top surface $T_{530r}$ of the recessed first dielectric layer 530r. Accordingly, after the conductive patterns 540a disposed on the seed layer 512a are formed, the protrusions P1 are created correspond to the locations of the first conductive vias CV1. That is, in some embodiments, a portion of each conductive pattern 540a may be slightly raised with respect to the rest portion of each conductive pattern 540a. In some embodiments, the protrusion angle $\Theta_3$ of each protrusion P1 with respect to a virtual line extending along a direction parallel to the active surface 300c of the dies 300 may be in the range of approximately 5 degrees to 20 degrees. Herein, the protrusion angle $\Theta_3$ of each protrusion P1 is defined as an included angle between the tangent line of the protruding portion of each conductive pattern 540a (the protrusion P1) initially protrudes from the rest portion of each conductive pattern 540a and the virtual line extending along a direction parallel to the active surface 300c of the dies 300. In some embodiments, the protruding portion of each conductive pattern 540a (the protrusion P1) may be raised of approximately 0.1 µm up to 0.3 µm with respect to the rest portion of each conductive pattern 540a.

In some embodiments, from the cross-sectional view, the top dimension $TD_{CV2}$ of each second conductive via CV2 is substantially equal to the bottom dimension $BD_{CV2}$ of each second conductive via CV2. However, the disclosure is not limited thereto. In some alternative embodiments, the top dimension $TD_{CV2}$ of each second conductive via CV2 is smaller than the bottom dimension $BD_{CV2}$ of each second conductive via CV2. The contour or structure of the second conductive vias CV2 may be similar to the first conductive vias CV1, so some detailed descriptions of the second conductive vias CV2 are referred to the foregoing embodiments of the first conductive vias CV1 and are omitted herein omitted herein.

The second seal ring element SE2 is part of the subsequently formed seal ring structure SR (shown in FIG. 1U). Therefore, in some embodiments, the contour or structure of the second seal ring element SE2 may be similar to the first seal ring element SE1, and some detailed descriptions of the second seal ring element SE2 are referred to the foregoing embodiments of the first seal ring element SE1 and are omitted herein omitted herein. In some embodiments, the second seal ring element SE2 has a protrusion P2 due to the underlying first seal ring element SE1. As mentioned above, the first seal ring element SE1 protrudes out of the recessed first dielectric layer 530r along the direction perpendicular to the active surface 300c of the dies 300, therefore a portion of the seed layer 512b located directly on the top surface $T_{SE1}$ of the first seal ring element SE1 protrudes form the rest of the seed layer 512b located directly on the top surface $T_{530r}$ of the recessed first dielectric layer 530r. That is, in some embodiments, a portion of the seed layer 512b located directly on the top surface $T_{SE1}$ of the first seal ring element SE1 is higher than the rest of the seed layer 512b located directly on the top surface $T_{530r}$ of the recessed first dielectric layer 530r. Accordingly, after the conductive patterns 540b disposed on the seed layer 512b are formed, the protrusion P2 is created correspond to the location of the first seal ring element SE1. That is, in some embodiments, a portion of each conductive pattern 540b may be slightly raised with respect to the rest portion of each conductive pattern 540b. In some embodiments, the protrusion angle $\Theta_4$ of the protrusion P2 with respect to a virtual line extending along a direction parallel to the active surface 300c of the dies 300 may be in the range of approximately 5 degrees to 20 degrees. Herein, the definition of the protrusion angle $\Theta_4$ of the protrusion P2 is similar to the protrusion angle $\Theta_3$ of the protrusion P1, so the definition of the protrusion angle $\Theta_4$ is referred to the foregoing definition of the protrusion angle $\Theta_3$ and is omitted herein omitted herein. In some embodiments, the protruding portion of each conductive pattern 540b (the protrusion P2) may be raised of approximately 0.1 µm up to 0.3 µm with respect to the rest portion of each conductive pattern 540b.

The third seal ring element SE3 is part of the subsequently formed seal ring structure SR (shown in FIG. 1U). Therefore, in some embodiments, the contour or structure of the third seal ring element SE3 may be similar to the first seal ring element SE1, and some detailed descriptions of the third seal ring element SE3 are referred to the foregoing embodiments of the first seal ring element SE1 and are omitted herein omitted herein.

Referring to FIG. 1P, a second dielectric material layer 532a is formed over the recessed first dielectric layer 530r to encapsulate the first routing patterns RP1, the second conductive vias CV2, the second seal ring element SE2 and the third seal ring element SE3. In other words, the first routing patterns RP1, the second conductive vias CV2, the second seal ring element SE2 and the third seal ring element SE3 are not revealed and are well protected by the second dielectric material layer 532a. The second dielectric material layer 532a may be similar to the first dielectric material layer 530a, so the detailed descriptions thereof are omitted herein.

Referring to FIG. 1P and FIG. 1Q, the second dielectric material layer 532a is partially removed by performing a planarization process to form a second dielectric layer 532 exposing the top surfaces $T_{CV2}$ of the second conductive vias CV2 and the top surface $T_{SE3}$ of the third seal ring element SE3. For example, the second dielectric material layer 532a may be planarized/grinded until the top surfaces $T_{CV2}$ of the second conductive vias CV2 and the top surface $T_{SE3}$ of the third seal ring element SE3 are exposed. In some embodiments, the second dielectric material layer 532a is planarized/grinded by a chemical mechanical polishing (CMP) process. As illustrated in FIG. 1Q, the second dielectric layer 532 is stacked over the recessed first dielectric layer 530r. In some embodiments, the DOP for the second dielectric layer 532 is in a range of approximately 90% to 100%. In some embodiments, the uniformity of the second dielectric layer 532 is in a range of approximately 10% to 25%.

In some embodiments, the second dielectric material layer 532a is planarized/grinded such that the top surface $T_{532}$ of the second dielectric layer 532 is substantially coplanar with the top surfaces $T_{CV2}$ of the second conductive vias CV2 and the top surface $T_{SE3}$ of the third seal ring element SE3. In some alternative embodiments, due to grinding selectivity between different materials, a height difference along the direction perpendicular to the active surface 300c of the dies 300 may be seen between the top surface $T_{532}$ of the second dielectric layer 532 and the top surfaces $T_{CV2}$ of the second conductive vias CV2 and between the top surface $T_{532}$ of the second dielectric layer 532 and the top surface $T_{SE3}$ of the third seal ring element SE3. However, since the second dielectric layer 532 is formed by the planarization process, the height difference is negligible.

The second dielectric layer 532 wraps around the first routing patterns RP1, the second conductive vias CV2, the second seal ring element SE2 and the third seal ring element SE3. In detail, the first routing patterns RP1, the second conductive vias CV2, the second seal ring element SE2 and the third seal ring element SE3 are embedded in the second dielectric layer 532.

Referring to FIG. 1R, the second dielectric layer 532 is recessed by performing a plasma process to form the recessed second dielectric layer 532r. As described above, the top surface $T_{532}$ of the second dielectric layer 532 is substantially coplanar with the top surfaces $T_{CV2}$ of the second conductive vias CV2 and the top surface $T_{SE3}$ of the third seal ring element SE3, therefore after the second dielectric layer 532 is recessed by the plasma process, the second conductive vias CV2 and the third seal ring element SE3 protrude from the top surface $T_{532r}$ of the recessed second dielectric layer 532r along the direction perpendicular to the active surface 300c of the dies 300. In other words, the second dielectric layer 532 is thinned to have the second conductive vias CV2 and the third seal ring element SE3 protruding from the top surface $T_{532r}$ of the recessed second dielectric layer 532r. In some embodiments, the recessed second dielectric layer 532r wraps around the first routing patterns RP1, the second conductive vias CV2, the second seal ring element SE2 and the third seal ring element SE3. In detail, in some embodiments, the first routing patterns RP1 and the second seal ring element SE2 are embedded in the recessed second dielectric layer 532r, while the second conductive vias CV2 and the third seal ring element SE3 are partially embedded in the recessed second dielectric layer 532r. In other words, the recessed second dielectric layer 532r partially wraps around sidewalls of the second conductive vias CV2 and the third seal ring element SE3. In some embodiments, the plasma process is, for example, an oxide plasma process.

In some embodiments, the thickness of the second dielectric layer 532 removed by the plasma process is accounted for approximately 5% to 20% thickness of the second dielectric layer 532. In other words, in some embodiments, a protruding thickness T3 of each second conductive via CV2 protruding from the top surface $T_{532r}$ of the recessed second dielectric layer 532r is accounted for approximately 5% to 20% thickness of the second dielectric layer 532, and a protruding thickness T4 of the third seal ring element SE3 protruding from the top surface $T_{532r}$ of the recessed second dielectric layer 532r is accounted for approximately 5% to 20% thickness of the second dielectric layer 532. For example, the protruding thickness T3 is between 0.1 μm and 0.3 μm. Similarly, the protruding thickness T4 is between 0.1 μm and 0.3 μm, for example.

In some embodiments, since a distance along the direction perpendicular to the active surface 300c of the dies 300 (the protruding thickness T3) is between the top surface $T_{532r}$ of the recessed second dielectric layer 532r and the top surface $T_{CV2}$ of each second conductive via CV2, the top surface $T_{532r}$ of the recessed second dielectric layer 532r is lower than the top surfaces $T_{CV2}$ of the second conductive vias CV2. Similarly, in some embodiments, since a distance along the direction perpendicular to the active surface 300c of the dies 300 (the protruding thickness T4) is between the top surface $T_{532r}$ of the recessed second dielectric layer 532r and the top surface $T_{SE3}$ of the third seal ring element SE3, the top surface $T_{532r}$ of the recessed second dielectric layer 532r is lower than the top surface $T_{SE3}$ of the third seal ring element SE3.

In some embodiments, the first routing patterns RP1, the second conductive vias CV2, the second seal ring element SE2, the third seal ring element SE3, and the recessed second dielectric layer 532r may constitute a second sub-layer of the subsequently formed redistribution structure 500 (shown in FIG. 1U). In some embodiments, the second sub-layer is formed over the first sub-layer.

In some embodiments, the DOP for the recessed second dielectric layer 532r is in a range of approximately 90% to 100%. In some embodiments, the uniformity of the recessed second dielectric layer 532r is in a range of approximately 10% to 25%. As such, good topography of the second sub-layer constituted by the first routing patterns RP1, the second conductive vias CV2, the second seal ring element SE2, the third seal ring element SE3, and the recessed second dielectric layer 532r may be provided, thereby the subsequently formed elements may be accurately formed on the designated location and may be formed with the designated dimension, thereby enhancing the reliability of the InFO package 10.

In some embodiments, from the cross-sectional view, the angle $\Theta_5$ of each top corner of each second conductive via CV2 is approximately 90 degrees. However, the disclosure is not limited thereto. In some alternative embodiments, from the cross-sectional view, each top corner of each second conductive via CV2 is similar to each top corner of each first conductive via CV1 to be rounded due to the plasma process in the range of approximately 0.5 to 0.7 Π rad (larger than 90 degrees to 120 degrees), referring to the schematic cross-sectional view on the left side of FIG. 1J. In some embodiments, from the cross-sectional view, the angle o6 of each top corner of the third seal ring element SE3 is approximately 90 degrees. However, the disclosure is not limited thereto. In some alternative embodiments, from the cross-sectional view, each top corner of the third seal ring element SE3 is similar to each top corner of each first seal ring element SE1 to be rounded due to the plasma process in the range of approximately 0.5 to 0.7 Π rad (larger than 90 degrees to 120 degrees), referring to the schematic cross-sectional view on the left side of FIG. 1J.

Referring to FIG. 1S, a plurality of second routing patterns RP2 and a fourth seal ring element SE4 are respectively formed on the second conductive vias CV2 and the third seal ring element SE3. In some embodiments, the second routing patterns RP2 are constituted by a seed layer 514a and a plurality of conductive patterns 542a. In some embodiments, the fourth seal ring element SE4 is constituted by a seed layer 514b and a plurality of conductive patterns 542b. In some embodiments, the second routing patterns RP2 may be formed by similar methods as that of the first routing patterns RP1 or the first conductive vias CV1. In some embodiments, the fourth seal ring element SE4 may be formed by similar methods as that of the second seal ring element SE2 or the first seal ring element SE1. Therefore, some of detailed descriptions of the second routing patterns RP2 and the fourth seal ring element SE4 are omitted herein.

In some embodiments, the second routing patterns RP2 are located in the active region AR and the fourth seal ring element SE4 is located in the border region BR. In some embodiments, the seed layer 514a is sandwiched between the second conductive vias CV2 and the conductive patterns 542a. On the other hand, the seed layer 514b is sandwiched between the third seal ring element SE3 and the conductive patterns 542b.

The second routing patterns RP2 may include routing traces for signal transmission along the horizontal plane. In some embodiments, the fourth seal ring element SE4 is electrically floating. For example, the fourth seal ring element SE4 is electrically insulated from the second routing patterns RP2, the first routing patterns RP1, the second conductive vias CV2, the first conductive vias CV1, the conductive structures 200, the vias 350 of the dies 300, and the redistribution structure 100.

In some embodiments, the second routing patterns RP2 are in physical contact with the second conductive vias CV2 and the recessed first dielectric layer 530r. For example, the seed layer 514a of the second routing patterns RP2 may be directly in contact with the second conductive vias CV2 and the recessed first dielectric layer 530r. In some embodiments, the fourth seal ring element SE4 is in physical contact with the third seal ring element SE3 and the recessed first dielectric layer 530r. For example, the seed layer 514b of the fourth seal ring element SE4 may be directly in contact with the third seal ring element SE3 and the recessed first dielectric layer 530r.

In some embodiments, each of the second routing patterns RP2 has a protrusion P3 due to the underlying second conductive vias CV2. As mentioned above, the second conductive vias CV2 protrude out of the recessed second dielectric layer 532r along the direction perpendicular to the active surface 300c of the dies 300, therefore a portion of the seed layer 514a located directly on the top surfaces $T_{CV2}$ of the second conductive vias CV2 protrudes form the rest of the seed layer 514a located directly on the top surface $T_{532r}$ of the recessed second dielectric layer 532r. That is, in some embodiments, a portion of the seed layer 514a located directly on the top surfaces $T_{CV2}$ of the second conductive vias CV2 is higher than the rest of the seed layer 514a located directly on the top surface $T_{532r}$ of the recessed second dielectric layer 532r. Accordingly, after the conductive patterns 542a disposed on the seed layer 514a are formed, the protrusions P3 are created correspond to the locations of the second conductive vias CV2. That is, in some embodiments, a portion of each conductive pattern 542a may be slightly raised with respect to the rest portion of each conductive pattern 542a. In some embodiments, the protrusion angle $\Theta_7$ of each protrusion P3 with respect to a virtual line extending along a direction parallel to the active surface 300c of the dies 300 may be in the range of approximately 5 degrees to 20 degrees. Herein, the definition of the protrusion angle $\Theta_7$ of the protrusion P3 is similar to the protrusion angle $\Theta_3$ of the protrusion P1, so the definition of the protrusion angle $\Theta_7$ is referred to the foregoing definition of the protrusion angle $\Theta_3$ and is omitted herein omitted herein. In some embodiments, the protruding portion of each conductive pattern 542a (the protrusion P3) may be raised of approximately 0.1 µm up to 0.3 µm with respect to the rest portion of each conductive pattern 542a.

The fourth seal ring element SE4 is part of the subsequently formed seal ring structure SR (shown in FIG. 1U). Therefore, in some embodiments, the contour or structure of the fourth seal ring element SE4 may be similar to the first seal ring element SE1, and some detailed descriptions of the fourth seal ring element SE4 are referred to the foregoing embodiments of the first seal ring element SE1 and are omitted herein omitted herein.

In some embodiments, a protrusion P4 is in the fourth seal ring element SE4 due to the underlying third seal ring element SE3. As mentioned above, the third seal ring element SE3 protrudes out of the recessed second dielectric layer 532r along the direction perpendicular to the active surface 300c of the dies 300, therefore a portion of the seed layer 514b located directly on the top surface $T_{SE3}$ of the third seal ring element SE3 protrudes form the rest of the seed layer 514b disposed on the top surface $T_{532r}$ of the recessed second dielectric layer 532r. That is, in some embodiments, a portion of the seed layer 514b located directly on top surface $T_{SE3}$ of the third seal ring element SE3 is higher than the rest of the seed layer 514b located directly on the top surface $T_{532r}$ of the recessed second dielectric layer 532r. Accordingly, after the conductive patterns 542b disposed on the seed layer 514b are formed, the protrusion P4 is created correspond to the location of the third seal ring element SE3. That is, in some embodiments, a portion of each conductive pattern 542b may be slightly raised with respect to the rest portion of each conductive pattern 542b. In some embodiments, the protrusion angle $\Theta_8$ of the protrusion P4 with respect to a virtual line extending along a direction parallel to the active surface 300c of the dies 300 may be in the range of approximately 5 degrees to 20 degrees. Herein, the definition of the protrusion angle $\Theta_8$ of the protrusion P4 is similar to the protrusion angle $\Theta_3$ of the protrusion P1, so the definition of the protrusion angle $\Theta_8$ is referred to the foregoing definition of the protrusion angle $\Theta_3$ and is omitted herein omitted herein. In some embodiments, the protruding portion of each conductive pattern 542b (the protrusion P4) may be raised of approximately 0.1 µm up to 0.3 µm with respect to the rest portion of each conductive pattern 542b.

Referring to FIG. 1T, a third dielectric layer 534 is formed over the second sub-layer in the active region AR and the border region BR. For example, the third dielectric layer 534 is stacked on the recessed second dielectric layer 532r. The third dielectric layer 534 has a plurality of openings OP4 exposing at least a portion of the second routing patterns RP2 and at least a portion of the fourth seal ring element SE4. The third dielectric layer 534 may be formed by the following steps. First, a dielectric material layer (not shown) is formed over the recessed second dielectric layer 532r to cover the second routing patterns RP2 and the fourth seal ring element SE4. In some embodiments, the material of the dielectric material layer includes polyimide, epoxy resin, acrylic resin, phenol resin, BCB, PBO, or any other suitable polymer-based dielectric material. The dielectric material layer may be formed by suitable fabrication techniques, such as spin-on coating, chemical vapor deposition (CVD), plasma-enhanced chemical vapor deposition (PECVD), or the like. Thereafter, the dielectric material layer may be patterned through a photolithography process and an etching process to render the third dielectric layer 534 having the openings OP4.

Referring to FIG. 1U, a plurality of third routing patterns RP3 and a fifth seal ring element SE5 are respectively formed on the second routing patterns RP2 and the fourth seal ring element SE4 to obtain the redistribution structure 500. In some embodiments, the third routing patterns RP3 are constituted by a seed layer 516a and a plurality of conductive patterns 544a. In some embodiments, the fifth seal ring element SE5 is constituted by a seed layer 516b and a plurality of conductive patterns 544b. In some embodiments, the third routing patterns RP3 are located in the active region AR and the fifth seal ring element SE5 is located in the border region BR. The third routing patterns RP3 and the fifth seal ring element SE5 may be formed by the following steps. First, a seed material layer (not shown) extending into the openings OP4 of the third dielectric layer 534 may be formed over the third dielectric layer 534. The seed material layer may be formed through, for example, a sputtering process, a physical vapor deposition (PVD) process, or the like. In some embodiments, the seed material layer may include, for example, copper, titanium-copper alloy, or other suitable choice of materials. A mask pattern (not shown) may then be formed on the seed material layer. The mask pattern has openings exposing the seed material layer located inside of the openings OP4 of the third dielectric layer 534. In some embodiments, the openings of the mask pattern also expose portions of the seed material layer in proximity of the openings OP4. Thereafter, a conductive material (not shown) is filled into the openings of the mask pattern and the openings OP4 of the third dielectric layer 534 by electroplating process or deposition process. Then, the mask pattern and the seed material layer underneath the mask pattern are removed to obtain the third routing patterns RP3 and the fifth seal ring element SE5.

In some embodiments, the second routing patterns RP2, the third routing patterns RP3, the fourth seal ring element SE4, the fifth seal ring element SE5, and the third dielectric layer 534 may be considered as a third sub-layer of the redistribution structure 500. In some embodiments, the third routing patterns RP3 may include a plurality of pads. In some embodiments, the above-mentioned pads include a plurality of under-ball metallurgy (UBM) patterns for ball mount.

In some embodiments, the fifth seal ring element SE5, the fourth seal ring element SE4, the third seal ring element SE3, the second seal ring element SE2 and the first seal ring element SE1 located in the border region BR are collectively referred to as the seal ring structure SR. In some embodiments, the contour of the fifth seal ring element SE5 may be a single loop pattern, referring to FIG. 2. From the top plan view of the InFO package 10, the shape of the fifth seal ring element SE5 may be an octagon. However, the disclosure is not limited thereto. In some alternative embodiments, the shape of the fifth seal ring element SE5 may be a circle, any other suitable polygon, or any other suitable shape from a top plan view. In addition, in some alternative embodiments, the fifth seal ring element SE5 is not a closed loop, but may have openings therein. In some embodiments, the fifth seal ring element SE5 surrounds the active region AR.

As illustrated in FIG. 1U, a redistribution structure 500 includes the recessed first dielectric layer 530r, the recessed second dielectric layer 532r, the third dielectric layer 534, the first conductive vias CV1, the second conductive vias CV2, the first routing patterns RP1, the second routing patterns RP2, the third routing patterns RP3, and the seal ring structure SR including the fifth seal ring element SE5, the fourth seal ring element SE4, the third seal ring element SE3, the second seal ring element SE2 and the first seal ring element SE1. The first conductive vias CV1 and the first seal ring element SE1 are partially embedded in the recessed first dielectric layer 530r. The first routing patterns RP1 and the second seal ring element SE2 are embedded in the recessed second dielectric layer 532r, while the second conductive vias CV2 and the third seal ring element SE3 are partially embedded in the recessed second dielectric layer 532r. The second routing patterns RP2 and the fourth seal ring element SE4 are embedded in the third dielectric layer 534 while the third routing patterns RP3 and the fifth seal ring element SE5 are partially embedded in the third dielectric layer 534. The first conductive vias CV1 are in physical contact with the vias 350 of the dies 300 and the first routing patterns RP1. That is, the first conductive vias CV1 electrically connect the dies 300 and the first routing patterns RP1. The second conductive vias CV2 are in physical contact with the first routing patterns RP1 and the second routing patterns RP2. That is, the second conductive vias CV2 electrically interconnect the first routing patterns RP1 and the second routing patterns RP2. The second routing patterns RP2 are in physical contact with the second conductive vias CV2 and the third routing patterns RP3. That is, the second routing patterns RP2 are electrically connected to the second conductive vias CV2 and the third routing patterns RP3.

In some embodiments, the redistribution structure 500 is referred to as a front-side redistribution structure. It should be noted that although the redistribution structure 500 is illustrated to have three sub-layers in FIG. 1U, the disclosure is not limited thereto. In some alternative embodiments, the redistribution structure 500 may be constituted by more or less layers of sub-layers depending on the circuit design.

Referring to FIG. 1V, after the redistribution structure 500 is formed, a plurality of conductive terminals 600 are placed on the third routing patterns RP3 (the UBM patterns) of the redistribution structure 500. In some embodiments, the conductive terminals 600 are electrically connected to the redistribution structure 500. In some embodiments, the conductive terminals 600 include solder balls. In some embodiments, the conductive terminals 600 may be placed on the UBM patterns through a ball placement process.

Referring to FIG. 1V and FIG. 1W, after the conductive terminals 600 are formed on the redistribution structure 500, the redistribution structure 100 is separated from the de-bonding layer DB and the carrier 100. In some embodiments, the de-bonding layer DB (e.g., the LTHC release layer) may be irradiated by an UV laser such that the carrier C and the de-bonding layer DB may be peeled off. Nevertheless, the de-bonding process is not limited thereto. Other suitable de-carrier methods may be used in some alternative embodiments.

Referring to FIG. 1X, after removing the de-bonding layer DB and the carrier C, a plurality of openings OP5 is formed in the dielectric layer 104 to partially expose the redistribution conductive layer 102. In some embodiments, when multiple redistribution conductive layers 102 are present, the openings OP5 expose the bottommost redistribution conductive layer 102. In some embodiments, the openings OP5 are formed by a laser drilling process, a mechanical drilling process, a photolithography process, or other suitable processes. Thereafter, a plurality of conductive terminals 602 is formed over the redistribution structure 100. In some embodiments, at least part of the conductive terminals 602 extends into the openings OP5 to be in contact with the redistribution conductive layer 102, thereby rendering electrical connection with the redistribution structure 100. In some embodiments, the conductive terminals 602 are attached to the redistribution conductive layer 102 through a solder flux (not shown). In some embodiments, the conductive terminals 602 are, for example, solder balls. In some embodiments, the conductive terminals 602 may be disposed on the redistribution conductive layer 102 by a ball placement process and/or a reflow process.

Referring to FIG. 1X and FIG. 1Y, the structure illustrated in FIG. 1X is diced or singulated to form a plurality of InFO packages 10. In some embodiments, the dicing process or the singulation process typically involves dicing with a rotating blade or a laser beam. In other words, the dicing or singulation process is, for example, a laser cutting process, a mechanical cutting process, or other suitable processes.

Figure 3:
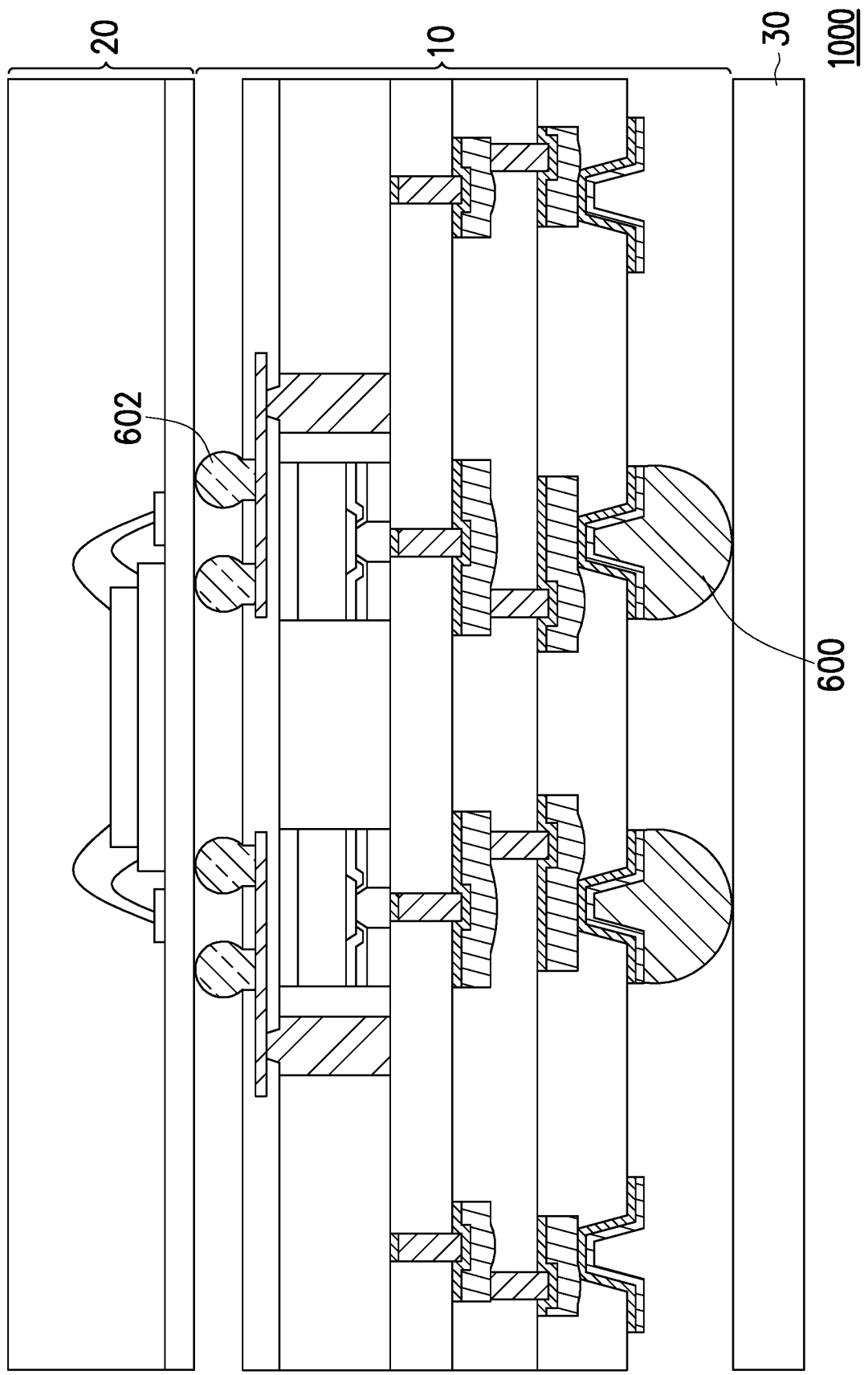
FIG. 3 is a schematic cross-sectional view illustrating an electronic device including the InFO package in FIG. 1Y.

FIG. 3 is a schematic cross-sectional view illustrating an electronic device 1000 including the InFO package 10 in FIG. 1Y. Referring to FIG. 3, another package 20 is provided. The package 20 is, for example, a memory device or other suitable semiconductor devices. The package 20 is stacked over and is electrically connected to the InFO package 10 in FIG. 1Y through the conductive terminals 602 such that a package-on-package (POP) structure is fabricated. Referring to FIG. 3 again, the InFO package 10 having the package 20 stacked thereon may be further disposed on a printed circuit board 30 to form the electronic device 1000. The InFO package 10 may be electrically connected to the printed circuit board 30 through the conductive terminals 600. In some embodiments, an underfill (not shown) is provided between the package 20 and the InFO package 10, and an underfill (not shown) is provided between the InFO package 10 and the printed circuit board 30 to increase the physical resistance of the electronic device 1000, and protect the connection between the InFO package 10 and the package 20 and the connection between the InFO package 10 and the printed circuit board 30.

In the embodiments of FIG. 1A to FIG. 1Y, after the planarization process is performed to the first dielectric material layer 530a to form the first dielectric layer 530, the plasma process is performed to the first dielectric layer 530 to form the recessed first dielectric layer 530r, and after the planarization process is performed to the first dielectric material layer 532a to form the first dielectric layer 532, the plasma process is performed to the first dielectric layer 532 to form the recessed first dielectric layer 532r. However, the disclosure is not limited thereto. In some alternative embodiments, the first dielectric layer 530 and the first dielectric layer 532 respectively are not recessed by a plasma process. The details will be described below with reference to FIG. 4.

Figure 4:
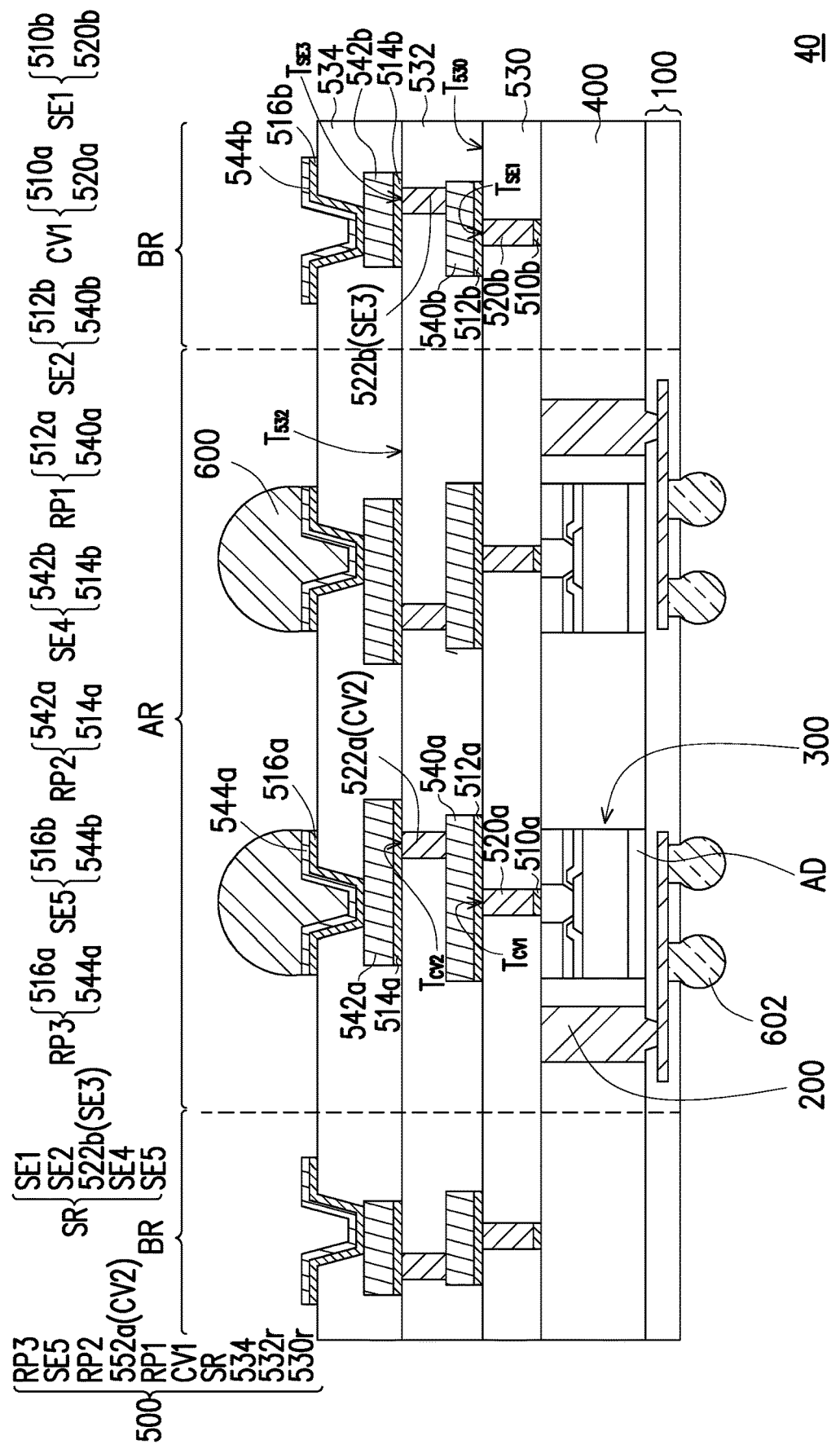
FIG. 4 is a schematic cross-sectional view illustrating an InFO package in accordance with some alternative embodiments of the disclosure.

FIG. 4 is a schematic cross-sectional view illustrating an InFO package 40 in accordance with some alternative embodiments of the disclosure. Referring to FIG. 4 and FIG. 1Y, the InFO package 40 is similar to the InFO package 10 illustrated in FIG. 1Y, except the difference therebetween lies: in the InFO package 40, the first routing patterns RP1 and the second seal ring element SE2 are formed on the first dielectric layer 530, and the second routing patterns RP2 and the fourth seal ring element SE4 are formed on the second dielectric layer 532; while in the InFO package 10, the first routing patterns RP1 and the second seal ring element SE2 are formed on the recessed first dielectric layer 530r, and the second routing patterns RP2 and the fourth seal ring element SE4 are formed on the recessed second dielectric layer 532r. That is, the manufacturing process of the InFO package 40 is similar to the manufacturing process of the InFO package 10, except the steps of performing plasma process to the first dielectric layer 530 and the first dielectric layer 532 are omitted. As such, the detailed descriptions of the manufacturing process of the InFO package 40 and some detailed descriptions of the structure of the InFO package 40 are referred to the foregoing embodiments and will not be repeated hereinafter.

Referring to FIG. 4, in some embodiments, the first conductive vias CV1, the first seal ring element SE1, and the first dielectric layer 530 may constitute a first sub-layer of the redistribution structure 500. As illustrated in FIG. 4, the first sub-layer is formed over the encapsulant 400, the dies 300, and the conductive structures 200. In some embodiments, since the top surface $T_{SE1}$ of the first seal ring element SE1 is substantially coplanar with the top surface $T_{530}$ of the first dielectric layer 530 adjacent thereto and the top surfaces $T_{CV1}$ of the first conductive vias CV1 are substantially coplanar with the top surface $T_{530}$ of the first dielectric layer 530 adjacent thereto, good and uniform topography of the first sub-layer constituted by the first conductive vias CV1, the first seal ring element SE1, and the first dielectric layer 530 may be provided. As such, the subsequently formed elements may be accurately formed on the designated location and may be formed with the designated dimension, thereby enhancing the reliability of the InFO package 40.

In some embodiments, the first routing patterns RP1, the second conductive vias CV2, the second seal ring element SE2, the third seal ring element SE3, and the second dielectric layer 532 may constitute a second sub-layer of the redistribution structure 500. In some embodiments, the second sub-layer is formed over the first sub-layer. In some embodiments, since the top surface $T_{SE3}$ of the third seal ring element SE3 is substantially coplanar with the top surface $T_{532}$ of the second dielectric layer 532 adjacent thereto and the top surfaces $T_{CV2}$ of the second conductive vias CV2 are substantially coplanar with the top surface $T_{532}$ of the second dielectric layer 532 adjacent thereto, good and uniform topography of the second sub-layer constituted by the first routing patterns RP1, the second conductive vias CV2, the second seal ring element SE2, the third seal ring element SE3, and the second dielectric layer 532 may be provided. As such, the subsequently formed elements may be accurately formed on the designated location and may be formed with the designated dimension, thereby enhancing the reliability of the InFO package 40.

In the embodiments of FIG. 1A to FIG. 1Y, after the planarization process for forming the first dielectric layer 530 is performed, the plasma process for recessing the first dielectric layer 530 is performed, and after the planarization process for forming the first dielectric layer 532 is performed, the plasma process for recessing the first dielectric layer 532 is performed. However, the disclosure is not limited thereto. In some alternative embodiments, the recessing treatment is not preformed to the first dielectric layer 530 and the first dielectric layer 532, but to the other elements. The details will be described below with reference to FIG. 5A to FIG. 5F.

FIG. 5A to FIG. 5F are schematic cross-sectional views illustrating various process steps for a manufacturing process of an InFO package 50 in accordance with some alternative embodiments of the disclosure. The difference between the manufacturing process of FIG. 1A to FIG. 1Y and the manufacturing process of FIG. 5A to FIG. 5F lies: in the manufacturing process of FIG. 5A to FIG. 5F, the recessing treatment is preformed to the first dielectric layer 530 and the first dielectric layer 532; while in the manufacturing process of FIG. 5A to FIG. 5F, the recessing treatment is preformed to the first conductive vias CV1, the first seal ring element SE1, the second conductive vias CV2 and, the third seal ring element SE3. As such, the difference is illustrated in details below, and the similarity is not iterated herein.

Figure 5A:
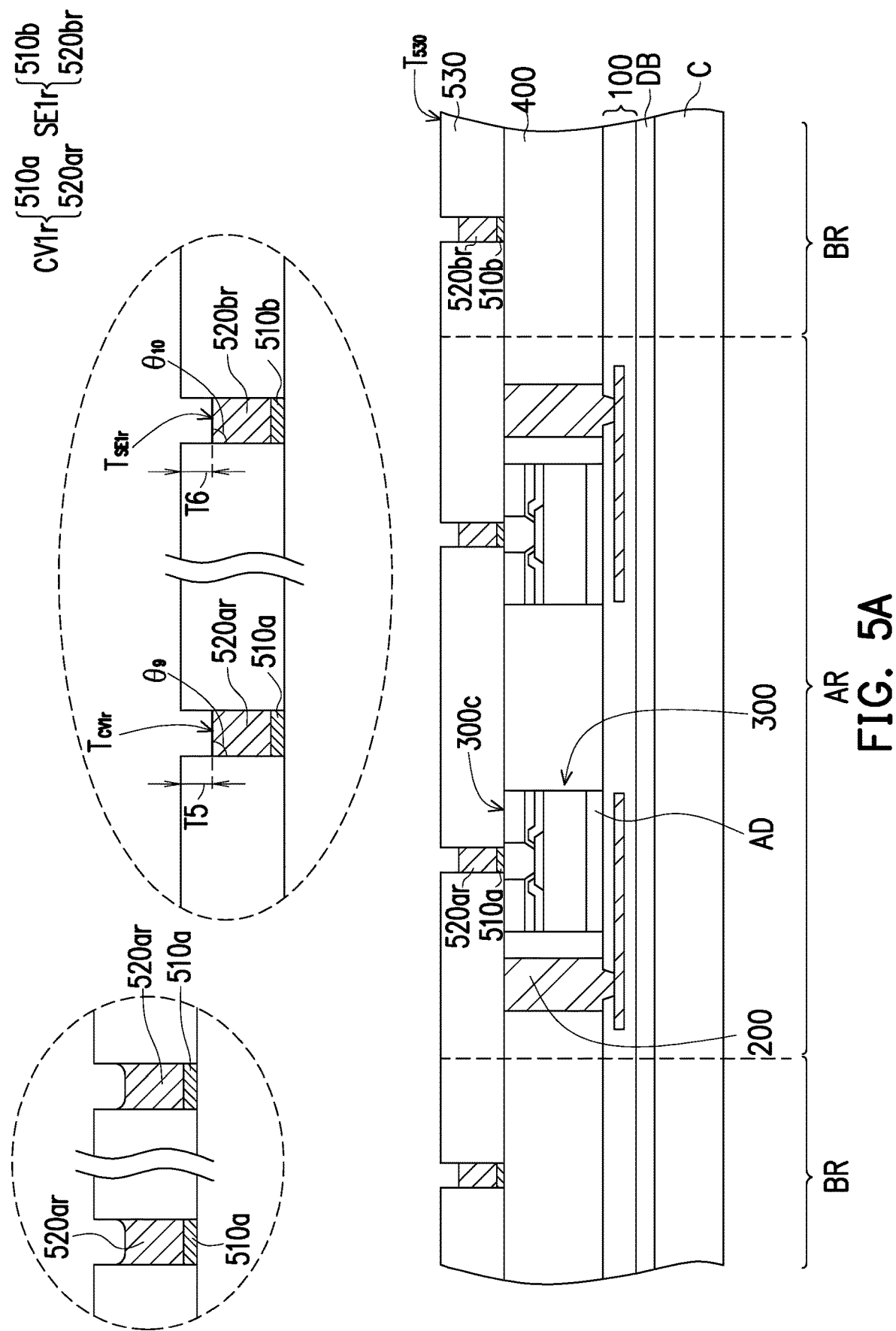

Referring to FIG. 5A, a structure of FIG. 1I is provided, and the conductive patterns 520a of the first conductive vias CV1 and the conductive patterns 520b of the first seal ring element SE1 are recessed by performing a cleaning process to form the recessed first conductive vias CV1r and the recessed first seal ring element SE1r. In other word, the recessed first conductive vias CV are constituted by the seed layer 510a and the recessed conductive patterns 520a, and the recessed first seal ring element SE1r is constituted by the seed layer 510b and the recessed conductive patterns 520b. In some embodiments, the cleaning process is, for example, a wet acid cleaning process. In some embodiments, in the cleaning process, a solution containing oxalic acid, citric acid, or succinic acid is used.

As described above, the first dielectric layer 530, the first conductive vias CV1, and the first seal ring element SE1 may have substantially the same thickness, therefore after the first conductive vias CV1 and the first seal ring element SE1 are recessed by the cleaning process, the recessed first conductive vias CV1r and the recessed first seal ring element SE1r are recessed from the top surface $T_{530}$ of the first dielectric layer 530. In other words, the first conductive vias CV1 and the first seal ring element SE1 are selectively thinned, so that the thickness of the first dielectric layer 530 is larger than the thickness of the recessed first conductive vias CV1r and the thickness of the recessed first seal ring element SE1r to have the first dielectric layer 530 protruding over the recessed first conductive vias CV1r and the recessed first seal ring element SE1r. In some embodiments, the first dielectric layer 530 wraps around the recessed first conductive vias CV and the recessed first seal ring element SE1r. In detail, in some embodiments, the recessed first conductive vias CV and the recessed first seal ring element SE1r are embedded in the first dielectric layer 530.

In some embodiments, the thickness of the conductive patterns 520a and the conductive patterns 520b removed by the cleaning process is accounted for approximately 2.5% to 10% thickness of the conductive patterns 520a and the conductive patterns 520b. In other words, in some embodiments, a thickness difference T5 in the thickness direction between the thickness of the first dielectric layer 530 and the thickness of each recessed first conductive vias CV1r is accounted for approximately 2.5% to 10% thickness of the conductive patterns 520a, and a thickness difference T6 between the thickness of the first dielectric layer 530 and the thickness of the recessed first seal ring element SE1r is accounted for approximately 2.5% to 10% thickness of the conductive patterns 520b. For example, the thickness difference T5 is between 0.1 μm and 0.3 μm. Similarly, the thickness difference T6 is between 0.1 μm and 0.3 μm, for example.

In some embodiments, since a distance along the direction perpendicular to the active surface 300c of the dies 300 (the thickness difference T5) is between the top surface $T_{530}$ of the first dielectric layer 530 and the top surface $T_{CV1r}$ of each recessed first conductive via CV1r, the top surface $T_{530}$ of the first dielectric layer 530 is non-coplanar with the top surfaces $T_{CV1r}$ of the recessed first conductive vias CV1r. In other words, in some embodiments, along the direction perpendicular to the active surface 300c of the dies 300, the top surface $T_{530}$ of the first dielectric layer 530 is located at a level height higher than the top surfaces $T_{CV1r}$ of the recessed first conductive vias CV1r. Similarly, in some embodiments, since a distance along the direction perpendicular to the active surface 300c of the dies 300 (the thickness difference T6) is between the top surface $T_{530}$ of the first dielectric layer 530r and the top surface $T_{SE1r}$ of the recessed first seal ring element SE1r, the top surface $T_{530}$ of the first dielectric layer 530r is located at a level height higher than the top surface $T_{SE1r}$ of the recessed first seal ring element SE1r.

In some embodiments, the recessed first conductive vias CV1r, the recessed first seal ring element SE1r, and the first dielectric layer 530 may constitute a first sub-layer of a subsequently formed redistribution structure 700 (shown in FIG. 5E). As illustrated in FIG. 5A, the first sub-layer is formed over the encapsulant 400, the dies 300, and the conductive structures 200.

As mentioned above, the DOP for the first dielectric layer 530 is in a range of approximately 90% to 100%, or the uniformity of the first dielectric layer 530 is in a range of approximately 10% to 25%, thereby good topography of the first sub-layer constituted by the recessed first conductive vias CV1r, the recessed first seal ring element SE1r, and the first dielectric layer 530 may be provided, thereby the subsequently formed elements may be accurately formed on the designated location and may be formed with the designated dimension, thereby enhancing the reliability of the InFO package 50.

In some embodiments, from the cross-sectional view, the angle $\Theta_9$ of each top corner of each recessed first conductive via CV1r is approximately 90 degrees. However, the disclosure is not limited thereto. In some alternative embodiments, from the cross-sectional view, each top corner of each recessed first conductive via CV1r has a curved outline due to the cleaning process in the range of approximately 0.9 to 1.1 Π rad (170 degrees to 200 degrees), as shown in the schematic cross-sectional view on the left side of FIG. 5A. In some embodiments, from the cross-sectional view, the angle $\Theta_{10}$ of each top corner of the recessed first seal ring element SE1r is approximately 90 degrees. However, the disclosure is not limited thereto. In some alternative embodiments, from the cross-sectional view, each top corner of the recessed first seal ring element SE1r has a curved outline due to the cleaning process in the range of approximately 0.9 to 1.1 Π rad (170 degrees to 200 degrees), as shown in the schematic cross-sectional view on the left side of FIG. 5A.

Figure 5B:
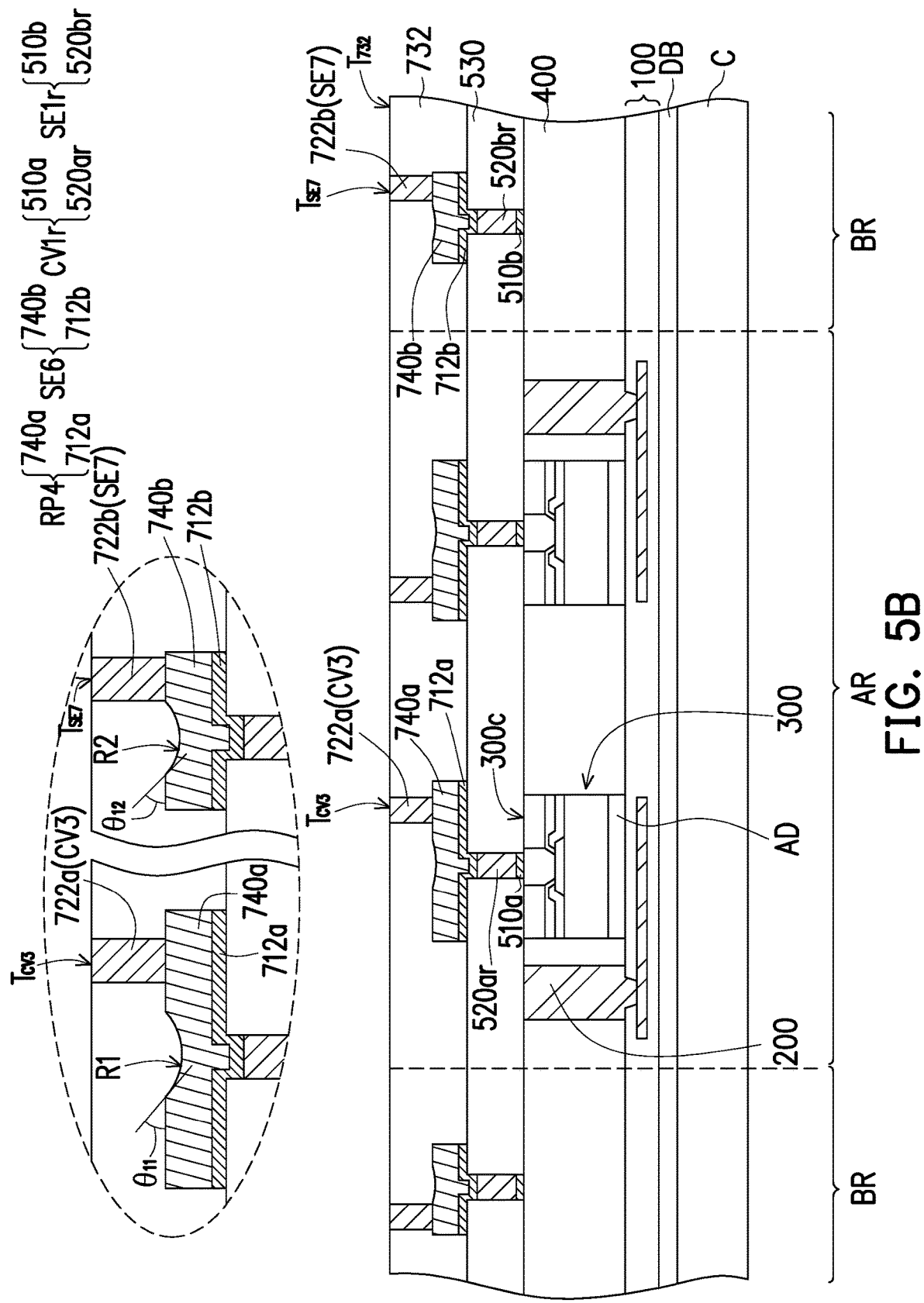

Referring to FIG. 5B, a plurality of first routing patterns RP4 and a second seal ring element SE6 are respectively formed on the recessed second conductive vias CV1r and the recessed first seal ring element SE1r, and a plurality of second conductive vias CV3 and a third seal ring element SE7 are respectively formed on the first routing patterns RP4 and the second seal ring element SE6. In some embodiments, the first routing patterns RP4 are constituted by a seed layer 712a and a plurality of conductive patterns 740a. In some embodiments, the second seal ring element SE6 is constituted by a seed layer 714b and a plurality of conductive patterns 740b. In some embodiments, the second conductive vias CV3 are constituted by a plurality of conductive patterns 722a. In some embodiments, the third seal ring element SE7 is constituted by a plurality of conductive patterns 722b. In some embodiments, the first routing patterns RP4 and the second seal ring element SE6 may be respectively formed by similar methods as that of the first routing patterns RP1 and the second seal ring element SE2 in the embodiments of FIG. 1A to FIG. 1Y. In some embodiments, the second conductive vias CV3 and the third seal ring element SE7 may be respectively formed by similar methods as that of the second conductive vias CV2 and the third seal ring element SE3 in the embodiments of FIG. 1A to FIG. 1Y. Therefore, some of detailed descriptions of the first routing patterns RP4, the second seal ring element SE6, the second conductive vias CV3 and the third seal ring element SE7 are referred to the foregoing embodiments of FIG. 1A to FIG. 1Y and are omitted herein.

In some embodiments, each of the first routing patterns RP4 has a recess R1 due to the underlying recessed first conductive vias CV1r. As mentioned above, the recessed first conductive vias CV1r are recessed with respect to the first dielectric layer 530, therefore a portion of the seed layer 712a located directly on the top surfaces $T_{CV1r}$ of the recessed first conductive vias CV is recessed with respect to the rest of the seed layer 712a located directly on the top surface $T_{530}$ of the first dielectric layer 530. That is, in some embodiments, a portion of the seed layer 712a located directly on the top surfaces $T_{CV1r}$ of the recessed first conductive vias CV1r is lower than the rest of the seed layer 712a located directly on the top surface $T_{530}$ of the first dielectric layer 530. Accordingly, after the conductive patterns 740a disposed on the seed layer 712a are formed, the recesses R1 are created correspond to the locations of the recessed first conductive vias CV1r. That is, in some embodiments, a portion of each conductive pattern 740a may be slightly lower than the rest portion of each conductive pattern 740a. In some embodiments, the recess angle $\Theta_{11}$ of each recess R1 with respect to a virtual line extending along a direction parallel to the active surface 300c of the dies 300 may be in the range of approximately 5 degrees to 15 degrees. Herein, the recess angle $\Theta_{11}$ of each recess R1 is defined as an included angle between the tangent line of the recessed portion of each conductive pattern 740a initially recessed from the rest portion of each conductive pattern 740a and the virtual line extending along a direction parallel to the active surface 300c of the dies 300. In some embodiments, the depth of the recessed portion of each conductive pattern 740a (the recess R1) may be of approximately 0.1 μm up to 0.3 μm with respect to the rest portion of each conductive pattern 740a.

In some embodiments, the second seal ring element SE6 has a recess R2 due to the underlying recessed first seal ring element SE1r. As mentioned above, the recessed first seal ring element SE1r are recessed with respect to the first dielectric layer 530, therefore a portion of the seed layer 712b located directly on the top surface $T_{SE1r}$ of the recessed first seal ring element SE1r is recessed with respect to the rest of the seed layer 712b located directly on the top surface $T_{530}$ of the first dielectric layer 530. That is, in some embodiments, a portion of the seed layer 712b located directly on the top surface $T_{SE1r}$ of the recessed first seal ring element SE1r is lower than the rest of the seed layer 712b located directly on the top surface $T_{530}$ of the first dielectric layer 530. Accordingly, after the conductive patterns 740b disposed on the seed layer 712b are formed, the recess R2 is created correspond to the location of the recessed first seal ring element SE1r. That is, in some embodiments, a portion of each conductive pattern 740b may be slightly lower than the rest portion of each conductive pattern 740b. In some embodiments, the recess angle $\Theta_{12}$ of the recess R2 with respect to a virtual line extending along a direction parallel to the active surface 300c of the dies 300 may be in the range of approximately 5 degrees to 15 degrees. Herein, the definition of the recess angle $\Theta_{12}$ of the recess R2 is similar to the recess angle $\Theta_{11}$ of the recess R1, so the definition of the recess angle $\Theta_{12}$ is referred to the foregoing definition of the recess angle $\Theta_{11}$ and is omitted herein omitted herein. In some embodiments, the depth of the recessed portion of each conductive pattern 740b (the recess R2) may be of approximately 0.1 μm up to 0.3 μm with respect to the rest portion of each conductive pattern 740b.

Referring to FIG. 5B again, a second dielectric layer 732 exposing the top surfaces $T_{CV3}$ of the second conductive vias CV3 and the top surface $T_{SE7}$ of the third seal ring element SE7 is formed. In some embodiments, the second dielectric layer 732 may be respectively formed by similar methods as that of the second dielectric layer 532 in the embodiments of FIG. 1A to FIG. 1Y. Therefore, some of detailed descriptions of the second dielectric layer 732 are referred to the foregoing embodiments of FIG. 1A to FIG. 1Y and are omitted herein.

In some embodiments, the DOP for the second dielectric layer 732 is in a range of approximately 90% to 100%. In some embodiments, the uniformity of the second dielectric layer 732 is in a range of approximately 10% to 25%. In some embodiments, the top surface $T_{732}$ of the second dielectric layer 732 is substantially coplanar with the top surfaces $T_{CV3}$ of the second conductive vias CV3 and the top surface $T_{SE7}$ of the third seal ring element SE7. In some embodiments, the second dielectric layer 732 wraps around the first routing patterns RP4, the second conductive vias CV3, the second seal ring element SE6 and the third seal ring element SE7. In detail, the first routing patterns RP4, the second conductive vias CV3, the second seal ring element SE6 and the third seal ring element SE7 are embedded in the second dielectric layer 732.

Figure 5C:
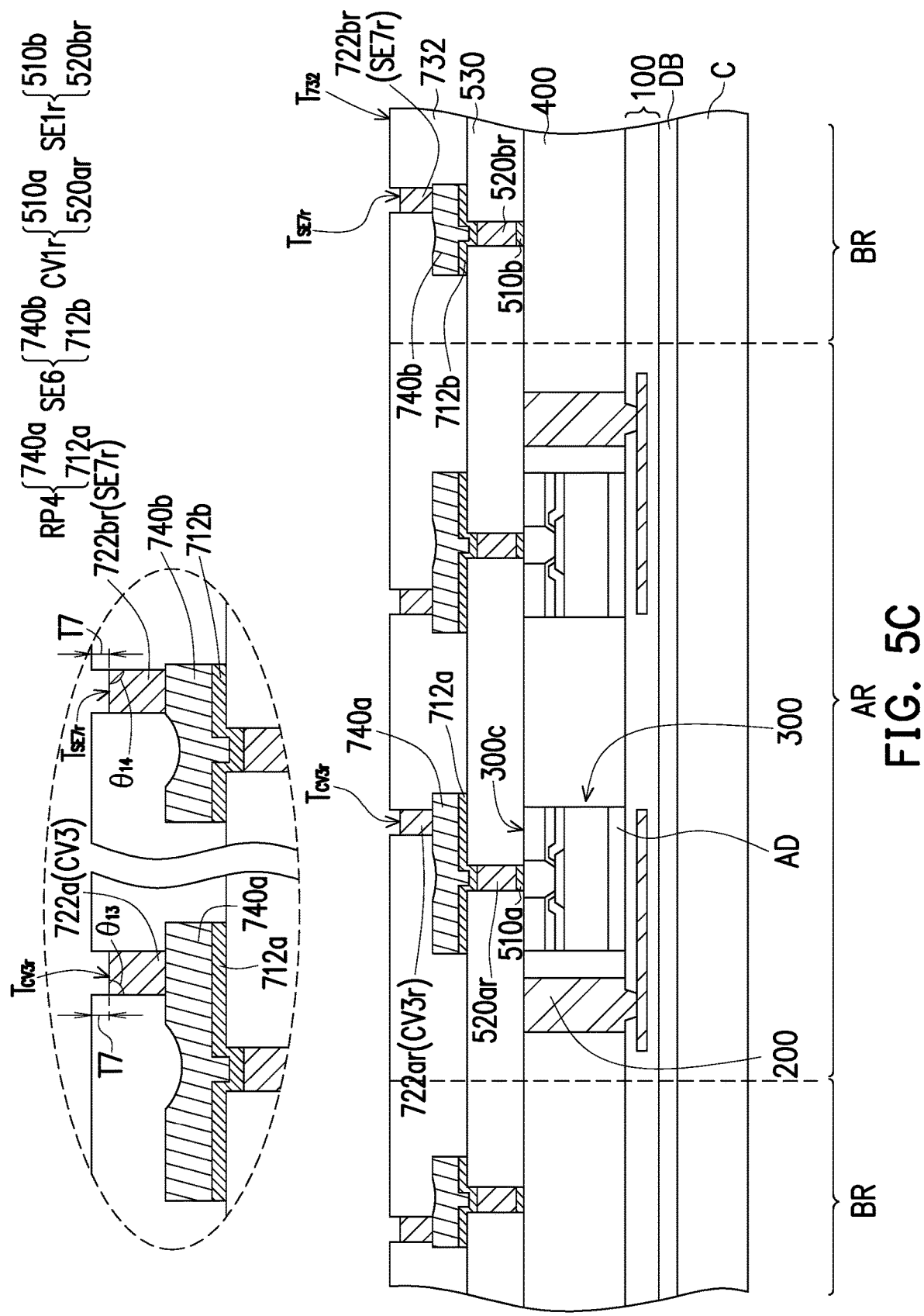

Referring to FIG. 5C, the second conductive vias CV3 and the third seal ring element SE7 are recessed by performing a cleaning process to form the recessed second conductive vias CV3r and the recessed third seal ring element SE7r. As described above, the top surface $T_{732}$ of the second dielectric layer 732 is substantially coplanar with the top surfaces $T_{CV3}$ of the second conductive vias CV3 and the top surface $T_{SE7}$ of the third seal ring element SE7, therefore after the second conductive vias CV3 and the third seal ring element SE7 are recessed by the cleaning process, the recessed second conductive vias CV3r and the recessed third seal ring element SE7r are recessed form the top surface $T_{732}$ of the second dielectric layer 732. In other words, the second conductive vias CV3 and the third seal ring element SE7 are selectively thinned to have the second dielectric layer 732 protruding from the top surfaces $T_{CV3r}$ of the recessed second conductive vias CV3r and the top surface $T_{SE7r}$ of the recessed third seal ring element SE7r. In some embodiments, the second dielectric layer 732 wraps around the first routing patterns RP4, the recessed second conductive vias CV3r, the second seal ring element SE6 and the recessed third seal ring element SE7r. In detail, in some embodiments, the first routing patterns RP4, the recessed second conductive vias CV3r, the second seal ring element SE6 and the recessed third seal ring element SE7r are embedded in the recessed second dielectric layer 532r. In some embodiments, the cleaning process is, for example, a wet acid cleaning process. In some embodiments, in the cleaning process, a solution containing oxalic acid, citric acid, or succinic acid is used.

In some embodiments, the thickness of the second conductive vias CV3 and the third seal ring element SE7 removed by the cleaning process is accounted for approximately 2.5% to 10% thickness of the second conductive vias CV3 and the third seal ring element SE7. In other words, in some embodiments, a protruding thickness T7 of the second dielectric layer 732 protruding from the top surfaces TCV3r of the recessed second conductive vias CV3r and the top surface TSE7r of the recessed third seal ring element SE7r is accounted for approximately 2.5% to 10% thickness of the second conductive vias CV3 and the third seal ring element SE7. For example, the protruding thickness T7 is between 0.1 μm and 0.3 μm.

In some embodiments, since a distance along the direction perpendicular to the active surface 300c of the dies 300 (the protruding thickness T7) is between the top surface $T_{732}$ of the second dielectric layer 732 and the top surface $T_{CV3r}$ of each second conductive via CV3r, the top surface $T_{732}$ of the second dielectric layer 732 is higher than the top surfaces $T_{CV3r}$ of the second conductive vias CV3r. Similarly, in some embodiments, since a distance along the direction perpendicular to the active surface 300c of the dies 300 (the protruding thickness T7) is between the top surface $T_{732}$ of the second dielectric layer 732 and the top surface $T_{SE7r}$ of the third seal ring element SE7r, the top surface $T_{732}$ of the second dielectric layer 732 is higher than the top surface $T_{SE7r}$ of the third seal ring element SE7r.

In some embodiments, the first routing patterns RP4, the recessed second conductive vias CV3r, the second seal ring element SE6, the recessed third seal ring element SE7r, and the second dielectric layer 732 may constitute a second sub-layer of the subsequently formed redistribution structure 700 (shown in FIG. 5E). In some embodiments, the second sub-layer is formed over the first sub-layer.

As mentioned above, the DOP for the second dielectric layer 732 is in a range of approximately 90% to 100%, or the uniformity of the second dielectric layer 732 is in a range of approximately 10% to 25%, thereby good topography of the second sub-layer constituted by the first routing patterns RP4, the recessed second conductive vias CV3r, the second seal ring element SE6, the recessed third seal ring element SE7r, and the second dielectric layer 732 may be provided, thereby the subsequently formed elements may be accurately formed on the designated location and may be formed with the designated dimension, thereby enhancing the reliability of the InFO package 50.

In some embodiments, from the cross-sectional view, the angle $\Theta_{13}$ of each top corner of each recessed second conductive via CV3r is approximately 90 degrees. However, the disclosure is not limited thereto. In some alternative embodiments, from the cross-sectional view, each top corner of each recessed second conductive via CV3r is similar to each top corner of each recessed second conductive via CV1r to has a curved outline due to the cleaning process in the range of approximately 0.9 to 1.1 Π rad (170 degrees to 200 degrees), referring to the schematic cross-sectional view on the left side of FIG. 5A. In some embodiments, from the cross-sectional view, the angle $\Theta_{14}$ of each top corner of the recessed third seal ring element SE7r is approximately 90 degrees. However, the disclosure is not limited thereto. In some alternative embodiments, from the cross-sectional view, each top corner of the recessed third seal ring element SE7r is similar to each top corner of each recessed first seal ring element SE1r to has a curved outline due to the cleaning process in the range of approximately 0.9 to 1.1 Π rad (170 degrees to 200 degrees), referring to the schematic cross-sectional view on the left side of FIG. 5A.

Referring to FIG. 5D, a plurality of second routing patterns RP5 and a fourth seal ring element SE8 are respectively formed on the recessed second conductive vias CV3r and the recessed third seal ring element SE7r. In some embodiments, the second routing patterns RP5 are constituted by a seed layer 714a and a plurality of conductive patterns 542a. In some embodiments, the fourth seal ring element SE8 is constituted by a seed layer 714b and a plurality of conductive patterns 742b. In some embodiments, the second routing patterns RP5 may be formed by similar methods as that of the second routing patterns RP2 in the embodiments of FIG. 1A to FIG. 1Y. In some embodiments, the fourth seal ring element SE8 may be formed by similar methods as that of the fourth seal ring element SE4 in the embodiments of FIG. 1A to FIG. 1Y. Therefore, some of detailed descriptions of the second routing patterns RP5 and the fourth seal ring element SE8 are referred to the foregoing embodiments of FIG. 1A to FIG. 1Y and are omitted herein.

In some embodiments, each of the second routing patterns RP5 has a recess R3 due to the underlying recessed second conductive vias CV3r. As mentioned above, the recessed second conductive vias CV3r are recessed with respect to the second dielectric layer 732, therefore a portion of the seed layer 714a located directly on the top surfaces $T_{CV3r}$ of the recessed second conductive vias CV3r is recessed with respect to the rest of the seed layer 714a located directly on the top surface $T_{732}$ of the second dielectric layer 732. That is, in some embodiments, a portion of the seed layer 714a located directly on the top surfaces $T_{CV3r}$ of the recessed second conductive vias CV3r is lower than the rest of the seed layer 714a located directly on the top surface $T_{732}$ of the second dielectric layer 732. Accordingly, after the conductive patterns 742a disposed on the seed layer 714a are formed, the recesses R3 are created correspond to the locations of the recessed second conductive vias CV3r. That is, in some embodiments, a portion of each conductive pattern 742a may be slightly lower than the rest portion of each conductive pattern 742a. In some embodiments, the recess angle $\Theta_{15}$ of each recess R3 with respect to a virtual line extending along a direction parallel to the active surface 300c of the dies 300 may be in the range of approximately 5 degrees to 15 degrees. Herein, the definition of the recess angle $\Theta_{15}$ of the recess R3 is similar to the recess angle $\Theta_{11}$ of the recess R1, so the definition of the recess angle $\Theta_{15}$ is referred to the foregoing definition of the recess angle $\Theta_{11}$ and is omitted herein omitted herein. In some embodiments, the depth of the recessed portion of each conductive pattern 742a (the recess R3) may be of approximately 0.1 μm up to 0.3 μm with respect to the rest portion of each conductive pattern 742a.

In some embodiments, the fourth seal ring element SE8 has a recess R4 due to the underlying recessed third seal ring element SE7r. As mentioned above, the recessed third seal ring element SE7r are recessed with respect to the second dielectric layer 732, therefore a portion of the seed layer 714b located directly on the top surface $T_{SE7r}$ of the recessed third seal ring element SE7r is recessed with respect to the rest of the seed layer 714b located directly on the top surface $T_{732}$ of the second dielectric layer 732. That is, in some embodiments, a portion of the seed layer 714b located directly on the top surface $T_{SE7r}$ of the recessed third seal ring element SE7r is lower than the rest of the seed layer 714b located directly on the top surface $T_{732}$ of the second dielectric layer 732. Accordingly, after the conductive patterns 742b disposed on the seed layer 714b are formed, the recess R4 is created correspond to the location of the recessed third seal ring element SE7r. That is, in some embodiments, a portion of each conductive pattern 742b may be slightly lower than the rest portion of each conductive pattern 742b. In some embodiments, the recess angle $\Theta_{16}$ of the recess R4 with respect to a virtual line extending along a direction parallel to the active surface 300c of the dies 300 may be in the range of approximately 5 degrees to 15 degrees. Herein, the definition of the recess angle $\Theta_{16}$ of the recess R4 is similar to the recess angle $\Theta_{11}$ of the recess R1, so the definition of the recess angle $\Theta_{16}$ is referred to the foregoing definition of the recess angle $\Theta_{11}$ and is omitted herein omitted herein. In some embodiments, the depth of the recessed portion of each conductive pattern 742b (the recess R4) may be of approximately 0.1 μm up to 0.3 μm with respect to the rest portion of each conductive pattern 742b.

Figure 5E:
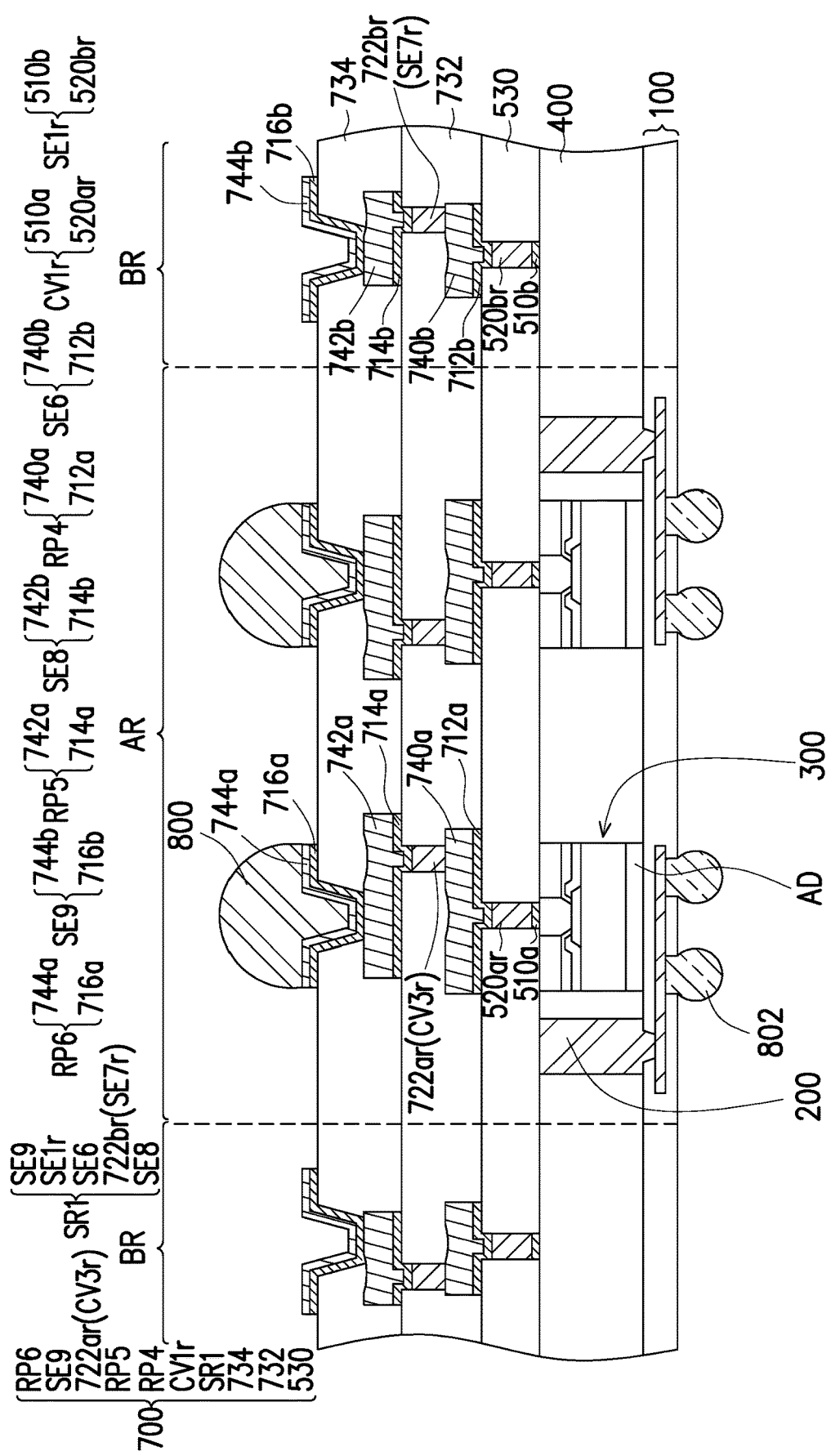

Referring to FIG. 5E, a redistribution structure 700 including the first dielectric layer 530, the second dielectric layer 732, a third dielectric layer 734, the recessed first conductive vias CV1r, the recessed second conductive vias CV3r, the first routing patterns RP4, the second routing patterns RP5, a plurality of third routing patterns RP6, and a seal ring structure SR1 including a fifth seal ring element SE9, the fourth seal ring element SE8, the recessed third seal ring element SE7r, the second seal ring element SE6 and the recessed first seal ring element SE1r is formed. In some embodiments, the third routing patterns RP6 are constituted by a seed layer 716a and a plurality of conductive patterns

744*a*. In some embodiments, the fifth seal ring element SE9 is constituted by a seed layer 716*b* and a plurality of conductive patterns 744*b*. In some embodiments, the third routing patterns RP6 may be formed by similar methods as that of the third routing patterns RP3 in the embodiments of FIG. 1A to FIG. 1Y. In some embodiments, the fifth seal ring element SE9 may be formed by similar methods as that of the fifth seal ring element SE5 in the embodiments of FIG. 1A to FIG. 1Y. In some embodiments, the third dielectric layer 734 may be formed by similar methods as that of the third dielectric layer 534 in the embodiments of FIG. 1A to FIG. 1Y. Therefore, detailed descriptions of the third routing patterns RP6, the fifth seal ring element SE9 and the third dielectric layer 534 are referred to the foregoing embodiments of FIG. 1A to FIG. 1Y and are omitted herein.

The recessed first conductive vias CV1*r* and the recessed first seal ring element SE1*r* are embedded in the first dielectric layer 530. The first routing patterns RP4, the second seal ring element SE6, the recessed second conductive vias CV3*r* and the recessed third seal ring element SE7*r* are embedded in the second dielectric layer 732. The second routing patterns RP5 and the fourth seal ring element SE8 are embedded in the third dielectric layer 734 while the third routing patterns RP6 and the fifth seal ring element SE9 are partially embedded in the third dielectric layer 734. The recessed first conductive vias CV1*r* are in physical contact with the vias 350 of the dies 300 and the first routing patterns RP4. That is, the recessed first conductive vias CV1*r* electrically connect the dies 300 and the first routing patterns RP4. The recessed second conductive vias CV3*r* are in physical contact with the first routing patterns RP4 and the second routing patterns RP5. That is, the recessed second conductive vias CV3*r* electrically interconnect the first routing patterns RP4 and the second routing patterns RP5. The second routing patterns RP5 are in physical contact with the recessed second conductive vias CV3*r* and the third routing patterns RP6. That is, the second routing patterns RP5 are electrically connected to the recessed second conductive vias CV3*r* and the third routing patterns RP6. In some embodiments, the second routing patterns RP5, the third routing patterns RP6, the fourth seal ring element SE8, the fifth seal ring element SE9, and the third dielectric layer 734 may be considered as a third sub-layer of the redistribution structure 700. In some embodiments, the third routing patterns RP6 may include a plurality of pads. In some embodiments, the above-mentioned pads include a plurality of under-ball metallurgy (UBM) patterns for ball mount.

In some embodiments, the redistribution structure 700 is referred to as a front-side redistribution structure. It should be noted that although the redistribution structure 700 is illustrated to have three sub-layers in FIG. 5E, the disclosure is not limited thereto. In some alternative embodiments, the redistribution structure 700 may be constituted by more or less layers of sub-layers depending on the circuit design.

Referring to FIG. 5E again, a plurality of conductive terminals 800 are placed on the third routing patterns RP6 (the UBM patterns) of the redistribution structure 700, and a plurality of conductive terminals 802 is formed over the redistribution structure 100. In some embodiments, the conductive terminals 800 may be formed by similar methods as that of the conductive terminals 600 in the embodiments of FIG. 1A to FIG. 1Y. In some embodiments, the conductive terminals 802 may be formed by similar methods as that of the conductive terminals 602 in the embodiments of FIG. 1A to FIG. 1Y. Therefore, detailed descriptions of the conductive terminals 800 and the conductive terminals 802 are referred to the foregoing embodiments of FIG. 1A to FIG. 1Y and are omitted herein.

Figure 5F:
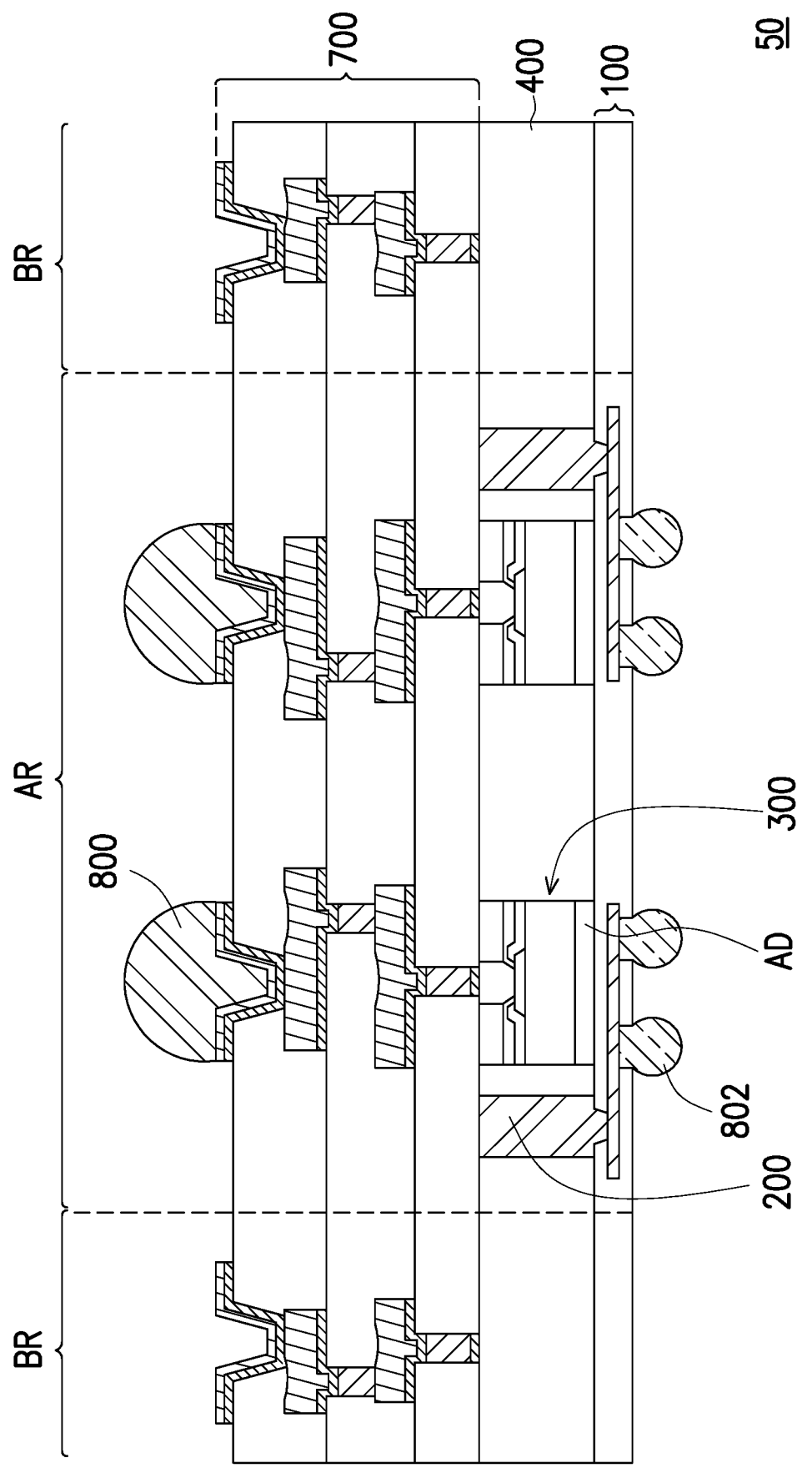

Referring to FIG. 5E and FIG. 5F, the structure illustrated in FIG. 5E is diced or singulated to form a plurality of InFO packages 50. In some embodiments, the dicing process or the singulation process typically involves dicing with a rotating blade or a laser beam. In other words, the dicing or singulation process is, for example, a laser cutting process, a mechanical cutting process, or other suitable processes.

In accordance with some embodiments of the disclosure, a package includes a die and a redistribution structure. The die has an active surface and is wrapped around by an encapsulant. The redistribution structure is disposed on the active surface of the die and located above the encapsulant. The redistribution structure includes a conductive via connected with the die, a routing pattern located above and connected with the conductive via, and a seal ring structure including a first seal ring element and a second seal ring element located above and connected with the first seal ring element. The second seal ring element includes a seed layer sandwiched between the first seal ring element and the second seal ring element. A top surface of the first seal ring element is substantially coplanar with a top surface of the conductive via.

In accordance with some embodiments of the disclosure, a package includes a die, an encapsulant, and a seal ring structure. The encapsulant encloses the die. The seal ring structure is disposed on the encapsulant. The seal ring structure includes a first seal ring element, a second seal ring element, and a seed layer sandwiched between the first and second seal ring elements, wherein the first and second seal ring elements are respectively wrapped around by a first dielectric layer and a second dielectric layer, and a thickness of the first seal ring element is different from a thickness of the first dielectric layer.

In accordance with some embodiments of the disclosure, a manufacturing method of a package includes at least the following steps. A carrier is provided. A die is provided over the carrier. The die is encapsulated by an encapsulant. A first conductive via is formed on the die and a first seal ring element is formed over the encapsulant, wherein the first conductive via is electrically connected with the die. A first dielectric material layer over the encapsulant and the die to encapsulate the first conductive via and the first seal ring element is formed. A planarization process is performed to partially remove the first dielectric material layer to form a first dielectric layer exposing a top surface of the first conductive via and a top surface of the first seal ring element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package, comprising:
   a die, having an active surface and wrapped around by an encapsulant; and a redistribution structure disposed on the active surface of the die and located above the encapsulant, wherein the redistribution structure comprises a conductive via connected with the die, a routing layer located above and connected with the conductive via, and a seal ring structure, the seal ring structure includes a first seal ring element and a second seal ring element located above and connected with the first seal ring element, wherein the second seal ring element includes a seed layer sandwiched between the first seal ring element and the second seal ring element, and a top surface of the first seal ring element is substantially coplanar with a top surface of the conductive via.

2. The package according to claim 1, wherein the redistribution structure further comprises a dielectric layer wrapping around the conductive via and the first seal ring element, a top surface of the dielectric layer is substantially coplanar with the top surfaces of the conductive via and the first seal ring element, and the dielectric layer has a thickness substantially equivalent to those of the conductive via and the first seal ring element.

3. The package according to claim 1, wherein the redistribution structure further comprises a dielectric layer wrapping around the conductive via and the first seal ring element, a top surface of the dielectric layer is lower than the top surfaces of the conductive via and the first seal ring element.

4. The package according to claim 3, wherein a portion of the seed layer located directly on the top surface of the first seal ring element is higher than the rest of the seed layer located directly on the dielectric layer.

5. The package according to claim 1, wherein the redistribution structure further comprises a dielectric layer wrapping around the conductive via and the first seal ring element, a top surface of the dielectric layer is higher than the top surfaces of the conductive via and the first seal ring element.

6. The package according to claim 5, wherein a portion of the seed layer located directly on the top surface of the first seal ring element is lower than the rest of the seed layer located directly on the dielectric layer.

* * * * *